(12) United States Patent
Elhanan et al.

(10) Patent No.: US 7,599,757 B2
(45) Date of Patent: Oct. 6, 2009

(54) SYSTEM AND METHODS FOR AUTOMATIC GENERATION OF COMPONENT DATA

(75) Inventors: Bini Elhanan, Nes Ziona (IL); Tovi Yadin, Maskeret Batya (IL); Michael Parker, Peterborough (GB); Henry Jurgens, Aurora (CA); Nadav Pilnick, D.n. Gan Raveh (IL); Mikko Puranen, Turku (FI); Tero Laakso, Turku (FI)

(73) Assignee: Valor Computerized Systems Ltd., Yavne (IL)

( * ) Notice: Subject to any disclaimer, the term of this patent is extended or adjusted under 35 U.S.C. 154(b) by 0 days.

(21) Appl. No.: 11/425,830

(22) Filed: Jun. 22, 2006

(65) Prior Publication Data
US 2007/0250201 A1  Oct. 25, 2007

Related U.S. Application Data

(63) Continuation of application No. 10/596,693, filed as application No. PCT/IL2006/000479 on Apr. 20, 2006.

(51) Int. Cl.
  G06F 19/00  (2006.01)
  B23P 19/00  (2006.01)
(52) U.S. Cl. .............................. 700/121; 29/739; 29/740
(58) Field of Classification Search .................. 700/95, 700/116, 121; 716/8–10, 12, 15, 16; 29/740, 29/700, 739, 825
See application file for complete search history.

(56) References Cited

U.S. PATENT DOCUMENTS

| | | | |
|---|---|---|---|
| 5,781,447 A | 7/1998 | Gerdes | |
| 6,009,352 A * | 12/1999 | Suzuki et al. | 700/108 |
| 6,044,169 A | 3/2000 | Hirotani et al. | |
| 6,260,178 B1 * | 7/2001 | Schaffer | 716/2 |
| 6,334,115 B1 | 12/2001 | Kuribayashi et al. | |
| 6,480,751 B1 | 11/2002 | Kuribayashi et al. | |
| 6,487,544 B1 * | 11/2002 | Eshelman et al. | 706/13 |
| 6,684,376 B1 * | 1/2004 | Kerzman et al. | 716/9 |
| 6,687,557 B2 | 2/2004 | Ouchi | |
| 6,778,878 B1 * | 8/2004 | Kou | 700/95 |
| 6,816,751 B1 * | 11/2004 | Alice et al. | 700/222 |

(Continued)

OTHER PUBLICATIONS

"Trilogy 5000 Overview", Software Version 7.0, Sep. 2003.

(Continued)

Primary Examiner—Charles R Kasenge
(74) Attorney, Agent, or Firm—Darby & Darby, PC

(57) ABSTRACT

A method of manufacturing an electronic circuit including employing a pick & place machine-specific component placement sequence, pick & place machine-specific component data for governing the operation of at least one specific pick & place machine in a manufacturing line and operating instructions in computer-readable language for the at least one specific pick & place machine to auto-generate generic component parameters for components used in manufacturing the electronic circuit on the at least one specific pick & place machine and employing the generic component parameters to auto-generate a pick & place machine-specific component placement sequence and pick & place machine-specific component data for governing the operation of at least one other specific pick & place machine in a manufacturing line and operating instructions in computer-readable language for the at least one other specific pick & place machine.

28 Claims, 51 Drawing Sheets

U.S. PATENT DOCUMENTS

| | | |
|---|---|---|
| 7,103,434 B2 | 9/2006 | Chernyak et al. |
| 7,142,939 B2 * | 11/2006 | Nonaka et al. ............... 700/121 |
| 7,146,594 B1 * | 12/2006 | Goike et al. ................... 716/11 |
| 7,440,813 B2 * | 10/2008 | Elhanan et al. ............. 700/121 |
| 7,447,560 B2 * | 11/2008 | Elhanan et al. ............. 700/121 |
| 2004/0089413 A1 | 5/2004 | Murphy et al. |
| 2004/0249492 A1 * | 12/2004 | Welch ......................... 700/97 |

OTHER PUBLICATIONS

Bini Elhanan "Programming for Mixed-Vendor Lines", Circuits Assembly, Dec. 2004.

* cited by examiner

FIG. 5A

| PICK & PLACE MACHINE SPECIFIC COMPONENT REEL PARAMETER | RULES FOR GENERATING PICK & PLACE MACHINE SPECIFIC COMPONENT REEL PARAMETER |
|---|---|
| MACHINE FEED | =(REEL PITCH/MACHINE FEED DISTANCE) |
| MACHINE SUB-FEED | {IF ( REEL PITCH − ((REEL PITCH/MACHINE FEED DISTANCE)*MACHINE FEED DISTANCE)) > 0} THEN =(REEL PITCH − ((REEL PITCH/MACHINE FEED DISTANCE)*MACHINE FEED DISTANCE)/MACHINE SUB-FEED DISTANCE) ELSE NOT RELEVANT |
| ... | ... |
| NUMBER OF SLOTS | IF {(TAPE WIDTH − ((TAPE WIDTH/SLOT WIDTH)*SLOT WIDTH) == 0} THEN =(TAPE WIDTH/SLOT WIDTH) ELSE =((TAPE WIDTH/SLOT WIDTH)+1) |

FIG. 5B

| PICK & PLACE MACHINE SPECIFIC COMPONENT SHAPE PARAMETER \ COMPONENT MANUFACTURER-INDEPENDENT COMPONENT CHARACTERISTIC (COMPONENT TYPE) | BGA | QFP | CONNECTORS |
|---|---|---|---|
| ... | ⌐242 | | |
| PICKUP DEPTH | =COMPONENT HEIGHT | =COMPONENT HEIGHT | =COMPONENT HEIGHT |
| ... | ... | ... | ... |
| NAMED NOZZLE | NOT RELEVANT | NOT RELEVANT | IF {(MAX(X DIMENSION, Y DIMENSION)/MIN(X DIMENSION, Y DIMENSION))>=2 && MIN(X DIMENSION, Y DIMENSION)>=8} THEN ="LARGEST NOZZLE" ELSEIF {(MAX(X DIMENSION, Y DIMENSION)/MIN(X DIMENSION, Y DIMENSION))<2} THEN NOT RELEVANT ELSE THEN ="MEDIUM NOZZLE" ⌐244 |
| MINIMUM NOZZLE | =MIN(X DIMENSION, Y DIMENSION)*0.7 | =MIN(X DIMENSION, Y DIMENSION)*0.7 | IF {(MAX(X DIMENSION, Y DIMENSION)/MIN(X DIMENSION, Y DIMENSION))<2} THEN =MIN(X DIMENSION, Y DIMENSION)*0.7 ELSE NOT RELEVANT |
| MAXIMUM NOZZLE | =MAX(X DIMENSION, Y DIMENSION)*0.95 | =MAX(X DIMENSION, Y DIMENSION)*0.95 ⌐246 | IF {(MAX(X DIMENSION, Y DIMENSION)/MIN(X DIMENSION, Y DIMENSION))<2} THEN =MIN(X DIMENSION, Y DIMENSION)*0.95 ELSE NOT RELEVANT |

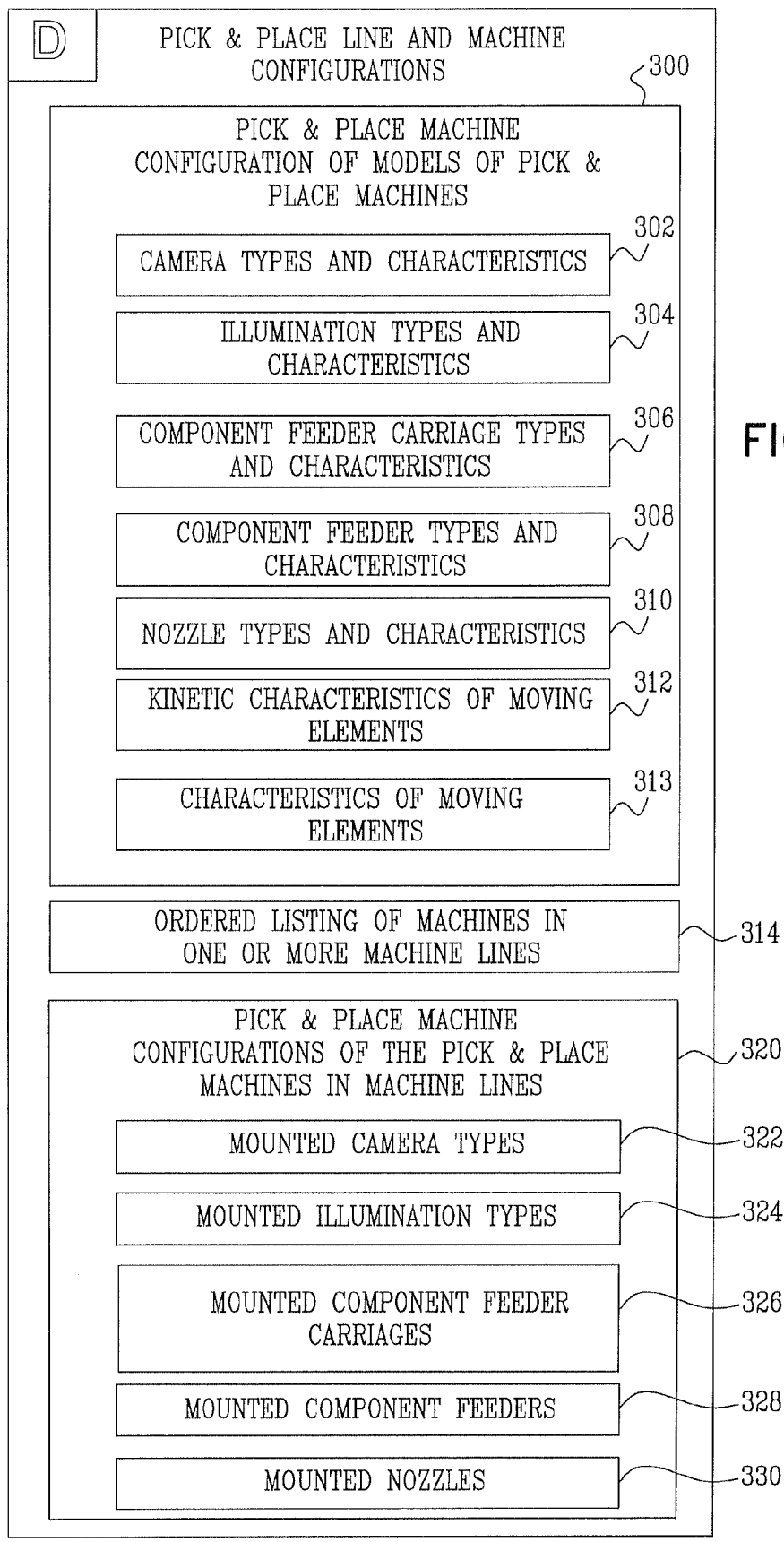

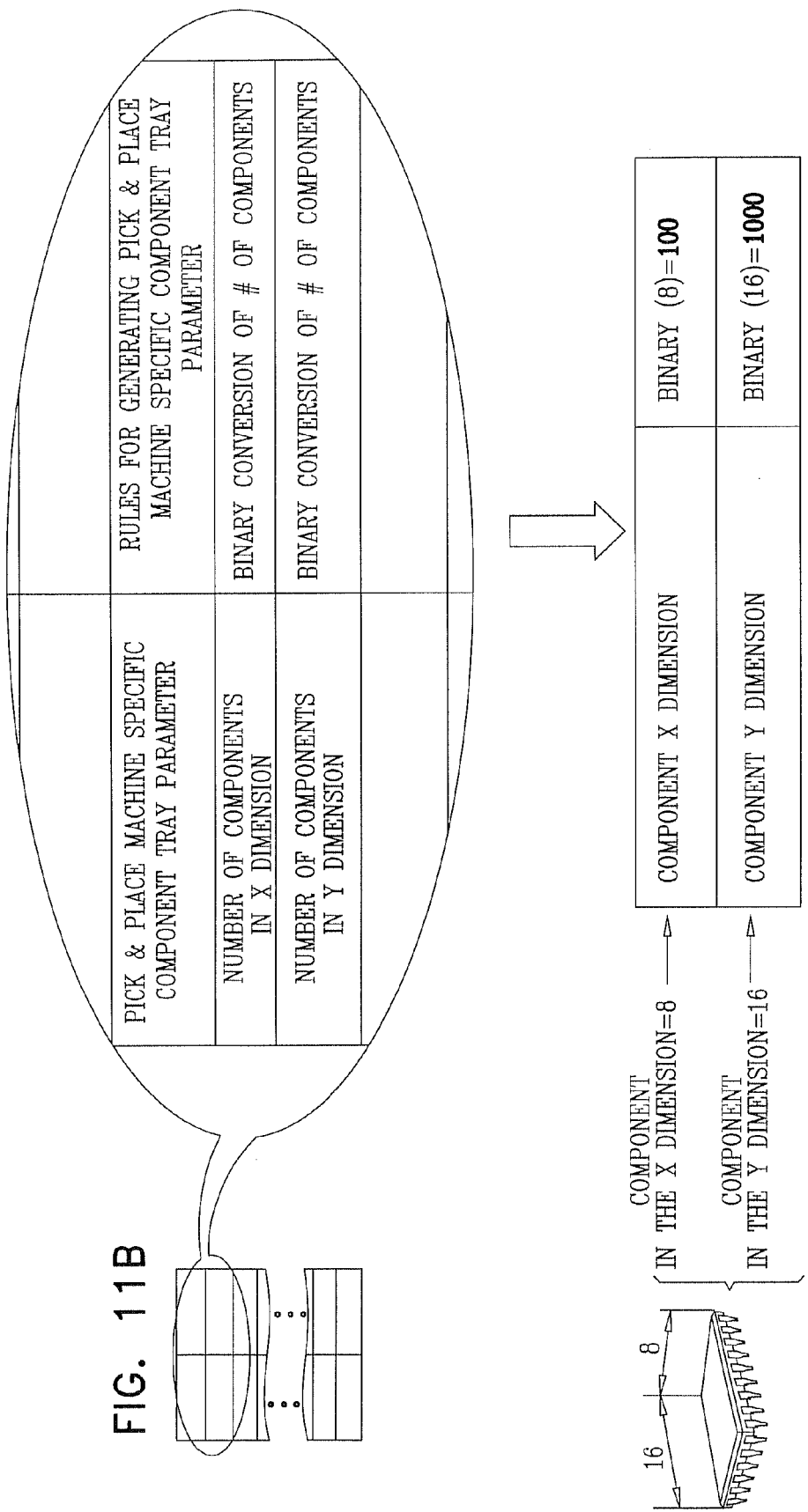

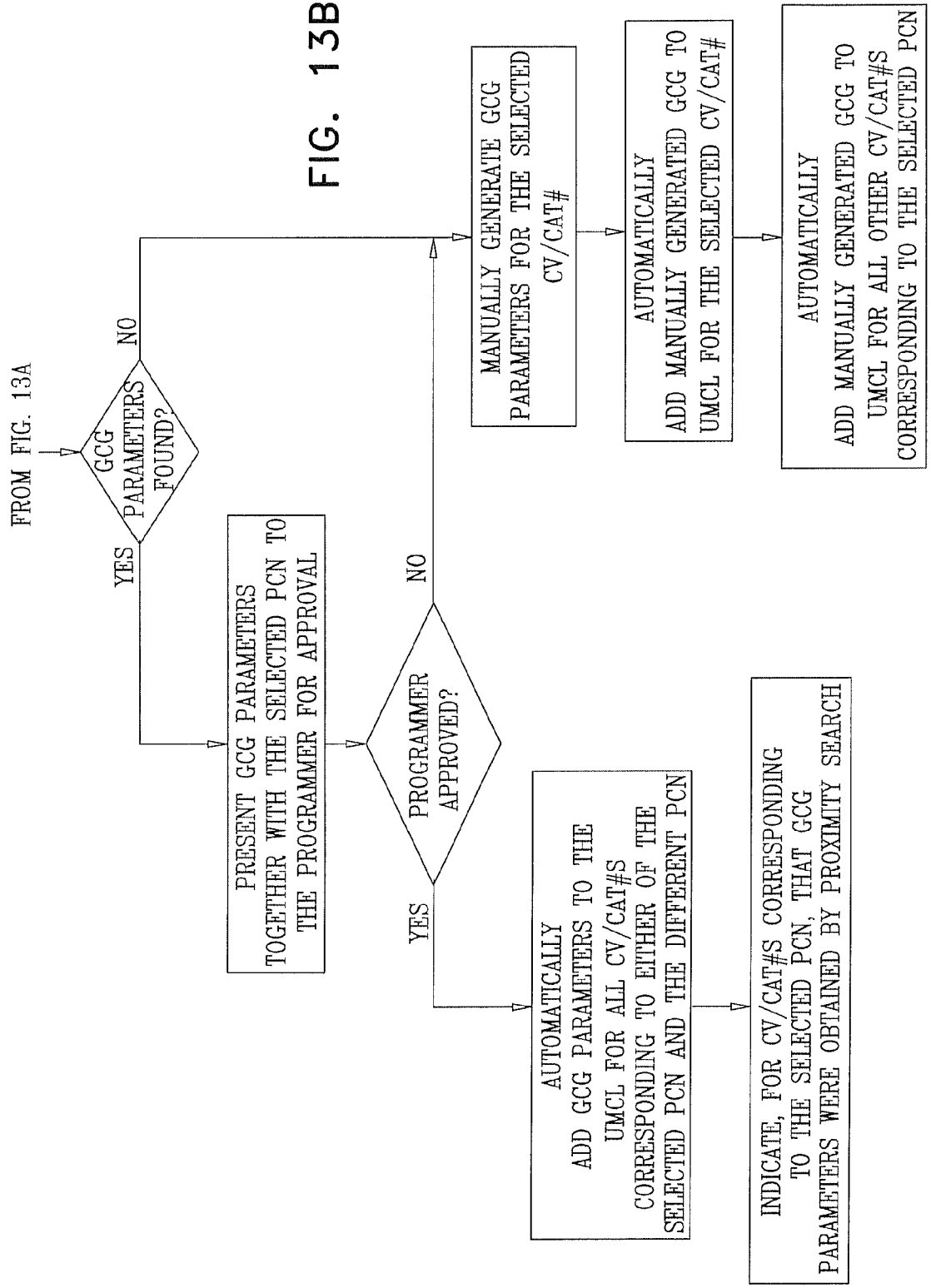

FIG. 26A

| PICK & PLACE MACHINE SPECIFIC COMPONENT TRAY PARAMETER | RULES FOR GENERATING ADAPTIVE PICK & PLACE MACHINE SPECIFIC COMPONENT TRAY PARAMETER | |
|---|---|---|
| FEEDER NAME | TRAY LIFTER: IF { FRONT TRAY LIFTER} THEN =NAME A ELSE THEN =NAME B | ~772 |
| ○ ○ ○ | ○ ○ ○ | |

FIG. 26B

| COMPONENT MANUFACTURER-INDEPENDENT COMPONENT CHARACTERISTIC (COMPONENT TYPE) <br><br> ADAPTIVE PICK & PLACE MACHINE SPECIFIC COMPONENT SHAPE PARAMETER | BGA <br> 782 | QFP <br> 784 | CONNECTOR <br> 786 | |
|---|---|---|---|---|
| VISION ALGORITHM | FOR BACKLIGHTING: IF {#LEADS > 100} THEN NOT RELEVANT ELSE =105 FOR FRONTLIGHTING: =103 | FOR BACKLIGHTING: NOT RELEVANT FOR FRONTLIGHTING: =107 | IF {LEAD-PITCH < 0.01} THEN USE FRONTLIGHTING =120 ELSE USE FRONTLIGHTING =130 OR BACKLIGHTING =150 | |
| ... | ... | ... | ... | |

SYSTEM AND METHODS FOR AUTOMATIC GENERATION OF COMPONENT DATA

CROSS-REFERENCE TO PRIOR APPLICATION

This is a continuation of U.S. patent application Ser. No. 10/596,693, filed on Jun. 21, 2006, which is the U.S. National Phase of International Patent Application PCT/IL2006/000479, filed on Apr. 20, 2006.

FIELD OF THE INVENTION

The present invention relates to automated manufacture of electronic circuits.

BACKGROUND OF THE INVENTION

The following patent documents are believed to represent the current state of the art:

U.S. Pat. Nos. 6,687,557 and 5,781,447; and

U.S. Patent Application Publication Number: 2004/0089413

SUMMARY OF THE INVENTION

The present invention seeks to provide improved methods and systems for automated manufacture of electronic circuits.

For the sake of clarity and conciseness, the following glossary of defined terms is employed throughout:

ACVL—Approved Component Vendor List
AMSSHP—Adaptive Machine Specific Shape Parameters
AMSSUP—Adaptive Machine Specific Supply Parameters
BOM—Bill of Materials
Cat#—Catalog Number
CCL—Compiled Component Library
CCSL—Compiled Component Supply Library
CPCA DATA—Combined Printed Circuit Assembly Data using PCN designations
CPL—Component Placement List
CSF—Component Supply Form
CV—Component Vendor
DCN—Designer Component Number
DCSF Parameters—Default Component Supply Form Parameters
GCG—Generic Component Geometric
MCVL—Master Component Vendor Library
MSSHP—Machine Specific Shape Parameters
MSSHPL—Machine Specific Shape Parameter Library
MSSUP—Machine Specific Supply Parameters
MSSUPL—Machine Specific Supply Parameter Library
MV—Machine Vendor
PCA—Printed Circuit Assembly
PCN—Programmer Component Number
UMCL—User Maintained Component Library
UMCSL—User Maintained Component Supply Library There is thus provided in accordance with a preferred embodiment of the present invention a method of manufacturing electronic circuits including generating CAD data, a bill of materials and an approved component vendor list for an electronic circuit and employing the CAD data, the bill of materials and the approved component vendor list for automatically generating a pick & place machine-specific component loading specification, a pick & place machine-specific component placement sequence and pick & place machine-specific component data for governing the operation of at least one specific pick & place machine in a manufacturing line.

In accordance with a preferred embodiment of the present invention the employing the CAD data, the bill of materials and the approved component vendor list for automatically generating pick & place machine specific component data for governing the operation of at least one specific pick & place machine includes automatically generating the pick & place machine-specific component data by employing a first database containing at least one of pick & place machine-independent, geometric component data and pick & place machine-independent, component supply data and a second database containing machine-specific, component manufacturer-independent rules for generating the pick & place machine-specific component data.

In accordance with another preferred embodiment of the present invention the pick & place machine specific component data for governing the operation of at least one specific pick & place machine comprises at least one of pick & place machine-specific component shape parameters and pick & place machine-specific component supply parameters. Preferably, the automatically generating pick & place machine-specific component data includes automatically generating a third database containing at least a mapping between component identifiers and pick & place machine-specific component shape parameters and a mapping between the component identifiers and pick & place machine-specific component supply parameters.

In accordance with yet another preferred embodiment of the present invention the mapping between component identifiers and pick & place machine-specific component shape parameters includes a mapping of PCNs to component shape identifiers and a mapping of component shape identifiers to pick & place machine-specific component shape parameters. Preferably, component shape identifiers are pick & place machine-specific component shape identifiers. Additionally or alternatively, the mapping between the component identifiers and pick & place machine-specific component supply parameters includes a mapping of PCNs to component supply identifiers and a mapping of component supply identifiers to pick & place machine-specific component supply parameters. Preferably, the component supply identifiers are pick & place machine-specific component supply identifiers.

In accordance with still another preferred embodiment of the present invention the pick & place machine-specific component shape parameters include at least one of component geometry parameters, component handling parameters, component imaging parameters, component recognition tolerances and pick & place machine-specific procedures. Preferably, the pick & place machine-specific component shape parameters include at least one of component geometry parameters in pick & place machine-specific syntax, pick & place machine-specific component handling parameters, pick & place machine-specific component imaging parameters, pick & place machine-specific component recognition tolerances and pick & place machine-specific procedures.

In accordance with a further preferred embodiment of the present invention the pick & place machine-specific component supply parameters include at least one of a component carrier type and pick & place machine-specific, component carrier-specific parameters. Preferably, at least part of the pick & place machine-specific component data includes adaptive pick & place machine-specific component data. More preferably, the adaptive pick & place machine specific component data includes adaptive pick & place machine specific component shape data. Additionally or alternatively the adaptive pick & place machine specific component data includes adaptive pick & place machine specific component supply data.

In accordance with another further preferred embodiment of the present invention the first database includes at least one of a mapping of CV/Cat#s to component vendor-specific component geometric parameters (CCL), a mapping of CV/Cat#s to component supply form parameters (CCSL), a mapping of PCNs to component supply form parameters (UMCSL), a mapping of PCNs to CV/Cat#s (MCVL), a mapping of DCN to PCN, a user maintained mapping of CV/Cat# to component vendor-specific component geometric parameters (UMCL) and a mapping of PCN to generic component geometric parameters.

In accordance with still a further preferred embodiment of the present invention the second database includes at least one of a mapping of component manufacturer-independent component characteristics to rules for generating pick & place machine-specific component shape parameters and a mapping of component manufacturer-independent component supply form characteristics to rules for generating pick & place machine-specific component supply parameters. Preferably, the rules for generating pick & place machine-specific component shape parameters include rules for generating at least one of component geometric parameters in pick & place machine specific syntax, pick & place machine specific component handling parameters, pick & place machine specific component imaging parameters, pick & place machine specific component recognition tolerances and pick & place machine specific procedures. Additionally or alternatively, the rules for generating pick & place machine-specific component supply parameters include rules for generating at least one of a component carrier type in pick & place machine-specific syntax and component carrier type-specific parameters in pick & place machine-specific syntax.

In accordance with an additional preferred embodiment of the present invention the second database includes at least one of a mapping of component manufacturer-independent component characteristics to rules for generating adaptive pick & place machine-specific component shape parameters and a mapping of component manufacturer-independent component supply form characteristics to rules for generating adaptive pick & place machine-specific component supply parameters. Preferably, the rules for generating adaptive pick & place machine-specific component shape parameters include rules for generating at least one of component geometric parameters in pick & place machine specific syntax, adaptive pick & place machine specific component handling parameters, adaptive pick & place machine specific component imaging parameters, adaptive pick & place machine specific component recognition tolerances and pick & place machine specific procedures. Additionally or alternatively, the rules for generating adaptive pick & place machine-specific component supply parameters include rules for generating at least one of adaptive component carrier type in pick & place machine-specific syntax and adaptive component carrier type-specific parameters in pick & place machine-specific syntax. Preferably the second database is operator modifiable.

In accordance with yet an additional preferred embodiment of the present invention the employing the CAD data, the bill of materials and the approved component vendor list for automatically generating pick & place machine specific component data for governing the operation of at least one specific pick & place machine includes automatically generating the pick & place machine-specific component data by employing a fourth database containing pick & place line and machine configurations.

In accordance with another preferred embodiment of the present invention the fourth database includes at least one of pick & place machine configurations, ordered listings of pick & place machines in at least one machine line, pick & place machine configurations of the pick & place machines in the at least one machine line. Preferably, the pick & place machine configurations include at least one of camera types and characteristics, illumination types and characteristics, component feeder carriage types and characteristics, component feeder types and characteristics, nozzle types and characteristics and kinetic characteristics of moving elements. Additionally or alternatively, the pick & place machine configurations of the pick & place machines in the at least one machine line include at least one of mounted camera types, mounted illumination types, mounted component feeder carriages, mounted component feeders and mounted nozzles.

In accordance with yet another preferred embodiment of the present invention the employing the CAD data, the bill of materials and the approved component vendor list for automatically generating pick & place machine-specific component loading specification, pick & place machine-specific component placement sequence and pick & place machine-specific component data for governing the operation of at least one specific pick & place machine in a manufacturing line includes employing the CAD data, the bill of materials, the approved component vendor list and the first database to search for component data for new components and employing the first database and the second database to auto-generate the pick & place machine specific component data.

In accordance with still another preferred embodiment of the present invention the employing the CAD data, the bill of materials and the approved component vendor list for automatically generating pick & place machine-specific component loading specification, pick & place machine-specific component placement sequence and pick & place machine-specific component data for governing the operation of at least one specific pick & place machine in a manufacturing line also includes prior to the employing the CAD data the bill of materials, the approved component vendor list and the first database to search for component data for new components, employing the CAD data, the bill of materials and the approved component vendor list to form combined printed circuit assembly data, following the employing the first database and the second database, selecting a pick & place machine line, thereafter, employing the combined printed circuit assembly data together with the pick & place machine specific component data to balance the pick & place machine line and thereafter, employing a computer to provide the pick & place machine-specific component loading specification, the pick & place machine-specific component placement sequence and the pick & place machine-specific component data for governing the operation of at least one specific pick & place machine in a manufacturing line to at least one pick & place machine in the pick & place machine line. Preferably, the combined printed circuit assembly data employs PCN designations.

In accordance with an additional preferred embodiment of the present invention the employing the CAD data, the bill of materials, the approved component vendor list and the first database to search for component data for new components includes employing the combined printed circuit assembly data and the first database to search for the component data for new components. Preferably, the employing the combined printed circuit assembly data and the first database to search for component data for new components includes searching the first database for pick & place machine independent component supply data for the new components and searching the first database for pick & place machine independent geometric component data for the new components.

In accordance with another additional preferred embodiment of the present invention the searching the first database for pick & place machine independent component supply data for the new components includes selecting at least one PCN corresponding to ones of the new components for which CSF parameters are not available, obtaining a CV/CAT# corresponding to the at least one PCN corresponding to ones of the new components for which CSF parameters are not available and employing the CV/CAT# to search at least part of the first database for corresponding CSF parameters. Preferably, the method also includes employing the CV/CAT# to search at least part of the first database for corresponding default CSF parameters. Additionally or alternatively, the method also includes employing the at least one PCN to search at least part of the first database for at least one corresponding set of default CSF parameters.

In accordance with a further preferred embodiment of the present invention the method also includes presenting the at least one corresponding set of default CSF parameters and the at least one PCN to an operator for selection of an appropriate set of CSF parameters. Preferably, the method also includes, following the presenting, automatically adding the appropriate set of CSF parameters as CSF parameters to the first database for the at least one PCN and automatically adding the appropriate set of CSF parameters as default CSF parameters to the first database for CV/CAT#s corresponding to the at least one PCN. Alternatively, the method also includes providing manually generated CSF parameters for the at least one PCN, automatically adding the manually generated CSF parameters to the first database for the at least one PCN and automatically adding the manually generated CSF parameters as default CSF parameters to the first database for CV/CAT#s corresponding to the at least one PCN.

In accordance with yet a further preferred embodiment of the present invention the selecting at least one PCN corresponding to ones of the new components for which CSF parameters are not available includes selecting at least one PCN in the combined printed circuit assembly data which does not have CSF parameters. Alternatively, the selecting at least one PCN corresponding to ones of the new components for which CSF parameters are not available includes selecting at least one PCN in the combined printed circuit assembly data for which there are no pick & place machine specific component supply parameters.

In accordance with still a further preferred embodiment of the present invention the searching the first database for pick & place machine independent component supply data for the new components includes selecting at least one PCN corresponding to ones of the new components for which GCG parameters are not available, obtaining a CV/CAT# corresponding to the at least one PCN corresponding to ones of the new components for which GCG parameters are not available and employing the CV/CAT# to search at least part of the first database for corresponding GCG parameters. Preferably, the employing the CV/CAT# also includes automatically adding the corresponding GCG parameters to the first database for the CV/CAT# and automatically adding the corresponding GCG parameters to the first database for other CV/CAT#s corresponding to the at least one PCN corresponding to ones of the new components for which GCG parameters are not available.

In accordance with another further preferred embodiment of the present invention the method also includes, following the employing the CV/CAT#, conducting a proximity search including searching the first database for at least one additional PCN having at least one corresponding CV/CAT#, which is different from the CV/CAT#, in common with the at least one PCN corresponding to ones of the new components for which GCG parameters are not available, searching the first database for at least one different CV/CAT# corresponding to the at least one additional PCN, which does not correspond to the at least one PCN corresponding to ones of the new components for which GCG parameters are not available and employing the at least one different CV/CAT# to search at least part of the first database for GCG parameters corresponding to the at least one different CV/CAT#.

In accordance with another preferred embodiment of the present invention the method also includes presenting the GCG parameters corresponding to the at least one different CV/CAT# and the at least one PCN corresponding to ones of the new components for which GCG parameters are not available to an operator for approval. Preferably, the method also includes automatically adding the GCG parameters corresponding to the at least one different CV/CAT# to the first database as GCG parameters corresponding to CV/CAT#s corresponding to at least one of the at least one PCN corresponding to ones of the new components for which GCG parameters are not available and the at least one additional PCN and automatically indicating, for all CV/CAT#s corresponding to the at least one PCN corresponding to ones of the new components for which GCG parameters are not available, the GCG parameters as being obtained by the proximity search. Alternatively, the method also includes providing manually generated GCG parameters for the CV/CAT#, automatically adding the manually generated GCG parameters to the first database for the CV/CAT# and automatically adding the manually generated GCG parameters to the first database for CV/CAT#s corresponding to the at least one PCN corresponding to ones of the new components for which GCG parameters are not available.

In accordance with yet another preferred embodiment of the present invention the selecting at least one PCN corresponding to ones of the new components for which GCG parameters are not available includes selecting at least one PCN in the combined printed circuit assembly data which does not have GCG parameters. Alternatively, the selecting at least one PCN corresponding to ones of the new components for which GCG parameters are not available includes selecting at least one PCN in the combined printed circuit assembly data for which there are no pick & place machine specific component shape parameters.

In accordance with still another preferred embodiment of the present invention the employing the first database and the second database to auto-generate the pick & place machine specific component data includes employing the pick & place machine independent component supply data and the machine-specific, component manufacturer-independent rules for generating the pick & place machine-specific component data to auto-generate pick & place machine specific component supply parameters and employing the pick & place machine independent geometric component data and the machine-specific, component manufacturer-independent rules for generating the pick & place machine-specific component data to auto-generate pick & place machine specific component shape parameters.

In accordance with a further preferred embodiment of the present invention the employing the pick & place machine independent component supply data includes for a specific pick & place machine in the pick & place machine line, selecting at least one PCN in the combined printed circuit assembly data for which at least one of corresponding pick & place machine specific component supply parameters and a corresponding pick & place machine specific component supply identifier is not available, employing at least one generic component supply identifier to obtain CSF parameters corresponding to the at least one PCN in the combined printed circuit assembly data for which at least one of corresponding pick & place machine specific component supply parameters and a corresponding pick & place machine specific component supply identifier is not available, employing at least part of the CSF parameters to access appropriate ones of the machine-specific, component manufacturer-independent rules for generating the pick & place machine-specific component data, operating the appropriate ones of the machine-specific, component manufacturer-independent rules for generating the pick & place machine-specific component data based on at least one of the CSF parameters to yield corresponding values and assigning the corresponding values to corresponding ones of the pick & place machine-specific component supply parameters. Preferably, the method also includes, prior to the employing at least part of the CSF parameters to access appropriate ones of the machine-specific, component manufacturer-independent rules, employing at least part of the CSF parameters to auto-generate the corresponding pick & place machine specific component supply identifier.

In accordance with yet a further preferred embodiment of the present invention the employing the pick & place machine independent geometric component data includes for a specific pick & place machine in the pick & place machine line, selecting at least one PCN in the combined printed circuit assembly data for which at least one of corresponding pick & place machine specific component shape parameters and a corresponding pick & place machine specific component shape identifier is not available, employing at least one generic component shape identifier to obtain GCG parameters corresponding to the at least one PCN in the combined printed circuit assembly data for which at least one of corresponding pick & place machine specific component shape parameters and a corresponding pick & place machine specific component shape identifier is not available, employing at least part of the GCG parameters to access appropriate ones of the machine-specific, component manufacturer-independent rules for generating the pick & place machine-specific component data, operating the appropriate ones of the machine-specific, component manufacturer-independent rules for generating the pick & place machine-specific component data based on at least one of the GCG parameters to yield corresponding values and assigning the corresponding values to corresponding ones of the pick & place machine-specific component shape parameters. Preferably, the method also includes, prior to the employing at least part of the GCG parameters to access appropriate ones of the machine-specific, component manufacturer-independent rules, employing at least part of the GCG parameters to auto-generate the corresponding pick & place machine specific component shape identifier.

In accordance with still a further preferred embodiment of the present invention the method also includes, prior to the employing the CAD data, the bill of materials, the approved component vendor list and the first database, automatically populating a CCL portion of the first database. Preferably, the automatically populating includes employing a component library which maps CV/CAT#s to component packaging shape parameters. Additionally or alternatively, the employing a component library includes employing the component library which includes a first stage mapping which maps CV/CAT#s to component packaging shape identifiers and a second stage mapping which maps the component packaging shape identifiers to component packaging shape parameters.

In accordance with another preferred embodiment of the present invention the automatically populating includes obtaining at least one CV/CAT# for which no mapping exists in the CCL portion, employing the first stage mapping to obtain a component packaging shape identifier corresponding to the at least one CV/CAT#, employing the second stage mapping to obtain component packaging shape parameters corresponding to the component packaging shape identifier corresponding to the at least one CV/CAT#, employing the component packaging shape identifier corresponding to the at least one CV/CAT#; and the component packaging shape parameters corresponding to the component packaging shape identifier to provide an auto-generated generic component shape identifier and auto-generated GCG parameters and adding the auto-generated generic component shape identifier and the auto-generated GCG parameters to the CCL portion for the at least one CV/CAT#. Preferably, the automatically populating also includes, prior to the adding, employing the auto-generated generic component shape identifier to search the CCL portion for corresponding, previously generated GCG parameters, comparing the previously generated GCG parameters and the auto-generated GCG parameters and if discrepancies are found, modifying the auto-generated generic component shape identifier to provide a modified generic component shape identifier and adding the modified generic component shape identifier and the auto-generated GCG parameters to the CCL portion for the at least one CV/CAT#.

In accordance with yet another preferred embodiment of the present invention the method also includes, following the employing the combined printed circuit assembly data together with the pick & place machine specific component data to balance the pick & place machine line, assigning suitable variables to adaptive ones of the pick & place machine specific component data to provide pick & place machine specific component data which corresponds to a specific pick & place machine configuration for at least one pick & place machine in the pick & place machine line. Preferably, the employing the CAD data, the bill of materials and the approved component vendor list for automatically generating does not require operator entry of pick & place machine-specific component data.

There is also provided in accordance with another preferred embodiment of the present invention a method of manufacturing electronic circuits including generating CAD data, a bill of materials and an approved component vendor list for an electronic circuit and employing at least the CAD data, the bill of materials and the approved component vendor list for automatically locating generic component geometric parameters corresponding to components in the CAD data, including employing at least one database for automatically locating at least one equivalent of ones of the components for which generic component geometric parameters are not available and providing generic component geometric parameters corresponding to the at least one equivalent as generic component geometric parameters corresponding to the ones of the components for which generic component geometric parameters are not available.

In accordance with a preferred embodiment of the present invention the at least one database includes a database containing pick & place machine-independent, geometric component data. Preferably, the database containing pick & place machine-independent, geometric component data includes at least one of a mapping of CV/Cat#s to component vendor-specific component geometric parameters (CCL), a mapping of CV/Cat#s to component supply form parameters (CCSL), a mapping of PCNs to component supply form parameters (UMCSL), a mapping of PCNs to CV/Cat#s (MCVL), a mapping of DCN to PCN, a user maintained mapping of CV/Cat# to component vendor-specific component geometric parameters (UMCL) and a mapping of PCN to generic component geometric parameters.

In accordance with another preferred embodiment of the present invention the employing at least one database for automatically locating includes selecting at least one PCN corresponding to each of the ones of the components, employing the at least one database to obtain at least one CV/CAT# corresponding to the at least one PCN, searching the at least one database for at least one additional PCN having at least one additional corresponding CV/CAT#, which is different from the at least one CV/CAT#, in common with the at least one PCN, searching the at least one database for at least one different CV/CAT# corresponding to the at least one additional PCN, which does not correspond to the at least one PCN and employing the at least one different CV/CAT# to search at least part of the at least one database for generic component geometric parameters corresponding to the at least one different CV/CAT#. Preferably, the providing generic component geometric includes presenting the generic component geometric parameters corresponding to the at least one different CV/CAT# together with the at least one PCN to an operator for approval.

In accordance with still another preferred embodiment of the present invention the providing generic component geometric parameters also includes automatically adding the generic component geometric parameters corresponding to the at least one different CV/CAT# to the at least one database as generic component geometric parameters corresponding to CV/CAT#s corresponding to at least one of the at least one PCN and the at least one additional PCN and automatically indicating, for all CV/CAT#s corresponding to the at least one PCN, the generic component geometric parameters corresponding to the at least one different CV/CAT# as being obtained by a proximity search. Additionally or alternatively, the providing generic component geometric parameters also includes providing manually generated generic component geometric parameters for the at least one CV/CAT#, automatically adding the manually generated generic component geometric parameters to the at least one database for the at least one CV/CAT# and automatically adding the manually generated generic component geometric parameters to the at least one database for CV/CAT#s corresponding to the at least one PCN.

There is further provided in accordance with a further preferred embodiment of the present invention a method of manufacturing an electronic circuit including employing a pick & place machine-specific component placement sequence, pick & place machine-specific component data for governing the operation of at least one specific pick & place machine in a manufacturing line and operating instructions in computer-readable language for the at least one specific pick & place machine to auto-generate generic component parameters for components used in manufacturing the electronic circuit on the at least one specific pick & place machine and employing the generic component parameters to auto-generate a pick & place machine-specific component placement sequence and pick & place machine-specific component data for governing the operation of at least one other specific pick & place machine in a manufacturing line and operating instructions in computer-readable language for the at least one other specific pick & place machine.

In accordance with a preferred embodiment of the present invention the at least one other specific pick & place machine is a different type of pick & place machine from the at least one specific pick & place machine. Preferably, the employing a pick & place machine-specific component placement sequence, includes employing at least a first database containing at least one of pick & place machine independent geometric component data and pick & place machine-independent, component supply data and a second database containing component manufacturer-independent, pick & place machine-specific rules. Additionally, the at least second database includes at least one of the following mappings a mapping of pick & place machine-specific component shape parameters to rules for generating component manufacturer-independent generic component geometric parameters, a mapping of pick & place machine-specific component supply parameters to rules for generating component manufacturer-independent generic component supply form parameters and a mapping of PCN parameters in pick & place machine specific synatx to generic PCN parameters.

In accordance with another preferred embodiment of the present invention the first database includes at least one of a mapping of CV/Cat#s to component vendor-specific component geometric parameters (CCL), a mapping of CV/Cat#s to component supply form parameters (CCSL), a mapping of PCNs to component supply form parameters (UMCSL), a mapping of PCNs to CV/Cat#s (MCVL), a mapping of DCN to PCN, a user maintained mapping of CV/Cat# to component vendor-specific component geometric parameters (UMCL) and a mapping of PCN to generic component geometric parameters.

In accordance with yet another preferred embodiment of the present invention the employing a pick & place machine-specific component placement sequence, pick & place machine-specific component data for governing the operation of at least one specific pick & place machine in a manufacturing line and operating instructions in computer-readable language for the at least one specific pick & place machine to auto-generate generic component parameters for components used in manufacturing the electronic circuit on the at least one specific pick & place machine also includes obtaining at least one PCN for ones of the components used in manufacturing the electronic circuit, employing the at least one PCN and a type of the at least one specific pick & place machine to access relevant ones of the component manufacturer-independent, pick & place machine-specific rules, operating the ones of the component manufacturer-independent, pick & place machine-specific rules using at least one pick & place machine specific component parameter to obtain corresponding values and assigning the values to corresponding generic component parameters. Preferably, the obtaining includes obtaining the at least one PCN from the operating instructions in computer-readable language.

In accordance with still another preferred embodiment of the present invention the operating includes operating ones of the component manufacturer-independent, pick & place machine-specific rules which are suitable for auto-generation of generic component supply form parameters using at least one pick & place machine specific component supply parameter to obtain a corresponding supply form value and the assigning includes assigning the corresponding supply form value to a corresponding generic component supply form parameter. Additionally or alternatively, the operating includes operating ones of the component manufacturer-independent, pick & place machine-specific rules which are suitable for auto-generation of generic component geometric parameters using at least one pick & place machine specific component shape parameter to obtain a corresponding geometric value and the assigning includes assigning the corresponding geometric value to a corresponding generic component geometric parameter. Preferably, the method also includes, following the assigning, adding the values and the corresponding generic component parameters to the first database for the at least one PCN and subsequently, indicating the values and the corresponding generic component parameters that were obtained by indirect association.

In accordance with a further preferred embodiment of the present invention the method also includes, prior to the employing a pick & place machine-specific component placement sequence, obtaining at least one PCN for each of the components, searching the first database for pick & place machine independent component supply data corresponding to the at least one PCN for each of the components and searching the first database for pick & place machine independent geometric component data corresponding to the at least one PCN for each of the components.

In accordance with still a further preferred embodiment of the present invention the employing the generic component parameters includes employing generic component supply form parameters and the second database for auto-generating pick & place machine specific component supply parameters and employing the generic component geometric parameters and the second database for auto-generating pick & place machine specific component shape parameters. Preferably, the employing generic component supply form parameters includes selecting at least one PCN corresponding to each of the components, employing at least part of the generic component supply form parameters to access appropriate ones of the machine-specific, component manufacturer-independent rules for generating the pick & place machine-specific component data, operating the appropriate ones of the machine-specific, component manufacturer-independent rules based on the third database and at least one of the generic component parameters to yield corresponding values and assigning the corresponding values to corresponding ones of the pick & place machine-specific component supply parameters.

In accordance with yet a further preferred embodiment of the present invention the method also includes, prior to the employing at least part of the generic component supply form parameters, employing at least part of the generic component supply form parameters to auto-generate the corresponding pick & place machine specific component supply identifier.

In accordance with an additional preferred embodiment of the present invention the employing the generic component geometric parameters includes selecting at least one PCN corresponding to each of the components, employing at least part of the generic component geometric parameters to access appropriate ones of the machine-specific, component manufacturer-independent rules for generating the pick & place machine-specific component data, operating the appropriate ones of the machine-specific, component manufacturer-independent rules for generating the pick & place machine-specific component data based on at least one of the generic component geometric parameters to yield corresponding values and assigning the corresponding values to corresponding ones of the pick & place machine-specific component shape parameters. Preferably, the method also includes, prior to the employing at least part of the generic component geometric parameters, employing at least part of the generic component geometric parameters to auto-generate a corresponding pick & place machine specific component shape identifier.

There is additionally provided in accordance with an additional preferred embodiment of the present invention a method of manufacturing an electronic circuit including employing a pick & place machine-specific component placement sequence, pick & place machine-specific component data for governing the operation of at least one specific pick & place machine in a manufacturing line and operating instructions in computer-readable language for the at least one specific pick & place machine to obtain generic component geometric parameters for at least one specific component used in manufacturing the electronic circuit on the at least one specific pick & place machine and employing the generic component geometric parameters to auto-generate a pick & place machine-specific component placement sequence, pick & place machine-specific component data for governing the operation of the at least one specific pick & place machine and operating instructions in computer-readable language for the at least one specific pick & place machine when the at least one specific component is replaced by at least one substitute component.

In accordance with a preferred embodiment of the present invention the employing a pick & place machine-specific component placement sequence includes obtaining at least one PCN corresponding to the at least one specific component, employing a database including pick & place machine independent geometric component data to obtain at least one CV/CAT# corresponding to the at least one PCN and employing the database and the at least one CV/CAT# to obtain generic component geometric parameters for the at least one specific component.

In accordance with another preferred embodiment of the present invention the employing the generic component geometric parameters includes obtaining at least one substitute PCN corresponding to the at least one substitute component, employing the database to obtain at least one substitute CV/CAT# corresponding to the at least one substitute PCN, employing the database and the at least one substitute CV/CAT# to obtain generic component geometric parameters for the at least one substitute component and comparing the generic component geometric parameters for the at least one specific component and the generic component geometric parameters for the at least one substitute component.

In accordance with yet another preferred embodiment of the present invention the employing the generic component geometric parameters also includes, following the comparing, employing the database and machine-specific, component manufacturer-independent rules for generating pick & place machine-specific component shape parameters to auto-generate pick & place machine specific component shape parameters and employing the pick & place machine specific component shape parameters to auto-generate the pick & place machine-specific component placement sequence, the pick & place machine-specific component data for governing the operation of the at least one specific pick & place machine and the operating instructions in computer-readable language for the at least one specific pick & place machine.

In accordance with a further preferred embodiment of the present invention the employing the database and machine-specific, component manufacturer-independent rules includes employing at least part of the generic component geometric parameters for the at least one substitute component to access appropriate ones of the machine-specific, component manufacturer-independent rules for generating the pick & place machine-specific component shape parameters, operating the appropriate ones of the machine-specific, component manufacturer-independent rules for generating the pick & place machine-specific component shape parameters based on at least one of the generic component geometric parameters for the at least one substitute component to yield corresponding values and assigning the corresponding values to corresponding ones of the pick & place machine-specific component shape parameters.

There is also provided in accordance with another preferred embodiment of the present invention apparatus for manufacturing electronic circuits including a computerized electronic circuit data generator operative for generating CAD data, a bill of materials and an approved component vendor list for an electronic circuit and a computerized generator operative for employing the CAD data, the bill of materials and the approved component vendor list for automatically generating a pick & place machine-specific component loading specification, a pick & place machine-specific component placement sequence and pick & place machine-specific component data for governing the operation of at least one specific pick & place machine in a manufacturing line.

In accordance with a preferred embodiment of the present invention the computerized generator includes a first database containing at least one of pick & place machine-independent, geometric component data and pick & place machine-independent, component supply data and a second database containing machine-specific, component manufacturer-independent rules for generating the pick & place machine-specific component data. Preferably, the pick & place machine specific component data for governing the operation of at least one specific pick & place machine includes at least one of pick & place machine-specific component shape parameters and pick & place machine-specific component supply parameters.

In accordance with another preferred embodiment of the present invention the computerized generator is also operative for automatically generating a third database containing at least a mapping between component identifiers and pick & place machine-specific component shape parameters and a mapping between the component identifiers and pick & place machine-specific component supply parameters. Preferably, the mapping between component identifiers and pick & place machine-specific component shape parameters includes a mapping of PCNs to component shape identifiers and a mapping of component shape identifiers to pick & place machine-specific component shape parameters. Additionally or alternatively, the component shape identifiers are pick & place machine-specific component shape identifiers.

In accordance with yet another preferred embodiment of the present invention the mapping between the component identifiers and pick & place machine-specific component supply parameters includes a mapping of PCNs to component supply identifiers and a mapping of component supply identifiers to pick & place machine-specific component supply parameters. Preferably, the component supply identifiers are pick & place machine-specific component supply identifiers.

In accordance with still another preferred embodiment of the present invention the pick & place machine-specific component shape parameters include at least one of component geometry parameters, component handling parameters, component imaging parameters, component recognition tolerances and pick & place machine-specific procedures. Preferably, the pick & place machine-specific component shape parameters include at least one of component geometry parameters in pick & place machine-specific syntax, pick & place machine-specific component handling parameters, pick & place machine-specific component imaging parameters, pick & place machine-specific component recognition tolerances and pick & place machine-specific procedures.

In accordance with a further preferred embodiment of the present invention the pick & place machine-specific component supply parameters include at least one of a component carrier type and pick & place machine-specific, component carrier-specific parameters. Preferably, at least part of the pick & place machine-specific component data includes adaptive pick & place machine-specific component data. Additionally or alternatively, the adaptive pick & place machine specific component data includes adaptive pick & place machine specific component shape data. As a further alternative, the adaptive pick & place machine specific component data includes adaptive pick & place machine specific component supply data.

In accordance with yet another preferred embodiment of the present invention the first database includes at least one of a mapping of CV/Cat#s to component vendor-specific component geometric parameters (CCL), a mapping of CV/Cat#s to component supply form parameters (CCSL), a mapping of PCNs to component supply form parameters (UMCSL), a mapping of PCNs to CV/Cat#s (MCVL), a mapping of DCN to PCN, a user maintained mapping of CV/Cat# to component vendor-specific component geometric parameters (UMCL) and a mapping of PCN to generic component geometric parameters.

In accordance with still another preferred embodiment of the present invention the second database includes at least one of a mapping of component manufacturer-independent component characteristics to rules for generating pick & place machine-specific component shape parameters and a mapping of component manufacturer-independent component supply form characteristics to rules for generating pick & place machine-specific component supply parameters. Preferably, the rules for generating pick & place machine-specific component shape parameters include rules for generating at least one of component geometric parameters in pick & place machine specific syntax, pick & place machine specific component handling parameters, pick & place machine specific component imaging parameters, pick & place machine specific component recognition tolerances and pick & place machine specific procedures. Additionally or alternatively, the rules for generating pick & place machine-specific component supply parameters include rules for generating at least one of a component carrier type in pick & place machine-specific syntax and component carrier type-specific parameters in pick & place machine-specific syntax.

In accordance with a further preferred embodiment of the present invention the second database includes at least one of a mapping of component manufacturer-independent component characteristics to rules for generating adaptive pick & place machine-specific component shape parameters and a mapping of component manufacturer-independent component supply form characteristics to rules for generating adaptive pick & place machine-specific component supply parameters. Preferably, the rules for generating adaptive pick & place machine-specific component shape parameters include rules for generating at least one of component geometric parameters in pick & place machine specific syntax, adaptive pick & place machine specific component handling parameters, adaptive pick & place machine specific component imaging parameters, adaptive pick & place machine specific component recognition tolerances and pick & place machine specific procedures.

In accordance with yet a further preferred embodiment of the present invention the rules for generating adaptive pick & place machine-specific component supply parameters include rules for generating at least one of adaptive component carrier type in pick & place machine-specific syntax and adaptive component carrier type-specific parameters in pick & place machine-specific syntax. Preferably, the second database is operator modifiable.

In accordance with still another preferred embodiment of the present invention the computerized generator includes a fourth database containing pick & place line and machine configurations. Preferably, the fourth database includes at least one of pick & place machine configurations, ordered listings of pick & place machines in at least one machine line and pick & place machine configurations of the pick & place machines in the at least one machine line.

In accordance with a further preferred embodiment of the present invention the pick & place machine configurations include at least one of camera types and characteristics, illumination types and characteristics, component feeder carriage types and characteristics, component feeder types and characteristics, nozzle types and characteristics and kinetic characteristics of moving elements. Preferably, the pick & place machine configurations of the pick & place machines in the plurality of machine lines include at least one of mounted camera types, mounted illumination types, mounted component feeder carriages, mounted component feeders and mounted nozzles.

In accordance with yet a further preferred embodiment of the present invention the computerized generator includes computerized new component data searching functionality operative to employ the CAD data, the bill of materials, the approved component vendor list and the first database to search for component data for new components and computerized auto-generation functionality operative to employ the first database and the second database to auto-generate the pick & place machine specific component data. Preferably, the computerized generator also includes a computerized combined printed circuit assembly data generator operative to employ the CAD data, the bill of materials and the approved component vendor list to form combined printed circuit assembly data, a computerized line selector operative to select a pick & place machine line, computerized line balancing functionality operative to employ the combined printed circuit assembly data together with the pick & place machine specific component data to balance the pick & place machine line.

In accordance with still another preferred embodiment of the present invention the combined printed circuit assembly data employs PCN designations. Preferably, the computerized new component data searching functionality includes computerized component supply data searching functionality operative to search the first database for pick & place machine independent component supply data for the new components and computerized component shape data searching functionality operative to search the first database for pick & place machine independent geometric component data for the new components. Preferably, the computerized component supply data searching functionality includes a PCN selector operative to select at least one PCN corresponding to ones of the new components for which CSF parameters are not available, CSF CV/CAT# obtaining functionality operative to obtain a CV/CAT# corresponding to the at least one PCN corresponding to ones of the new components for which CSF parameters are not available and CSF searching functionality operative to employ the CV/CAT# to search at least part of the first database for corresponding CSF parameters.

In accordance with an additional preferred embodiment of the present invention the computerized component shape data searching functionality includes a PCN selector operative to select at least one PCN corresponding to ones of the new components for which GCG parameters are not available, GCG CV/CAT# obtaining functionality operative to obtain a CV/CAT# corresponding to the at least one PCN corresponding to ones of the new components for which GCG parameters are not available and GCG searching functionality operative to employ the CV/CAT# to search at least part of the first database for corresponding GCG parameters.

In accordance with another additional preferred embodiment of the present invention the computerized component shape data searching functionality also includes computerized proximity searching functionality, including first computerized searching functionality operative to search the first database for at least one additional PCN having at least one corresponding CV/CAT#, which is different from the CV/CAT#, in common with the at least one PCN corresponding to ones of the new components for which GCG parameters are not available, second computerized searching functionality operative to search the first database for at least one different CV/CAT# corresponding to the at least one additional PCN, which does not correspond to the at least one PCN corresponding to ones of the new components for which GCG parameters are not available and proximate GCG parameter searching functionality operative to employ the at least one different CV/CAT# to search at least part of the first database for GCG parameters corresponding to the at least one different CV/CAT#.

In accordance with another preferred embodiment of the present invention the computerized auto-generation functionality includes component supply parameter auto-generation functionality operative to employ the first database and the second database to auto-generate pick & place machine specific component supply parameters and component shape parameter auto-generation functionality operative to employ the first database and the second database to auto-generate pick & place machine specific component shape parameters. Preferably, the component supply parameter auto-generation functionality includes a PCN selector operative, for a specific pick & place machine in the pick & place machine line, to select at least one PCN in the combined printed circuit assembly data for which at least one of corresponding pick & place machine specific component supply parameters and a corresponding pick & place machine specific component supply identifier is not available, CSF parameter obtaining functionality operative to employ at least one generic component supply identifier to obtain CSF parameters corresponding to the at least one PCN in the combined printed circuit assembly data for which at least one of corresponding pick & place machine specific component supply parameters and a corresponding pick & place machine specific component supply identifier is not available, rules operating functionality operative to employ at least part of the CSF parameters to access appropriate ones of the machine-specific, component manufacturer-independent rules for generating the pick & place machine-specific component data and to operate the appropriate ones of the machine-specific, component manufacturer-independent rules for generating the pick & place machine-specific component data based on at least one of the CSF parameters to yield corresponding values and value assigning functionality operative to assign the corresponding values to corresponding ones of the pick & place machine-specific component supply parameters.

In accordance with still another preferred embodiment of the present invention the component supply parameter auto-generation functionality also includes component supply identifier auto-generation functionality operative to employ at least part of the CSF parameters to auto-generate the corresponding pick & place machine specific component supply identifier. Preferably, the component shape parameter auto-generation functionality includes a PCN selector operative, for a specific pick & place machine in the pick & place machine line, to select at least one PCN in the combined printed circuit assembly data for which at least one of corresponding pick & place machine specific component shape parameters and a corresponding pick & place machine specific component shape identifier is not available, GCG parameter obtaining functionality operative to employ at least one generic component shape identifier to obtain GCG parameters corresponding to the at least one PCN in the combined printed circuit assembly data for which at least one of corresponding pick & place machine specific component shape parameters and a corresponding pick & place machine specific component shape identifier is not available, rules operating functionality operative to employ at least part of the GCG parameters to access appropriate ones of the machine-specific, component manufacturer-independent rules for generating the pick & place machine-specific component data and to operate the appropriate ones of the machine-specific, component manufacturer-independent rules for generating the pick & place machine-specific component data based on at least one of the GCG parameters to yield corresponding values and value assigning functionality operative to assign the corresponding values to corresponding ones of the pick & place machine-specific component shape parameters.

In accordance with another preferred embodiment of the present invention the component shape parameter auto-generation functionality also includes component shape identifier auto-generation functionality operative to employ at least part of the GCG parameters to auto-generate the corresponding pick & place machine specific component shape identifier. Preferably, the apparatus also includes a computerized database populating functionality operative to automatically populate a CCL portion of the first database. Additionally or alternatively, the computerized database populating functionality also includes component library which maps CV/CAT#s to component packaging shape parameters.

In accordance with yet another preferred embodiment of the present invention the component library includes a first stage mapping which maps CV/CAT#s to component packaging shape identifiers and a second stage mapping which maps the component packaging shape identifiers to component packaging shape parameters. Preferably, the computerized database populating functionality includes CV/CAT# obtaining functionality operative to obtain at least one CV/CAT# for which no mapping exists in the CCL portion, component packaging shape identifier obtaining functionality operative to employ the first stage mapping to obtain a component packaging shape identifier corresponding to the at least one CV/CAT# and component packaging shape parameter obtaining functionality operative to employ the second stage mapping to obtain component packaging shape parameters corresponding to the component packaging shape identifier corresponding to the at least one CV/CAT#.

In accordance with still another preferred embodiment of the present invention the apparatus also includes value assigning functionality operative to assign suitable variables to adaptive ones of the pick & place machine specific component data to provide pick & place machine specific component data which corresponds to a specific pick & place machine configuration for at least one pick & place machine in the pick & place machine line.

There is additionally provided in accordance with a further preferred embodiment of the present invention apparatus for manufacturing electronic circuits including a computerized electronic circuit data generator operative to generate CAD data, a bill of materials and an approved component vendor list for an electronic circuit and computerized component parameter locating functionality operative to employ at least the CAD data, the bill of materials and the approved component vendor list for automatically locating generic component geometric parameters corresponding to components in the CAD data, the computerized component parameter locating functionality including at least one database, computerized equivalents locating functionality operative to automatically locate in the at least one database at least one equivalent of ones of the components for which generic component geometric parameters are not available and parameter providing functionality operative to provide generic component geometric parameters corresponding to the at least one equivalent as generic component geometric parameters corresponding to the ones of the components for which generic component geometric parameters are not available.

In accordance with a preferred embodiment of the present invention the at least one database includes a database containing pick & place machine-independent, geometric component data. Preferably, the database containing pick & place machine-independent, geometric component data includes at least one of a mapping of CV/Cat#s to component vendor-specific component geometric parameters (CCL), a mapping of CV/Cat#s to component supply form parameters (CCSL), a mapping of PCNs to component supply form parameters (UMCSL), a mapping of PCNs to CV/Cat#s (MCVL), a mapping of DCN to PCN, a user maintained mapping of CV/Cat# to component vendor-specific component geometric parameters (UMCL) and a mapping of PCN to generic component geometric parameters.

In accordance with another preferred embodiment of the present invention the computerized equivalents locating functionality includes computerized PCN selection functionality operative to select at least one PCN corresponding to each of the ones of the components, CV/CAT# obtaining functionality operative to employ the at least one database to obtain at least one CV/CAT# corresponding to the at least one PCN, computerized searching functionality operative to search the at least one database for at least one additional PCN having at least one additional corresponding CV/CAT#, which is different from the at least one CV/CAT#, in common with the at least one PCN and for at least one different CV/CAT# corresponding to the at least one additional PCN, which does not correspond to the at least one PCN and computerized component parameter searching functionality operative to employ the at least one different CV/CAT# to search at least part of the at least one database for generic component geometric parameters corresponding to the at least one different CV/CAT#. Preferably, the providing generic component geometric includes presenting the generic component geometric parameters corresponding to the at least one different CV/CAT# together with the at least one PCN to an operator for approval.

There is further provided in accordance with a further preferred embodiment of the present invention apparatus for manufacturing an electronic circuit including computerized generic component parameter auto-generation functionality operative to employ a pick & place machine-specific component placement sequence, pick & place machine-specific component data for governing the operation of at least one specific pick & place machine in a manufacturing line and operating instructions in computer-readable language for the at least one specific pick & place machine to auto-generate generic component parameters for components used in manufacturing the electronic circuit on the at least one specific pick & place machine and computerized machine parameter auto-generation functionality operative to employ the generic component parameters to auto-generate a pick & place machine-specific component placement sequence and pick & place machine-specific component data for governing the operation of at least one other specific pick & place machine in a manufacturing line and operating instructions in computer-readable language for the at least one other specific pick & place machine.

In accordance with a preferred embodiment of the present invention the at least one other specific pick & place machine is a different type of pick & place machine from the at least one specific pick & place machine. Preferably, the computerized generic component parameter auto-generation functionality includes a first database containing at least one of pick & place machine independent geometric component data and pick & place machine-independent, component supply data and a second database containing component manufacturer-independent, pick & place machine-specific rules.

In accordance with another preferred embodiment of the present invention the second database includes at least one of the following mappings a mapping of pick & place machine-specific component shape parameters to rules for generating component manufacturer-independent generic component geometric parameters, a mapping of pick & place machine-specific component supply parameters to rules for generating component manufacturer-independent generic component supply form parameters and a mapping of PCN parameters in pick & place machine specific syntax to generic PCN parameters. Preferably, the first database includes at least one of a mapping of CV/Cat#s to component vendor-specific component geometric parameters (CCL), a mapping of CV/Cat#s to component supply form parameters (CCSL), a mapping of PCNs to component supply form parameters (UMCSL), a mapping of PCNs to CV/Cat#s (MCVL), a mapping of DCN to PCN, a user maintained mapping of CV/Cat# to component vendor-specific component geometric parameters (UMCL) and a mapping of PCN to generic component geometric parameters.

In accordance with still another preferred embodiment of the present invention the computerized generic component parameter auto-generation functionality includes PCN obtaining functionality operative to obtain at least one PCN for ones of the components used in manufacturing the electronic circuit, rules operating functionality operative to employ the at least one PCN and a type of the at least one specific pick & place machine to access relevant ones of the component manufacturer-independent, pick & place machine-specific rules and to operate the ones of the component manufacturer-independent, pick & place machine-specific rules using at least one pick & place machine specific component parameter to obtain corresponding values and value assigning functionality operative to assign the values to corresponding generic component parameters. Preferably, the computerized generic component parameter auto-generation functionality also includes computerized value addition functionality operative to add the values and the corresponding generic component parameters to the first database for the at least one PCN and value indicating functionality operative to indicate the values and the corresponding generic component parameters that were obtained by indirect association.

In accordance with a further preferred embodiment of the present invention the computerized machine parameter auto-generation functionality includes computerized supply parameter auto-generation functionality operative to employ generic component supply form parameters and the second database for auto-generating pick & place machine specific component supply parameters and computerized shape parameter auto-generation functionality operative to employ the generic component geometric parameters and the second database for auto-generating pick & place machine specific component shape parameters. Preferably, the computerized supply parameter auto-generation functionality includes PCN selection functionality operative to select at least one PCN corresponding to each of the components, rules operating functionality operative to employ at least part of the generic component supply form parameters to access appropriate ones of the machine-specific, component manufacturer-independent rules for generating the pick & place machine-specific component data and to operate the appropriate ones of the machine-specific, component manufacturer-independent rules based on the third database and at least one of the generic component parameters to yield corresponding values and value assigning functionality operative to assign the corresponding values to corresponding ones of the pick & place machine-specific component supply parameters.

In accordance with another further preferred embodiment of the present invention the computerized supply parameter auto-generation functionality also includes computerized supply identifier auto-generation functionality operative to employ at least part of the generic component supply form parameters to auto-generate the corresponding pick & place machine specific component supply identifier. Preferably, the computerized shape parameter auto-generation functionality includes PCN selection functionality operative to select at least one PCN corresponding to each of the components, rules operating functionality operative to employ at least part of the generic component shape parameters to access appropriate ones of the machine-specific, component manufacturer-independent rules for generating the pick & place machine-specific component data and to operate the appropriate ones of the machine-specific, component manufacturer-independent rules based on the third database and at least one of the generic component parameters to yield corresponding values and value assigning functionality operative to assign the corresponding values to corresponding ones of the pick & place machine-specific component shape parameters.

In accordance with an additional preferred embodiment of the present invention the computerized shape parameter auto-generation functionality also includes computerized shape identifier auto-generation functionality operative to employ at least part of the generic component shape parameters to auto-generate the corresponding pick & place machine specific component shape identifier.

There is also provided in accordance with an additional preferred embodiment of the present invention apparatus for manufacturing an electronic circuit including computerized component parameter obtaining functionality operative to employ a pick & place machine-specific component placement sequence, pick & place machine-specific component data for governing the operation of at least one specific pick & place machine in a manufacturing line and operating instructions in computer-readable language for the at least one specific pick & place machine to obtain generic component geometric parameters for at least one specific component used in manufacturing the electronic circuit on the at least one specific pick & place machine and computerized auto-generation functionality operative to employ the generic component geometric parameters to auto-generate a pick & place machine-specific component placement sequence, pick & place machine-specific component data for governing the operation of the at least one specific pick & place machine and operating instructions in computer-readable language for the at least one specific pick & place machine when the at least one specific component is replaced by at least one substitute component.

In accordance with a preferred embodiment of the present invention the computerized component parameter obtaining functionality includes PCN obtaining functionality operative to obtain at least one of at least one PCN corresponding to the at least one specific component and at least one substitute PCN corresponding to the at least one substitute component, CV/CAT# obtaining functionality operative to employ a database including pick & place machine independent geometric component data to obtain at least one of at least one CV/CAT# corresponding to the at least one PCN and at least one substitute CV/CAT# corresponding to the at least one substitute PCN, component geometric parameter obtaining functionality operative to employ the database, the at least one CV/CAT# and the at least one substitute CV/CAT# to obtain generic component geometric parameters for at least one of the at least one specific component and at least one substitute component, geometric parameter comparing functionality operative to compare the generic component geometric parameters for the at least one specific component and the generic component geometric parameters for the at least one substitute component.

BRIEF DESCRIPTION OF THE DRAWINGS

The present invention will be understood and appreciated more fully from the following detailed description, taken in conjunction with the drawings in which:

FIGS. 5A and 5B are exemplary charts illustrating logical organization of rules, contained in the database of FIG. 4, for generating pick & place machine-specific component supply parameters and pick & place machine-specific component shape parameters respectively;

FIG. 7 is a simplified illustration of a pick & place line and machine configurations database employed in the system and functionality of FIGS. 1 and 2;

FIGS. 11A, 11B, 11C and 11D are each a simplified diagrammatic illustration of the application of one type of pick & place machine-specific component manufacturer-independent rules for generating a corresponding type of pick & place machine-specific component supply parameters employed in accordance with a preferred embodiment of the present invention;

FIGS. 13A and 13B together form a simplified flowchart illustrating details of New PCN/GCG Search functionality, forming part of the functionality shown in the flowchart of FIGS. 8A and 8B;

FIGS. 26A and 26B are exemplary charts illustrating logical organization of rules, contained in the database of FIG. 25, for generating adaptive pick & place machine-specific component supply parameters and adaptive pick & place machine-specific component shape parameters respectively;

DETAILED DESCRIPTION OF PREFERRED EMBODIMENTS

The present invention provides a method of manufacturing electronic circuits including generating CAD data, a bill of materials and an approved component vendor list for an electronic circuit and employing the CAD data, the bill of materials and the approved component vendor list for automatically generating a pick & place machine-specific component loading specification, a pick & place machine-specific component placement sequence and pick & place machine-specific component data for governing the operation of at least one specific pick & place machine in a manufacturing line.

Figure 1:
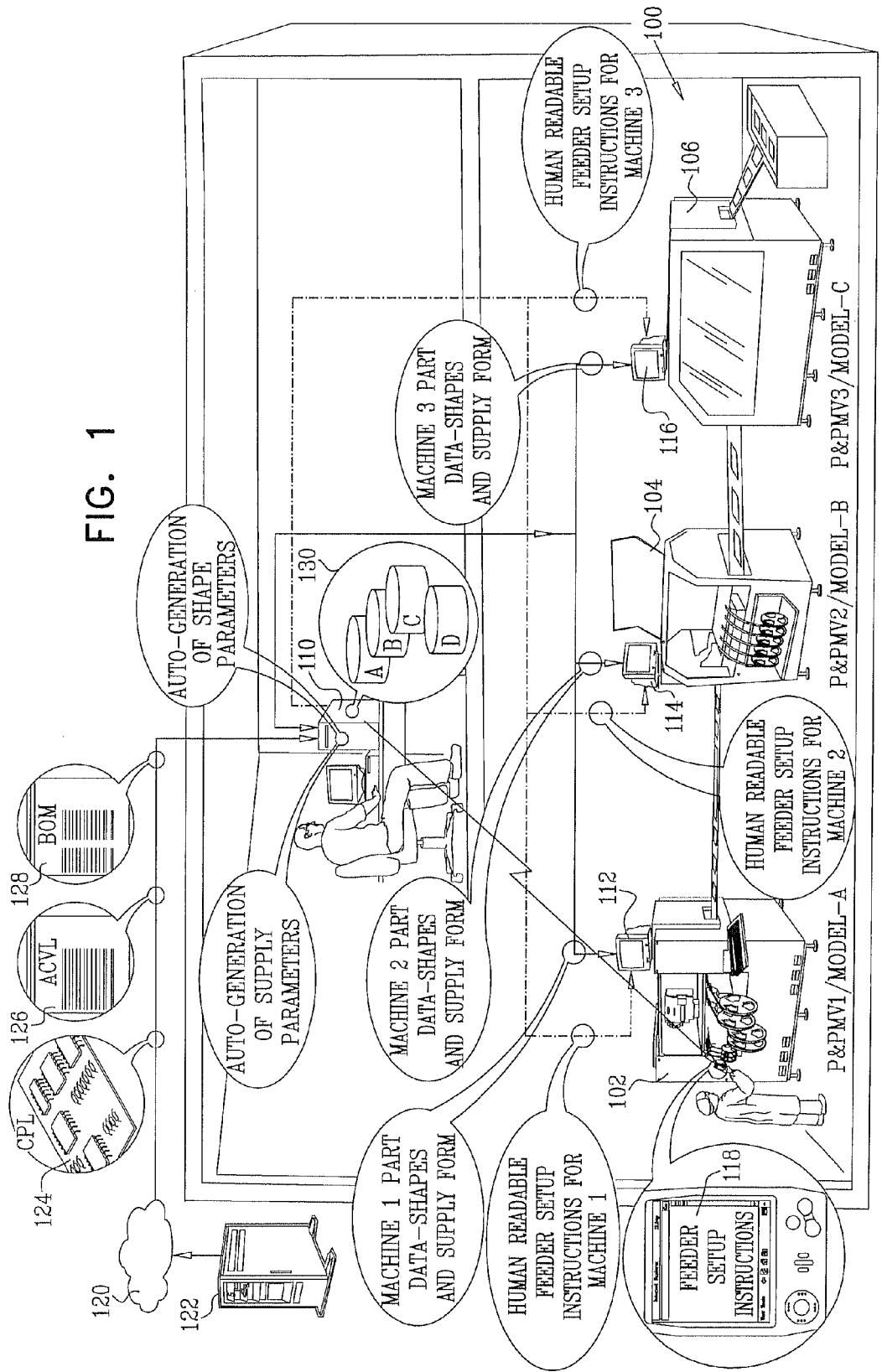
FIG. 1 is a simplified illustration of a system and functionality for automated manufacture of electronic circuits in accordance with a preferred embodiment of the present invention.

Reference is now made to FIG. 1, which is a simplified illustration of a system and functionality for automated manufacture of electronic circuits in accordance with a preferred embodiment of the present invention.

A typical context in which the present invention is used is an automated electronic circuit manufacture facility which includes one or more automated electronic circuit manufacturing lines, one of which is shown in FIG. 1 and identified generally by reference numeral 100. Each electronic circuit manufacturing line typically comprises a plurality of pick & place machines which may or may not originate from the same equipment vendor. Typically, each line comprises between one and ten pick & place machines. In FIG. 1, three such machines are illustrated and are respectively designated by reference numerals 102, 104 and 106. In the illustrated example of FIG. 1, each of pick & place machines 102, 104 and 106 is supplied by a different equipment vendor.

One or more machine line programmers, operating a machine line programming station 110, are responsible, inter alia, for providing operating instructions in computer-readable language to the pick & place machines of one or more lines 100, such as pick & place machines 102, 104 and 106. The machine line programmer is also responsible for providing operating instructions in human-readable form to one or more pick & place machine operators who configure the pick & place machines and load components onto the machines. These human-readable instructions may be provided to the operators via respective displays 112, 114 and 116, on pick & place machines 102, 104 and 106, or, preferably, via hand-held terminals 118 or, alternatively, in hard copy.

In accordance with a preferred embodiment of the present invention, the machine line programmer employs an embodiment of the present invention which is preferably embodied in software loaded onto one or more computers forming part of machine line programming station 110. The machine line programmer also employs electronic circuit design and specification data specific to each electronic circuit to be manufactured. This data is preferably supplied via a computer network 120 from one or more remote servers 122, directly to one or more computers forming part of machine line programming station 110 and preferably includes CPL, ACVL and BOM data, respectively designated by reference numerals 124, 126 and 128.

Figure 2:
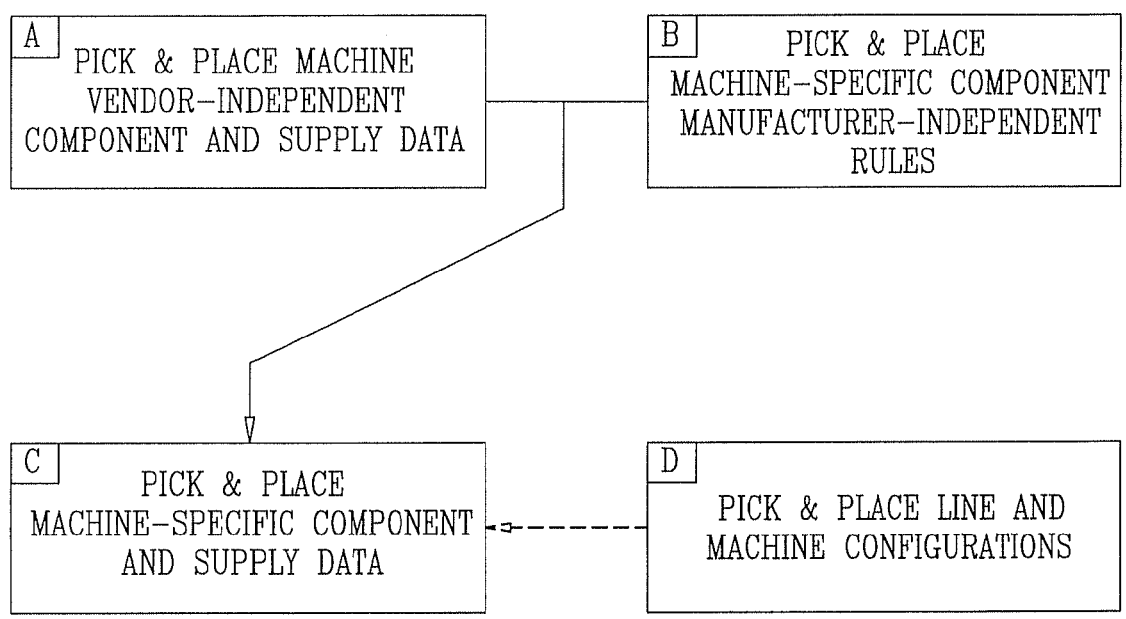
FIG. 2 is a simplified, diagrammatic illustration of four databases employed in the system and functionality of FIG. 1 in accordance with a preferred embodiment of the present invention.

In processing the received CPL 124, ACVL 126 and BOM 128 data to provide operating instructions, the machine line programmer preferably employs databases 130 preferably including at least four databases, identified in FIG. 1 as databases A, B, C and D. As indicated in FIG. 2, to which reference is now additionally made, databases A, B, C and D may be characterized as follows:

Database A—containing pick & place machine vendor-independent component and supply data;

Database B—containing pick & place machine-specific component manufacturer-independent rules;

Database C—containing pick & place machine-specific component and supply data; and Database D—containing pick & place line and machine configurations.

FIG. 2 diagrammatically illustrates that in accordance with a preferred embodiment of the present invention databases A, B and D are employed in combination in accordance with the present invention to automatically generate at least part of the content of database C.

As seen in FIG. 1, preferably the machine line programming station 110, using software of the present invention, employs the received CPL 124, ACVL 126 and BOM 128 data and databases A, B and possibly D to perform auto-generation of pick & place machine-specific component shape parameters and pick & place machine-specific component supply parameters which are preferably incorporated into database C, as described hereinbelow.

As also seen in FIG. 1, the machine line programming station 110, using software of the present invention, preferably employs the received CPL 124, ACVL 126 and BOM 128 data and databases A-D to perform line balancing and programming functions, the outputs of which are pick & place machine-specific component shape and supply parameters which are supplied to pick & place machines 102, 104 and 106 in a machine-readable language which is readable by each specific machine and human-readable machine feeder set-up instructions specifically adapted for each of the pick & place machines 102, 104 and 106.

Figure 3:
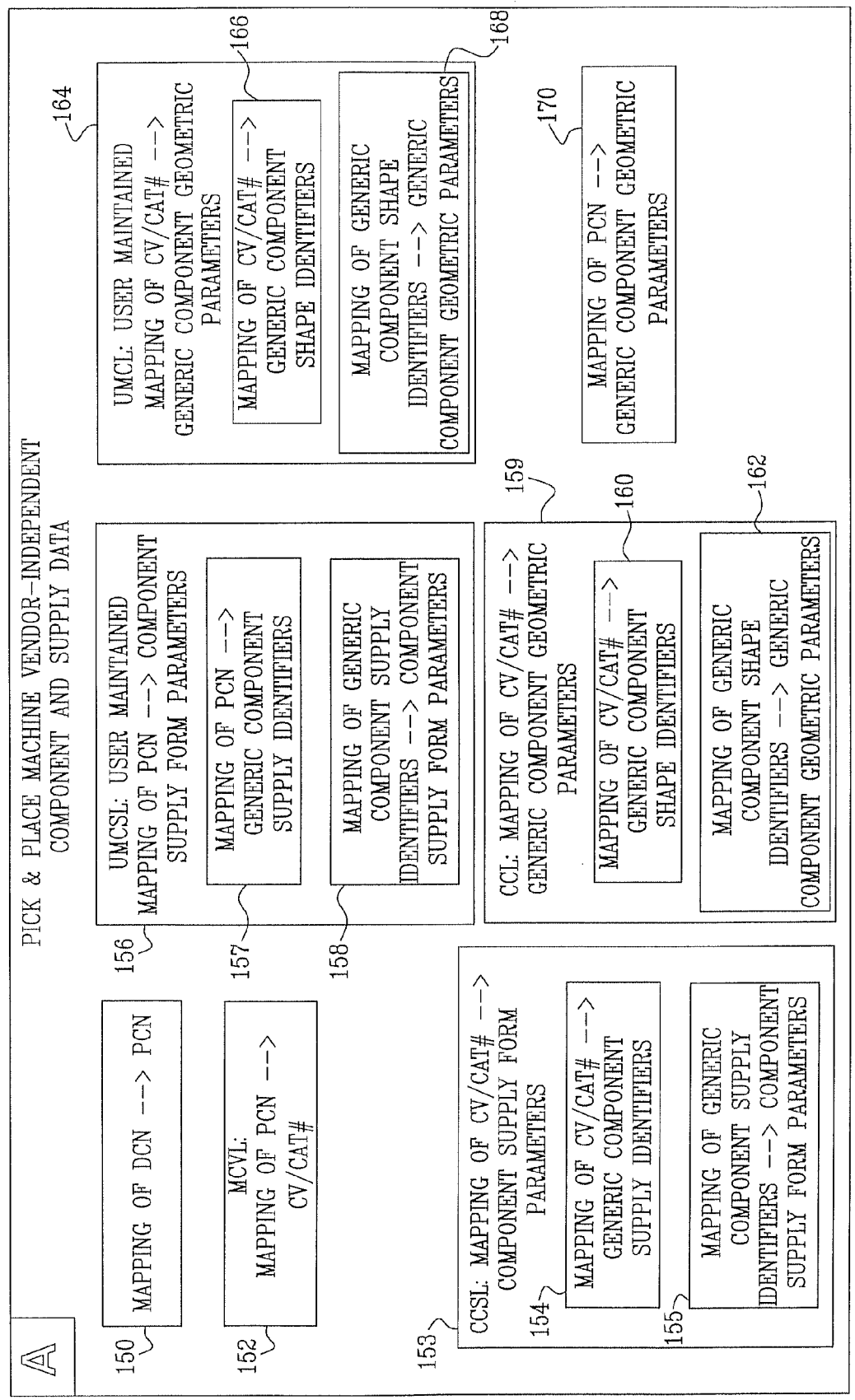
FIG. 3 is a simplified illustration of a pick & place machine vendor-independent component and supply data database employed in the system and functionality of FIGS. 1 and 2.

Reference is now made to FIG. 3, which illustrates the structure and content of database A. As seen in FIG. 3, database A includes a plurality of mappings, each shown enclosed in a rectangle, which are preferably employed to enhance the accessibility of the information stored in the database.

A first mapping, here designated by reference numeral 150, maps designer component numbers (DCN) appearing in the BOM 128 (FIG. 1) to programmer component numbers (PCN). Preferably, this is a one-to-one mapping, but alternatively may be a many-to-many mapping. A separate mapping 150 is preferably provided for the designer component numbers (DCN) of each separate design center.

A second mapping, here designated by reference numeral 152 and referred to hereinafter as MCVL, maps programmer component numbers (PCN) to component vendor/catalog number pairs (CV/CAT#). This is a many-to-many mapping.

A third mapping, here designated by reference numeral 153 and referred to hereinafter as CCSL, maps CV/CAT#s to component supply form (CSF) parameters. This is preferably a many-to-one mapping. This mapping includes two stages: an initial stage mapping, designated by reference numeral 154, which includes a many-to-one mapping of component vendor/catalog number pairs (CV/CAT#) to generic component supply identifiers, and a second stage mapping, designated by reference numeral 155, which includes a one-to-one mapping of generic component supply identifiers to component supply form (CSF) parameters.

A fourth mapping, here designated by reference numeral 156 and referred to hereinafter as UMCSL, maps programmer component numbers (PCN) to component supply form (CSF) parameters and is maintained by the machine line programmer using station 110 (FIG. 1). This is preferably a many-to-one mapping. This mapping includes two stages: an initial stage mapping, designated by reference numeral 157, which preferably includes a many-to-one mapping of PCNs to generic component supply identifiers, and a second stage mapping, designated by reference numeral 158, which includes a one-to-one mapping of generic component supply identifiers to component supply form (CSF) parameters.

It is appreciated that for the sake of database conciseness, the second stage mappings 155 and 158 may be combined into a single mapping.

A fifth mapping, here designated by reference numeral 159 and referred to hereinafter as CCL, maps component vendor/catalog number pairs (CV/CAT#) to generic component geometric (GCG) parameters. This mapping includes two stages: an initial stage mapping, designated by reference numeral 160, which includes a many-to-one mapping of component vendor/catalog number pairs (CV/CAT#) to generic component shape identifiers, and a second stage mapping, designated by reference numeral 162, which includes a one-to-one mapping of generic component shape identifiers to generic component geometric (GCG) parameters. It is noted that the generic component geometric (GCG) parameters include, inter alia, one or more default component supply forms (DCSF).

A sixth mapping, here designated by reference numeral 164 and referred to hereinafter as UMCL, maps component vendor/catalog number pairs (CV/CAT#) to generic component geometric (GCG) parameters and is maintained by the machine line programmer using station 110 (FIG. 1). This mapping includes two stages: an initial stage mapping, designated by reference numeral 166, which includes a many-to-one mapping of component vendor/catalog number pairs (CV/CAT#) to generic component shape identifiers, and a second stage mapping, designated by reference numeral 168, which includes a one-to-one mapping of generic component shape identifiers to generic component geometric (GCG) parameters. It is noted that the generic component geometric (GCG) parameters include, inter alia, one or more default component supply forms (DCSF).

It is appreciated that for the sake of database conciseness, the second stage mappings 162 and 168 may be combined into a single mapping.

A seventh mapping, here designated by reference numeral 170, maps programmer component numbers (PCNs) directly to generic component geometric (GCG) parameters. This mapping can be used by the machine line programmer to override the fifth and sixth mappings.

Figure 4:
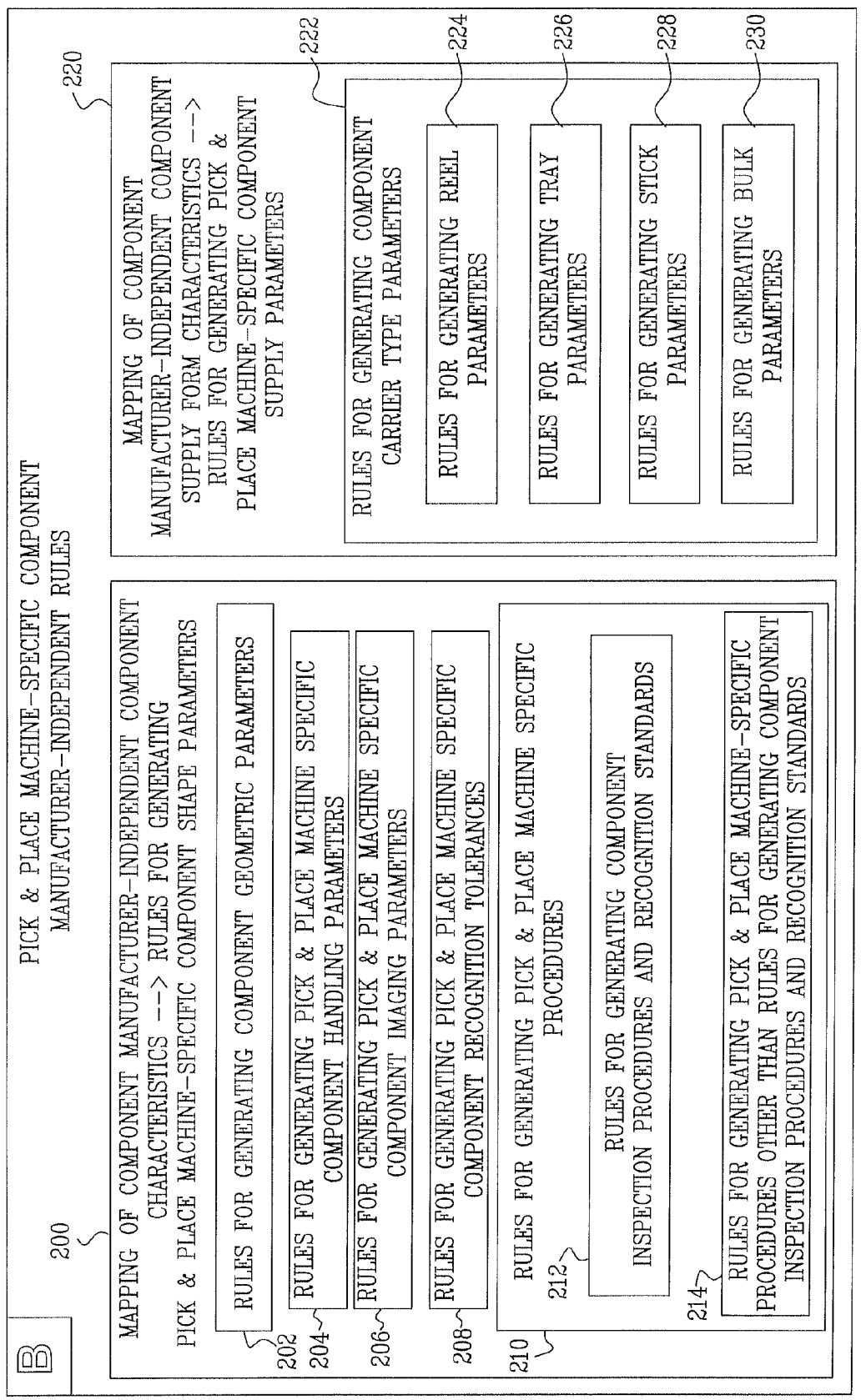
FIG. 4 is a simplified illustration of a pick & place machine-specific component manufacturer-independent rules database employed in the system and functionality of FIGS. 1 and 2.

Reference is now made to FIG. 4, which illustrates the structure and content of database B. As seen in FIG. 4, database B includes a plurality of mappings, each shown enclosed in a rectangle, which are preferably employed to enhance the accessibility of the information stored in the database.

A first mapping, here designated by reference numeral 200, maps component manufacturer-independent component characteristics to rules for generating pick & place machine-specific component shape parameters (MSSHP). The rules for generating pick & place machine-specific component shape parameters are preferably divided into several groups in database B including:

Rules 202 for generating component geometric parameters. These rules are not necessarily pick & place machine-specific but provide component geometric parameters which appear in a pick & place machine-specific syntax.

Rules 204 for generating pick & place machine-specific component handling parameters. These rules are pick & place machine-specific.

Rules 206 for generating pick & place machine-specific component imaging parameters. These rules are pick & place machine-specific.

Rules 208 for generating pick & place machine-specific component recognition tolerances. These rules are pick & place machine-specific.

Rules 210 for generating pick & place machine-specific procedures. These rules include two sub-groups of rules:

Rules 212 for generating component inspection procedures and recognition standards. For example, these rules determine the number of attempts to pick up a component before a pick-up failure is noted.

Rules 214 for generating pick & place machine-specific procedures other than rules 212 for generating component inspection procedures and recognition standards. For example, these rules determine what is to be done with rejected components.

A second mapping, here designated by reference numeral 220, maps component manufacturer-independent component supply form characteristics to rules for generating pick & place machine-specific component supply parameters (MSSUP). The rules for generating pick & place machine-specific component supply parameters include rules 222 for generating component carrier type parameters. These rules are not necessarily pick & place machine-specific but provide component carrier type parameters which appear in a pick & place machine-specific syntax. Rules 222 include four sub-groups:

Rules 224 for generating reel parameters, such as for example, rules relating to reel diameter, width and pitch.

Rules 226 for generating tray parameters, such as, for example, rules relating to the number of components contained on a tray along its X and Y axes.

Rules 228 for generating stick parameters, such as, for example, rules relating to the width of the stick and the number of components contained in the stick.

Rules 230 for generating bulk parameters, such as, for example, rules relating to the width of the opening of a bulk container.

Reference is now made to FIGS. 5A and 5B, which are exemplary charts illustrating logical organization of rules, contained in the database of FIG. 4, for generating pick & place machine-specific component supply parameters and pick & place machine-specific component shape parameters, respectively.

Turning to FIG. 5A, which illustrates the organization of rules for generating pick & place machine-specific component supply parameters, it is seen that the chart of rules is organized along a vertical axis according to pick & place machine-specific component supply parameters (MSSUPs), such as reel feed pitch, reel sub-feed pitch, and reel width, to which a value is to be assigned in accordance with the rules.

It is appreciated that typically a separate chart of the type shown in FIG. 5A is applicable to each carrier type, such as reels, trays, sticks and bulk, and to each specific model of pick & place machine.

Each cell in the chart contains an exemplary rule. For example, cell 232, which relates to the number of machine feeds, contains a rule which, when operated, calculates an integer part of a ratio between the reel pitch and the machine feed distance, and assigns the resulting value to the machine feed parameter.

As another example, cell 234, which relates to the number of machine sub-feeds, contains a rule which, when operated, calculates the remainder of the ratio between the reel pitch and the machine feed distance. If the remainder is not zero, the resulting value is assigned to the machine sub-feed parameter. Otherwise, the machine sub-feed parameter is irrelevant.

It is appreciated that any suitable rule logic may be employed in the rules of FIG. 5A.

Turning to FIG. 5B, which illustrates the organization of rules for generating pick & place machine-specific component shape parameters, it is seen that the chart of rules is organized along a horizontal axis according to component manufacturer-independent component types, such as BGA, QFP and CONNECTORS and is organized along a vertical axis according to pick & place machine-specific component shape parameters (MSSHPs), such as pickup depth, named nozzle, maximum nozzle and illumination level, to which a value is to be assigned in accordance with the rules.

Each cell in the chart contains an exemplary rule. For example, cell 242, which relates to pickup depth for a BGA component, contains a rule which, when operated, defines the pickup depth to be equal to the component height.

As another example, cell 244, which relates to a named nozzle for a connector type component, contains a rule which, when operated, calculates the ratio between the maximum of the component's X dimension and the component's Y dimension and the minimum of the component's X dimension and the component's Y dimension, and determines the nozzle to be used accordingly. In the example shown in cell 244, if the ratio is greater than or equal to 2, and the minimum of the component's X dimension and the component's Y dimension is greater than or equal to 8, then the largest nozzle is named. Otherwise, if the ratio is less than 2, then the parameter of named nozzle is irrelevant. Otherwise, when the ratio is greater than or equal to 2 but the minimum of the component's X dimension and the component's Y dimension is less than 8, then a medium nozzle is named.

As a further example, cell 246, which relates to a maximum nozzle parameter for a QFP component, contains a rule which, when operated, calculates the maximum of the component's X dimension and the component's Y dimension, and determines the maximum nozzle width by multiplying this maximum by 0.95.

It is appreciated that any suitable rule logic may be employed in the rules of FIG. 5B.

Figure 6:
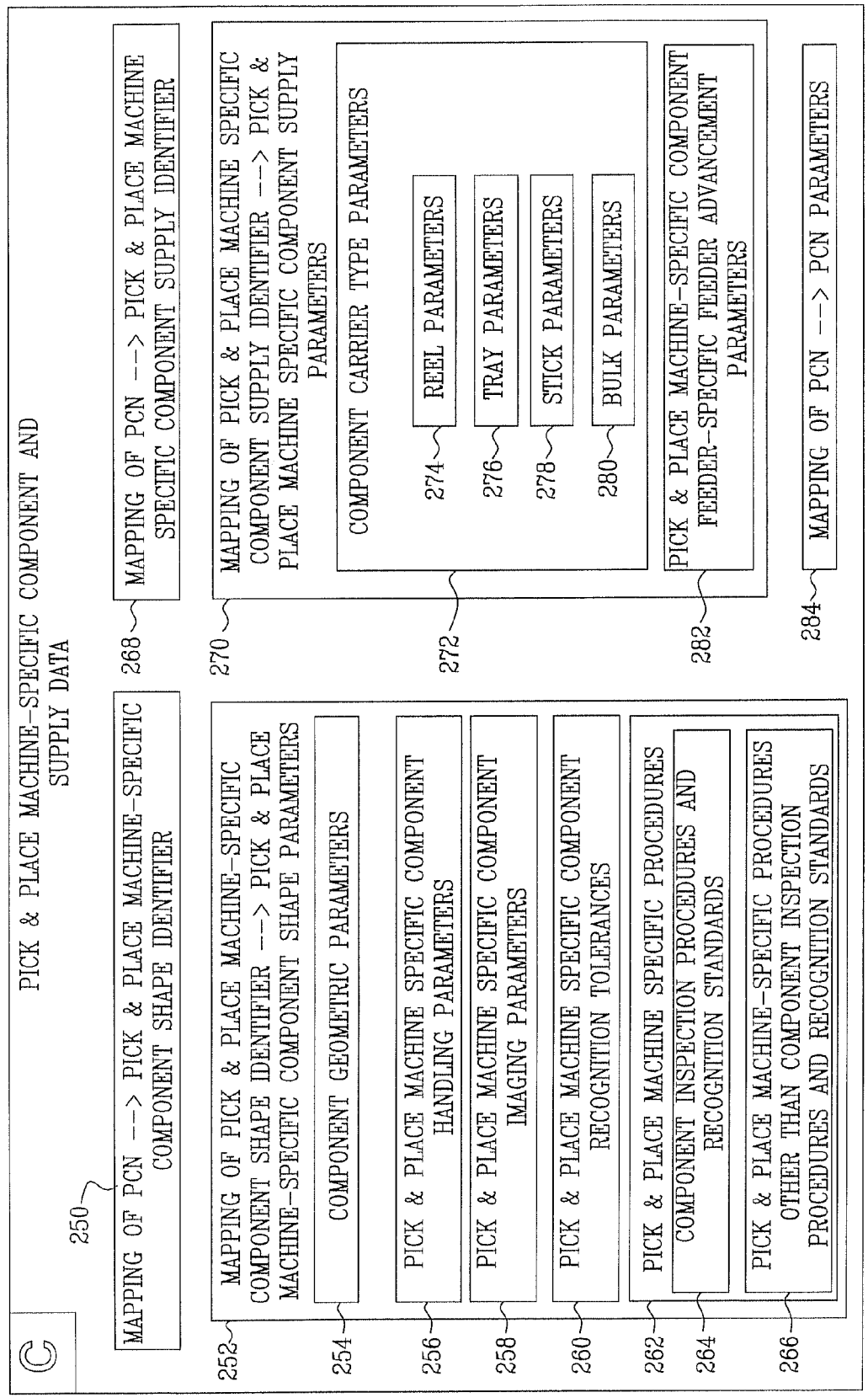
FIG. 6 is a simplified illustration of a pick & place machine-specific component and supply data database employed in the system and functionality of FIGS. 1 and 2.

Reference is now made to FIG. 6, which illustrates the structure and content of database C. As seen in FIG. 6, database C includes a plurality of mappings, each shown enclosed in a rectangle, which are preferably employed to enhance the accessibility of the information stored in the database.

A first mapping, here designated by reference numeral 250, maps programmer component numbers (PCNs) to pick & place machine-specific component shape identifiers. This is a many-to-one mapping.

A second mapping, here designated by reference numeral 252, maps pick & place machine-specific component shape identifiers to pick & place machine-specific component shape parameters (MSSHP). The pick & place machine-specific component shape parameters are divided into several groups in database C including:

Component geometric parameters 254. The parameters are not necessarily pick & place machine-specific but appear in a pick & place machine-specific syntax.

Pick & place machine-specific component handling parameters 256. These parameters are pick & place machine-specific.

Pick & place machine-specific component imaging parameters 258. These parameters are pick & place machine-specific.

Pick & place machine-specific component recognition tolerances 260. These tolerances are pick & place machine-specific.

Pick & place machine-specific procedures 262. These procedures include two sub-groups:

Component inspection procedures and recognition standards 264.

Pick & place machine-specific procedures 266 other than component inspection procedures and recognition standards 264.

A third mapping, here designated by reference numeral 268, maps programmer component numbers (PCNs) to pick & place machine-specific component supply identifiers. This is a many-to-one mapping.

A fourth mapping, here designated by reference numeral 270, maps pick & place machine-specific component supply identifiers to pick & place machine-specific component supply parameters (MSSUP). The pick & place machine-specific component supply parameters include two sub-groups:

Component carrier type parameters 272. These parameters are not necessarily pick & place machine-specific but appear in a pick & place machine-specific syntax. These parameters include four further sub-groups:

Reel parameters 274, such as, for example, reel diameter, width and pitch.

Tray parameters 276, such as, for example, the number of components contained on a tray along its X and Y axes.

Stick parameters 278, such as, for example, the width of a stick and the number of components contained in the stick.

Bulk parameters 280, such as, for example, the width of the opening of a bulk container.

Pick & place machine-specific, component feeder-specific, feeder advancement parameters 282. These parameters are pick & place machine-specific.

A fifth mapping, here designated by reference numeral 284, maps programmer component numbers (PCNs) to PCN parameters. These parameters are not necessarily pick & place machine-specific but appear in a pick & place machine-specific syntax. An example of a PCN parameter is component polarity status.

It is noted that database C contains all of the above mappings appropriate for each specific pick & place machine.

Reference is now made to FIG. 7, which illustrates the structure and content of database D. As seen in FIG. 7, database D includes a plurality of groupings of information, each shown enclosed in a rectangle.

A first grouping, here designated by reference numeral 300, includes descriptions of all possible machine configurations for each of a plurality of models of pick & place machines. This first grouping preferably includes seven sub-groups:

Camera types and characteristics 302;
Illumination types and characteristics 304;
Component feeder carriage types and characteristics 306;
Component feeder types and characteristics 308;
Nozzle types and characteristics 310;
Kinetic characteristics of moving elements 312; and
Characteristics of moving elements 313, including, for example, table dimensions and definition of coordinate system.

A second grouping, here designated by reference numeral 314, includes ordered listings of pick & place machines in one or more machine lines.

A third grouping, here designated by reference numeral 320, includes pick & place machine configurations of the pick & place machines in a plurality of machine lines. This third grouping preferably includes five sub-groups:

Mounted camera types 322;
Mounted illumination types 324;
Mounted component feeder carriages 326;
Mounted component feeders 328; and
Mounted nozzles 330.

Figure 8A:
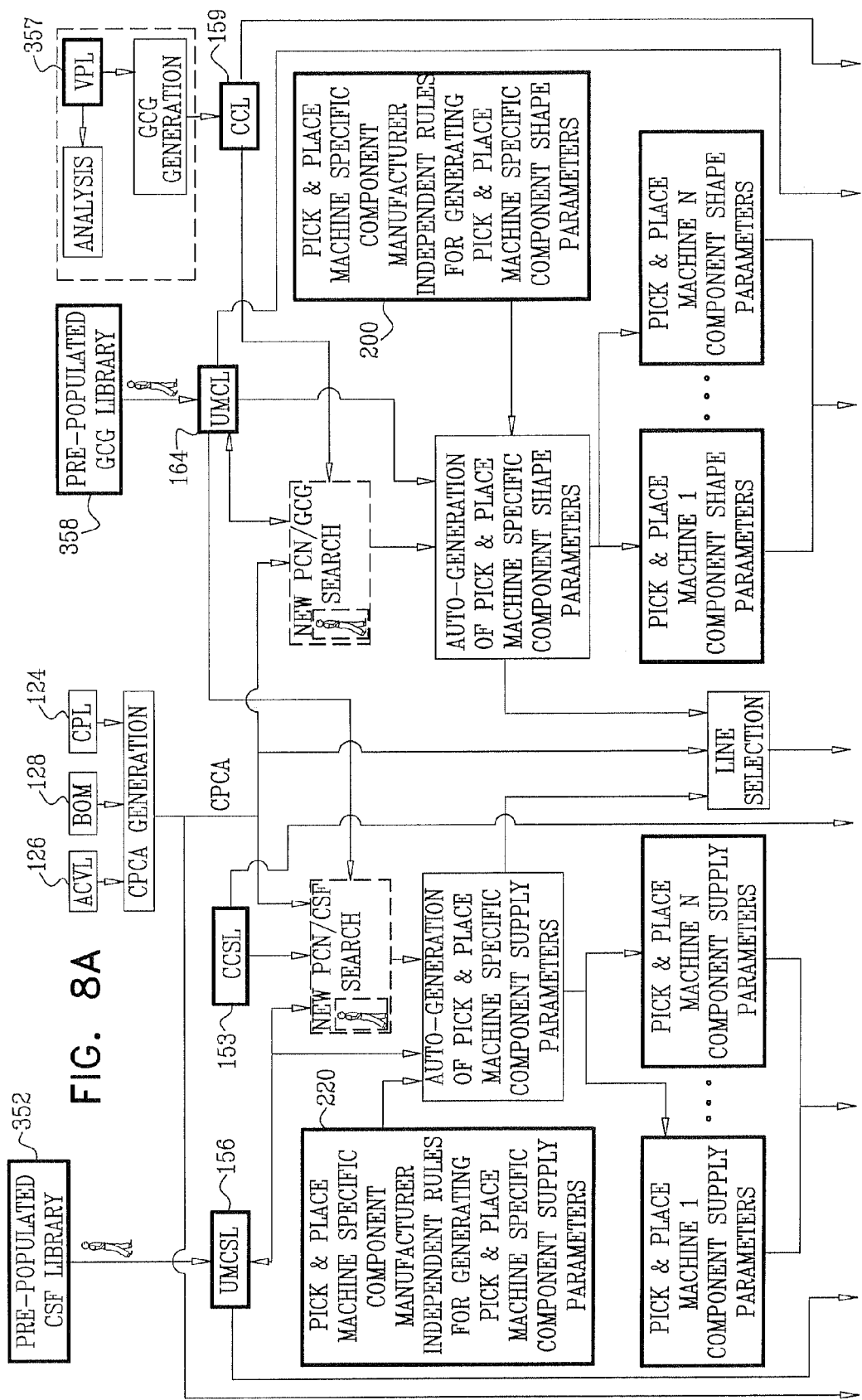
FIGS. 8A and 8B together form a simplified flowchart illustrating the operation of the system and functionality for automated manufacture of electronic circuits of FIGS. 1-7 in accordance with a preferred embodiment of the present invention.
Figure 8B:
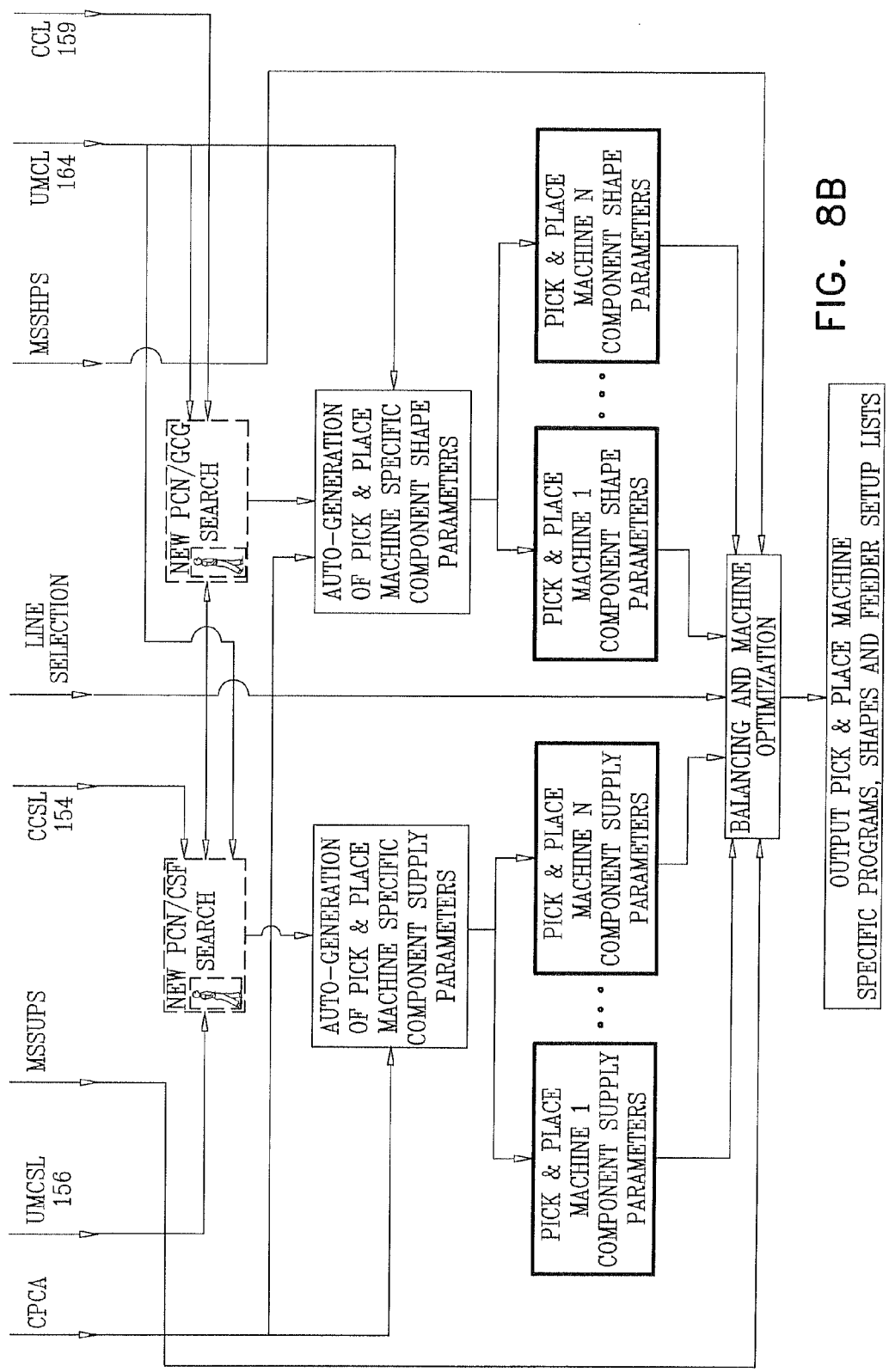

Reference is now made to FIGS. 8A and 8B, which together form a simplified flowchart illustrating the operation of the system and functionality for automated manufacture of electronic circuits of FIGS. 1-7 in accordance with a preferred embodiment of the present invention.

As indicated in FIGS. 8A and 8B, and as described generally hereinabove with reference to FIG. 1, one or more machine line programmers receive at machine line programming station 110 (FIG. 1), preferably via computer network 120 (FIG. 1) from one or more remote servers 122 (FIG. 1), PCA design data including CPL 124, ACVL 126 and BOM 128 data.

The machine line programmers process the received CPL 124, ACVL 126 and BOM 128 data in a conventional manner to generate CPCA data which employs PCN designations.

Thereafter, the machine line programmers, employing features of the present invention, may carry out a New PCN/CSF Search employing CCSL 153, UMCSL 156 and UMCL 164. The UMCSL 156 may be manually populated using information from a Pre-Populated CSF Library 352 and/or may be populated on the fly by results of New PCN/CSF Search.

Figure 9:
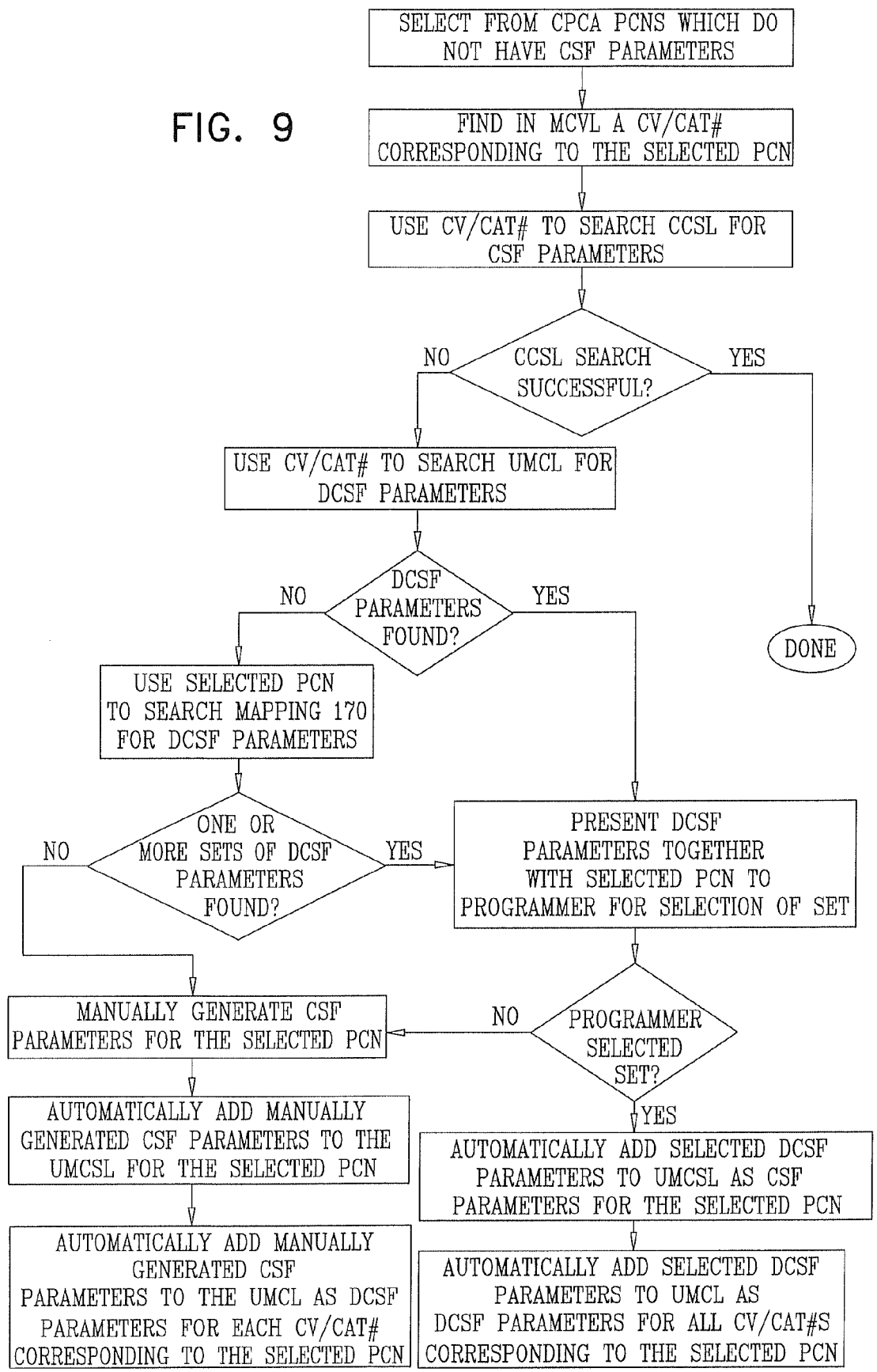
FIG. 9 is a simplified flowchart illustrating details of New PCN/CSF Search functionality, forming part of the functionality shown in the flowchart of FIGS. 8A and 8B.

Details of the New PCN/CSF Search are now described with reference to FIG. 9. As seen in FIG. 9, the PCNs in the CPCA data which do not have CSF parameters are selected. For each such selected PCN, a corresponding CV/CAT# is found in the MCVL 152 (FIG. 3). The CV/CAT# is then used to search the CCSL 153 (FIG. 3) for CSF parameters. If the CCSL search is not successful, the CV/CAT# is then used to search the UMCL 164 (FIG. 3) for default CSF (DCSF) parameters.

If DCSF parameters are not found in the UMCL 164 for the CV/CAT#, for each such selected PCN, PCN to GCG parameter mapping 170 (FIG. 3) is employed to find DCSF parameters for that PCN.

If DCSF parameters for a selected PCN are not found in the UMCL 164 or by employing PCN to GCG parameter mapping 170, CSF parameters are manually generated by the machine line programmer for that PCN. The manually generated CSF parameters are then preferably automatically added to the UMCSL 156 for the selected PCN. Preferably, the manually generated CSF parameters are also preferably automatically added to the UMCL 164 as DCSF parameters for CV/CAT#s corresponding to the selected PCN.

If one or more sets of DCSF parameters for a selected PCN are found in the UMCL 164 or by employing PCN to GCG parameter mapping 170, those sets of DCSF parameters, together with the corresponding selected PCN, are presented to the machine line programmer for selection of an appropriate set. If none of the sets of DCSF parameters for a selected PCN, found in the UMCL 164 or by employing PCN to GCG parameter mapping 170, are appropriate, CSF parameters are manually generated by the machine line programmer for that PCN.

If a set of DCSF parameters for a selected PCN, found in the UMCL 164 or by employing PCN to GCG parameter mapping 170, is appropriate, those DCSF parameters are then preferably automatically added as CSF parameters to the UMCSL 156 for the selected PCN. Preferably, the DCSF parameters are also preferably automatically added to the UMCL 164 as DCSF parameters for CV/CAT#s corresponding to the selected PCN.

At this stage, the machine line programmer has CSF parameters for each PCN in the CPCA data. Returning now to FIGS. 8A and 8B, it is seen that the software of the present invention may be employed for auto-generation of pick & place machine-specific component supply parameters (MSSUPs). The auto-generation employs UMCSL 156 and mapping 220 to identify pick & place machine-specific, component manufacturer-independent rules for generating appropriate pick & place machine-specific supply parameters (MSSUPs).

Details of the auto-generation are now described with reference to FIG. 10, which is a simplified flowchart illustrating details of auto-generation of pick & place machine specific component supply parameters, and to FIGS. 11A, 11B, 11C and 11D, which are each a simplified diagrammatic illustration of the application of one type of pick & place machine-specific component manufacturer-independent rules for generating a corresponding type of pick & place machine-specific component supply parameters employed in accordance with a preferred embodiment of the present invention.

Figure 10:
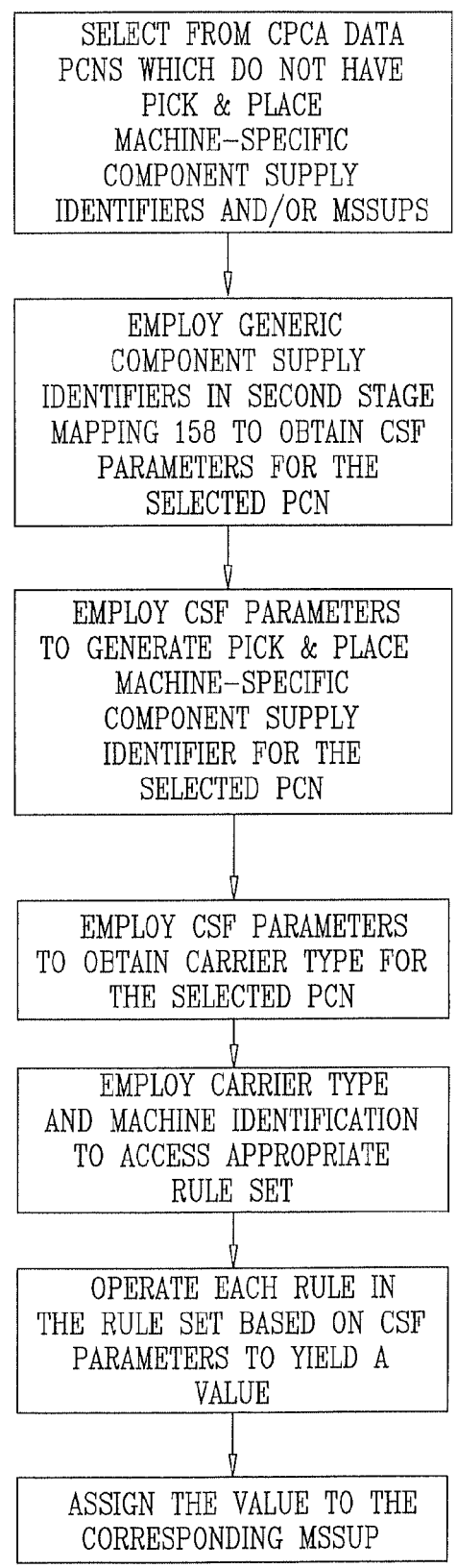
FIG. 10 is a simplified flowchart illustrating details of auto-generation of pick & place machine specific component supply parameters forming part of the functionality shown in the flowchart of FIGS. 8A and 8B.

As seen in FIG. 10, for each pick & place machine in the manufacturing facility 100 (FIG. 1), the PCNs in the CPCA data which do not have MSSUPs and/or pick & place machine-specific component supply identifiers are selected.

For each such selected PCN, CSF parameters are obtained by employing generic component supply identifiers in the second stage mapping 158. For each such selected PCN, the CSF parameters are employed to generate a corresponding pick & place machine-specific component supply identifier.

The CSF parameters are employed to obtain the corresponding carrier type for each selected PCN. The carrier type and the identification of the specific pick & place machine for which MSSUPs are being generated are used by the software of the present invention to access an appropriate rule set, such as that appearing in FIG. 5A. Each rule in the rule set is operated based on at least one appropriate input variable forming part of the CSF parameters to yield a value which is assigned to the corresponding MSSUP.

FIGS. 11A-11D each illustrate the operation of an exemplary rule for a different respective carrier type, namely reel, tray, stick and bulk.

Figure 11A:
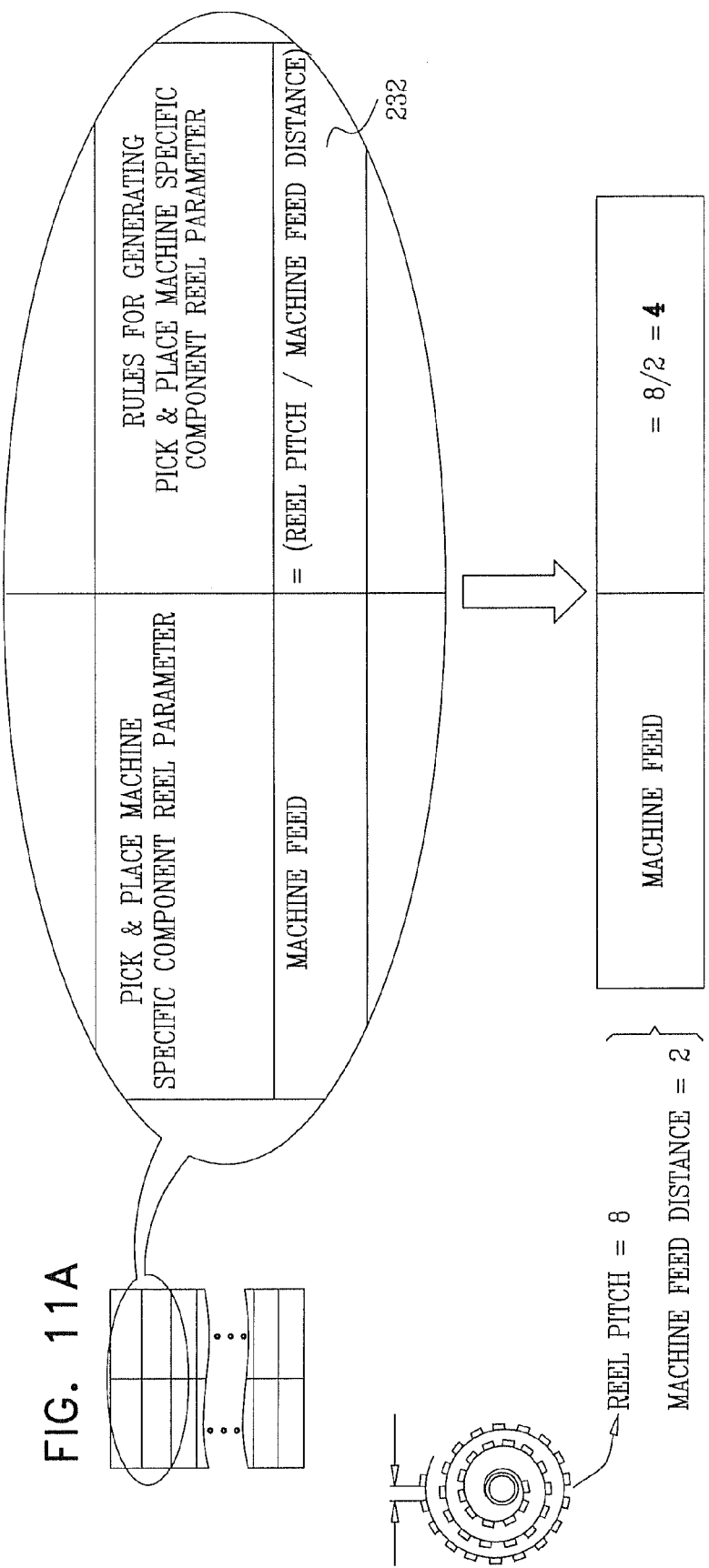

As seen in the example of FIG. 11A, the component is provided in a reel having a pitch of 8 cm, and the machine feed distance for the specific pick & place machine is 2 cm. These parameters are employed in the rule of cell 232 to determine that the number of machine feeds required between use of components in the reel is equal to 8/2=4.

Turning now to FIG. 11B, it is seen that the component is provided in a tray having 8 components along its X dimension and 16 components along its Y dimension. These parameters are employed by a rule to convert the number of components along the tray X and Y dimensions to their binary equivalents, in this case 100 and 1000 components respectively. The binary numbers of components along the X and Y dimensions form a part of the MSSUPs.

Figure 11C:
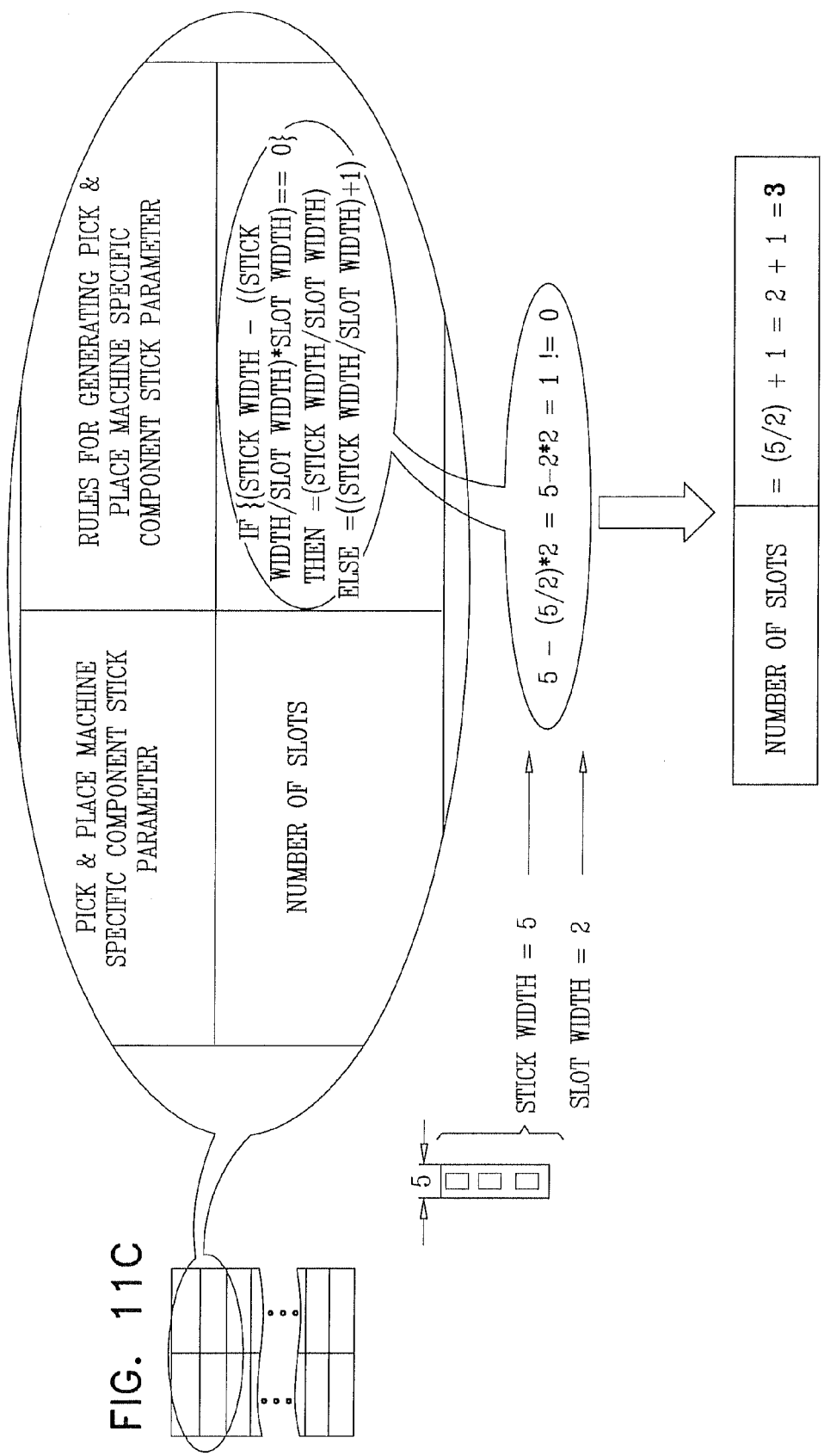

Reference is now made to FIG. 11C, which illustrates an example in which the component is provided in a stick having a width of 5 cm and is used in a machine having a slot width of 2 cm. These parameters are employed by a rule to determine the number of slots taken up by the stick. In the present example, the rule operated checks whether there is a remainder from the division of the stick width and the slot width. If such a remainder exists, the number of slots is determined to be the ratio of the stick width and the slot width, incremented by one and rounded to the nearest whole number. Otherwise, the number of slots is determined to be the ratio between the stick width and the slot width. In the example shown in FIG. 11C, ratio between the stick width and the slot width equals 2.5, and therefore the value assigned to the MSSUP related to the number of slots is 3.

Figure 11D:
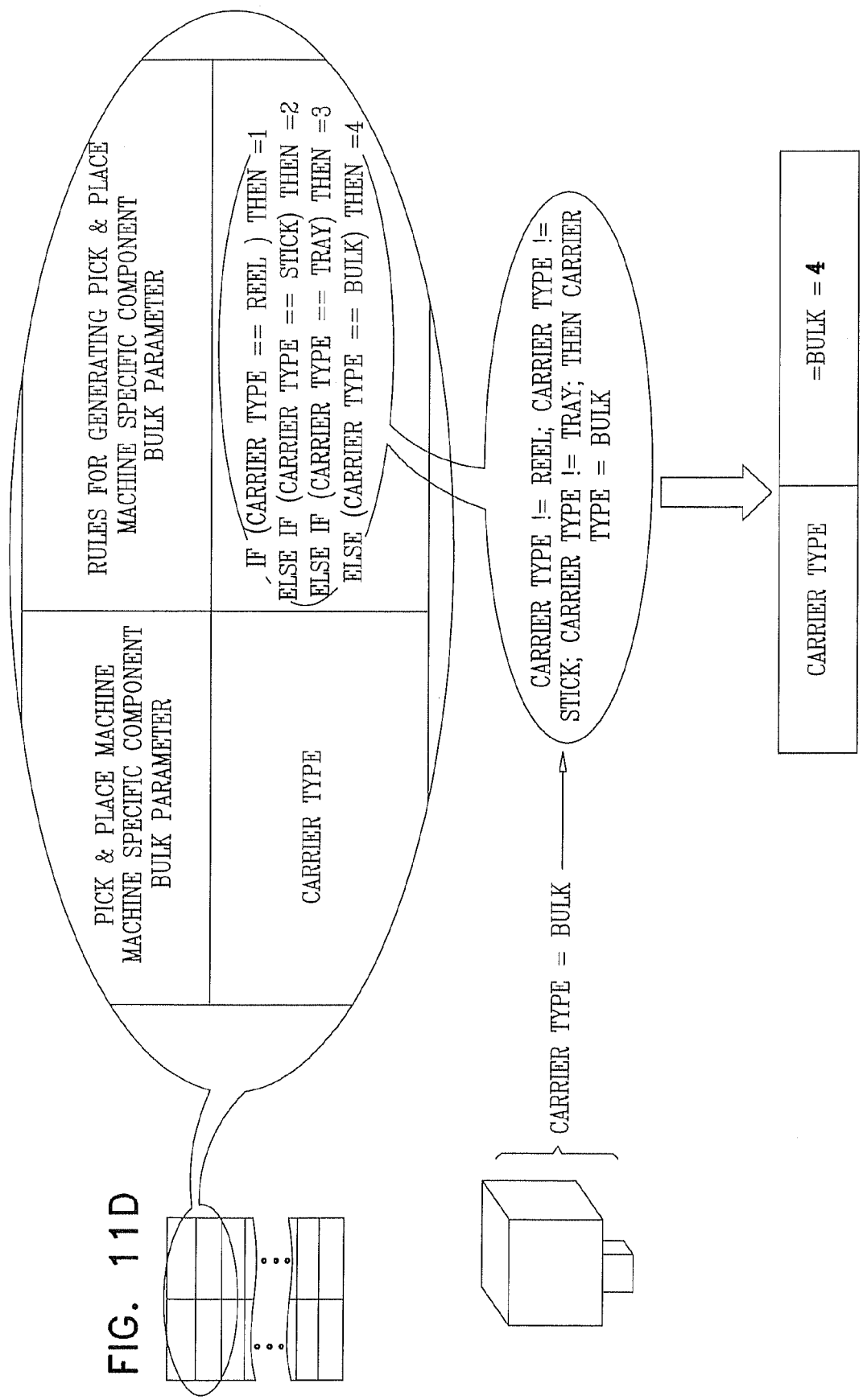

Turning now to FIG. 11D, it is seen that the component is provided in a bulk carrier type. This parameter is employed by a rule to determine the carrier type in pick & place machine specific language. In the present example, the rule checks the carrier type, and assigns an appropriate numeral to each carrier type. As seen in the present example, as the carrier type is bulk, the value assigned to the carrier type parameter by the rule is 4.

Returning now to FIGS. 8A and 8B, it is indicated that the machine line programmers, employing features of the present invention, may carry out a New PCN/GCG Search employing CCL 159 and UMCL 164. The CCL 159 is preferably generated from a commercially available component library 357, preferably the Valor Part Library (VPL) remote server connection, which is commercially available from Valor Computerized Systems Ltd., of Yavne, Israel under catalog designator T-5000-5443. The VPL typically includes a two-stage mapping, in which the first stage maps CV/CAT#s to VPL component packaging shape identifiers, and the second stage maps the VPL component shape identifiers to VPL component packaging shape parameters.

In accordance with a preferred embodiment of the present invention, the VPL may be employed by assembly analysis, preferably by employing assembly and test analysis software commercially available from Valor Computerized Systems Ltd., of Yavne, Israel under catalog designator T-5000-0103. The UMCL 164 may be manually populated using information from a Pre-Populated GCG Library 358 and/or may be populated on the fly by results of New PCN/GCG Search.

Details of generation of the GCG parameters included in the CCL from the VPL 357 are now described with reference to FIG. 12.

Figure 12:
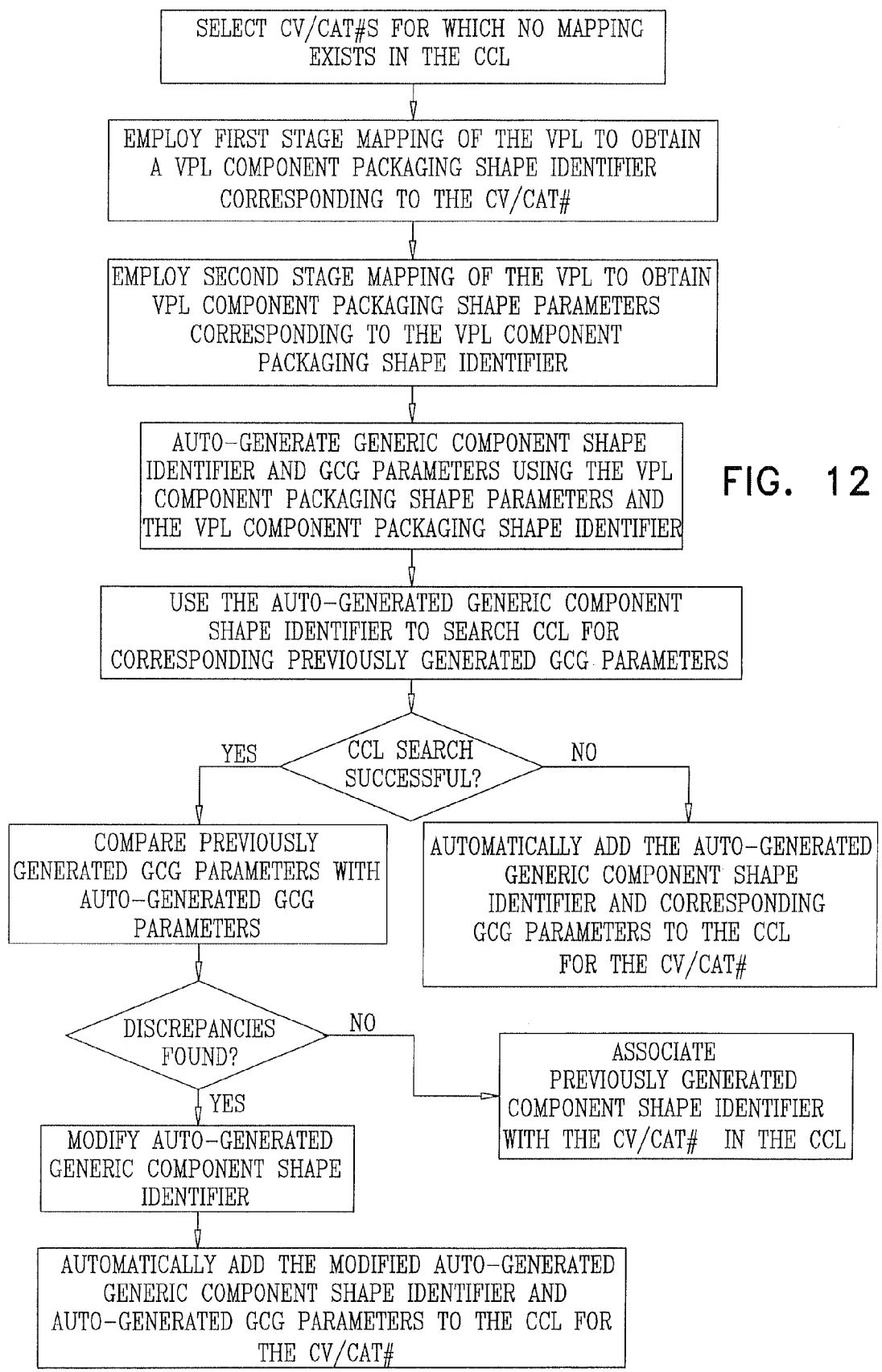
FIG. 12 is a simplified flowchart illustrating details of GCG generation functionality, forming part of the functionality shown in the flowchart of FIGS. 8A and 8B.

As seen in FIG. 12, CV/CAT#s for which no mapping exists in the CCL are selected. For each such CV/CAT#, the software of the present invention preferably employs the first stage mapping of the VPL to obtain a VPL component packaging shape identifier corresponding to the CV/CAT#. The VPL component packaging shape identifier is then employed in the second stage mapping of the VPL to obtain corresponding VPL component packaging shape parameters.

The software of the present invention preferably uses the VPL component packaging shape identifier and parameters to auto-generate a corresponding generic component shape identifier and GCG parameters.

The auto-generated generic component shape identifier is then used to search the CCL 159 for corresponding previously generated GCG parameters. If the CCL search is unsuccessful, the auto-generated generic component shape identifier and corresponding GCG parameters are automatically added to the CCL 159 for the CV/CAT#.

If previously generated GCG parameters are found in the CCL 159, they are compared with the auto-generated GCG parameters. If discrepancies are found, the auto-generated component shape identifier is modified to indicate that it is an additional identifier for a similar component shape, and the modified component shape identifier and auto-generated GCG parameters are automatically added to the CCL 159 for the CV/CAT#.

If no discrepancies are found between the previously generated GCG parameters and the auto-generated GCG parameters, the previously generated component shape identifier is associated with the CV/CAT# in the CCL 159.

Figure 13A:
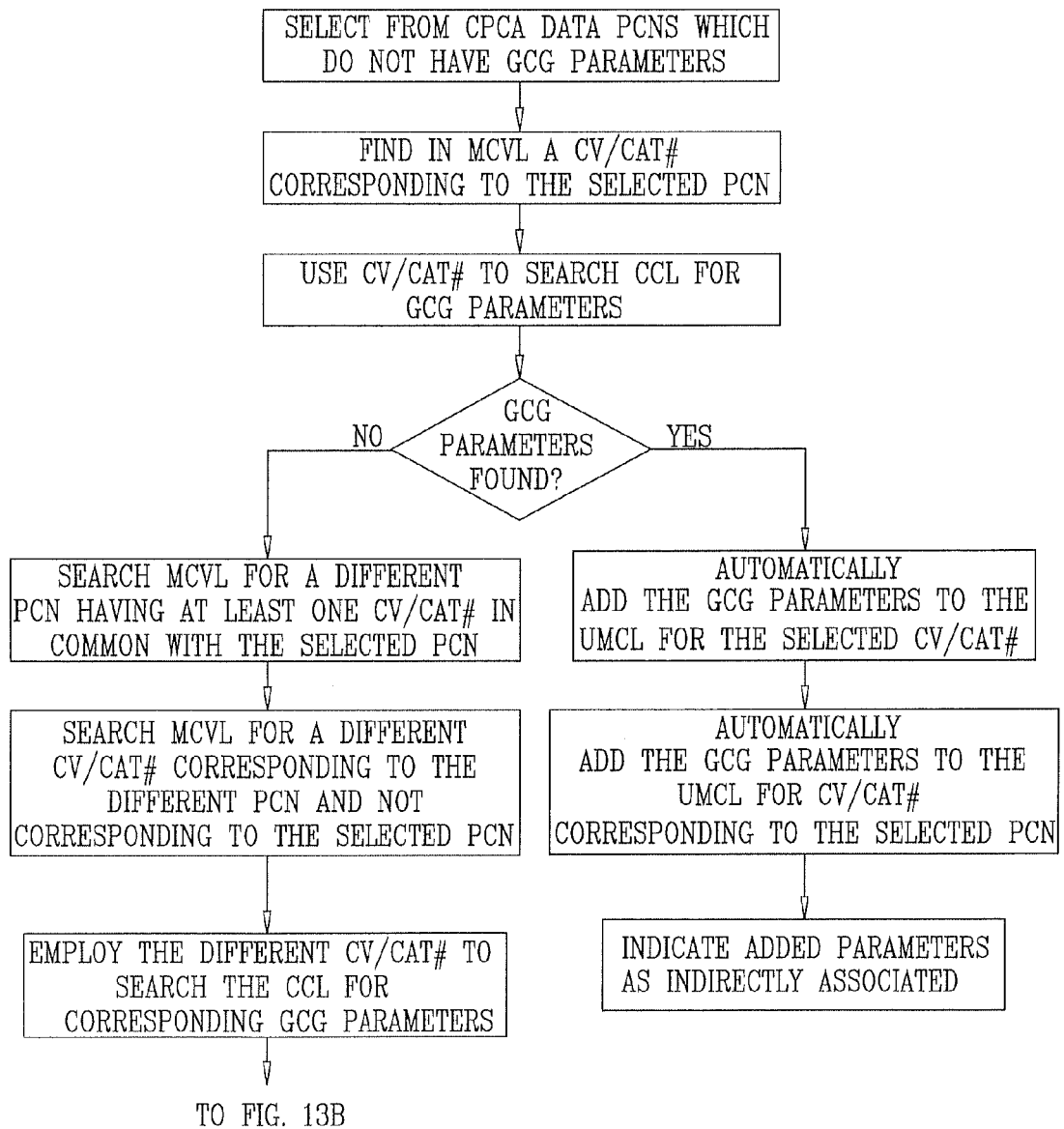

Details of the New PCN/GCG Search are now described with reference to FIGS. 13A and 13B. As seen in FIGS. 13A and 13B, the PCNs in the CPCA data which do not have GCG parameters are selected. For each such selected PCN, a corresponding CV/CAT# is found in the MCVL 152 (FIG. 3). The CV/CAT# is then used to search the CCL 159 (FIG. 3) for GCG parameters. If GCG parameters are found, they are automatically added to the UMCL 164 for that CV/CAT#. Additionally, the GCG parameters may be added to the UMCL 164 for other CV/CAT#s corresponding to the selected PCN, it being appreciated that the added GCG parameters are preferably indicated as being added by indirect association.

If the CCL search is not successful, a proximity search is conducted by:
    searching the MCVL 152 for a different PCN having at least one CV/CAT# in common with the selected PCN; and subsequently
    searching the MCVL 152 for a different CV/CAT# corresponding to that different PCN that does not correspond to the selected PCN; and subsequently employing the different CV/CAT# to search the CCL 159 for corresponding GCG parameters.

If the proximity search is successful, the GCG parameters are presented to the machine line programmer together with the selected PCN for approval. If approved, the GCG parameters are added to the UMCL 164 for CV/CAT#s corresponding to either of the selected PCN and the different PCN. The GCG parameters for CV/CAT#s corresponding to the selected PCN which are added to the UMCL 164 are labeled to indicate that they were obtained by means of a proximity search.

If the proximity search is unsuccessful or if the machine line programmer does not approve the GCG parameters presented to him, the machine line programmer manually generates GCG parameters for the selected CV/CAT#. The manually generated GCG parameters are automatically added to the UMCL 164 for that CV/CAT#. Additionally, the GCG parameters may be automatically added to the UMCL 164 for all other CV/CAT#s corresponding to the selected PCN.

Returning again to FIGS. 8A and 8B, it is noted that at this stage, the programmer has GCG parameters for each PCN in the CPCA data. The software of the present invention may be employed for auto-generation of pick & place machine-specific component shape parameters (MSSHPs). The auto-generation employs UMCL 164 and mapping 200 to identify pick & place machine-specific, component manufacturer-independent rules for generating appropriate pick & place machine-specific shape parameters (MSSHPs).

Details of the auto-generation are now described with reference to FIG. 14, which is a simplified flowchart illustrating details of auto-generation of pick & place machine specific component shape parameters, and to FIGS. 15A, 15B, 15C, 15D and 15E, which are each a simplified diagrammatic illustration of the application of one type of pick & place machine-specific component manufacturer-independent rules for generating a corresponding type of pick & place machine-specific component shape parameters employed in accordance with a preferred embodiment of the present invention.

Figure 14:
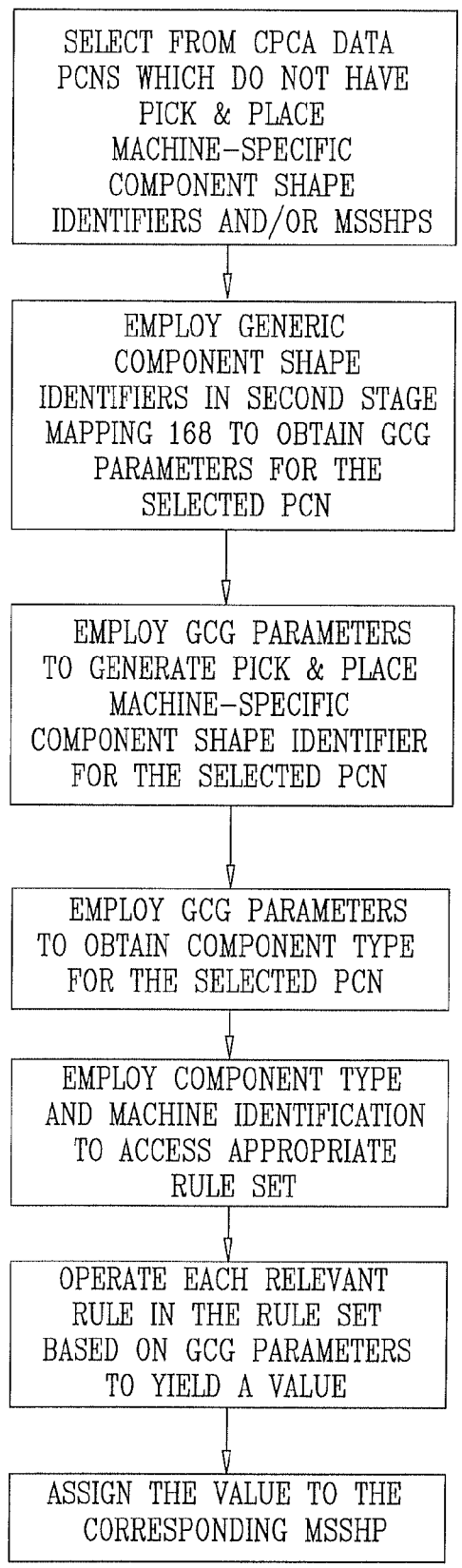
FIG. 14 is a simplified flowchart illustrating details of auto-generation of pick & place machine specific component shape parameters forming part of the functionality shown in the flowchart of FIGS. 8A and 8B.

As seen in FIG. 14, for each pick & place machine in the manufacturing facility 100 (FIG. 1), the PCNs in the CPCA data which do not have MSSHPs and/or pick & place machine-specific component shape identifiers are selected.

For each such selected PCN, GCG parameters are obtained by employing the generic component shape identifiers in the second stage mapping 168. For each such selected PCN, the GCG parameters are employed to generate a corresponding pick & place machine-specific component shape identifier.

The GCG parameters are employed to obtain the corresponding component type for each selected PCN. The component type and the identification of the specific pick & place machine for which MSSHPs are being generated are used by the software of the present invention to access an appropriate rule set, such as that appearing in FIG. 5B. Each relevant rule in the rule set is operated based on at least one appropriate input variable forming part of the GCG parameters to yield a value which is assigned to the corresponding MSSHP.

FIGS. 15A-15E each illustrate the operation of an exemplary rule for a different respective rule type, namely:

Rules 202 for generating component geometric parameters;

Rules 204 for generating pick & place machine-specific component handling parameters;

Rules 206 for generating pick & place machine-specific component imaging parameters;

Rules 208 for generating pick & place machine-specific component recognition tolerances; and Rules 210 for generating pick & place machine-specific procedures.

Figure 15A:
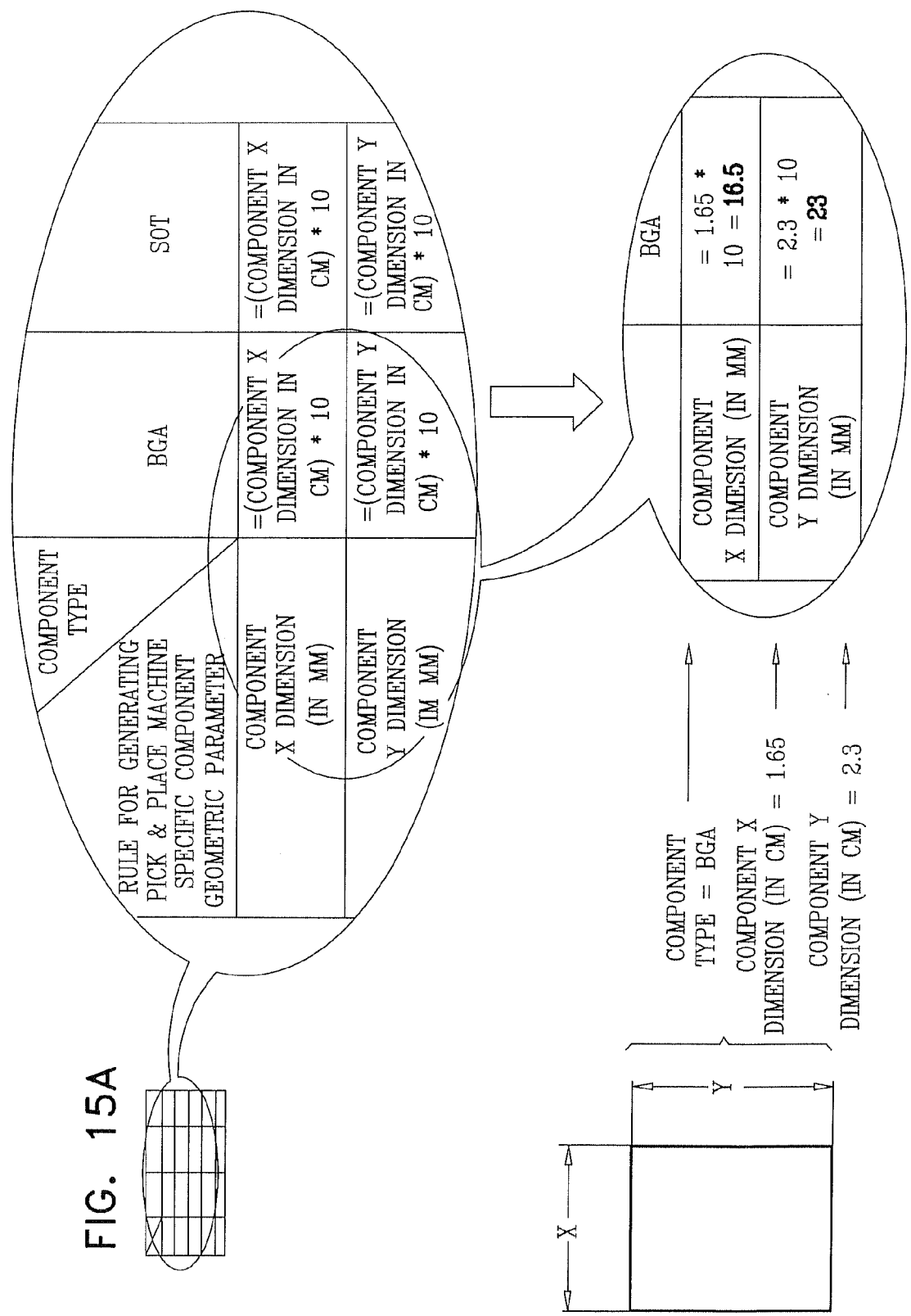
FIGS. 15A, 15B, 15C, 15D and 15E are each a simplified diagrammatic illustration of the application of one type of pick & place machine-specific component manufacturer-independent rules for generating a corresponding type of pick & place machine-specific component shape parameters employed in accordance with a preferred embodiment of the present invention.

As seen in the example of FIG. 15A, the component is a BGA component and has an X dimension of 1.65 cm and a Y dimension of 2.3 cm. These parameters are employed in rules which translate the dimensions into pick & place machine specific units, in the present example being millimeters. Thus, the MSSHP related to the X dimension of the component is assigned the value 1.65*10=16.5 and the MSSHP related to the Y dimension of the component is assigned the value 2.3*10=23.

Figure 15B:
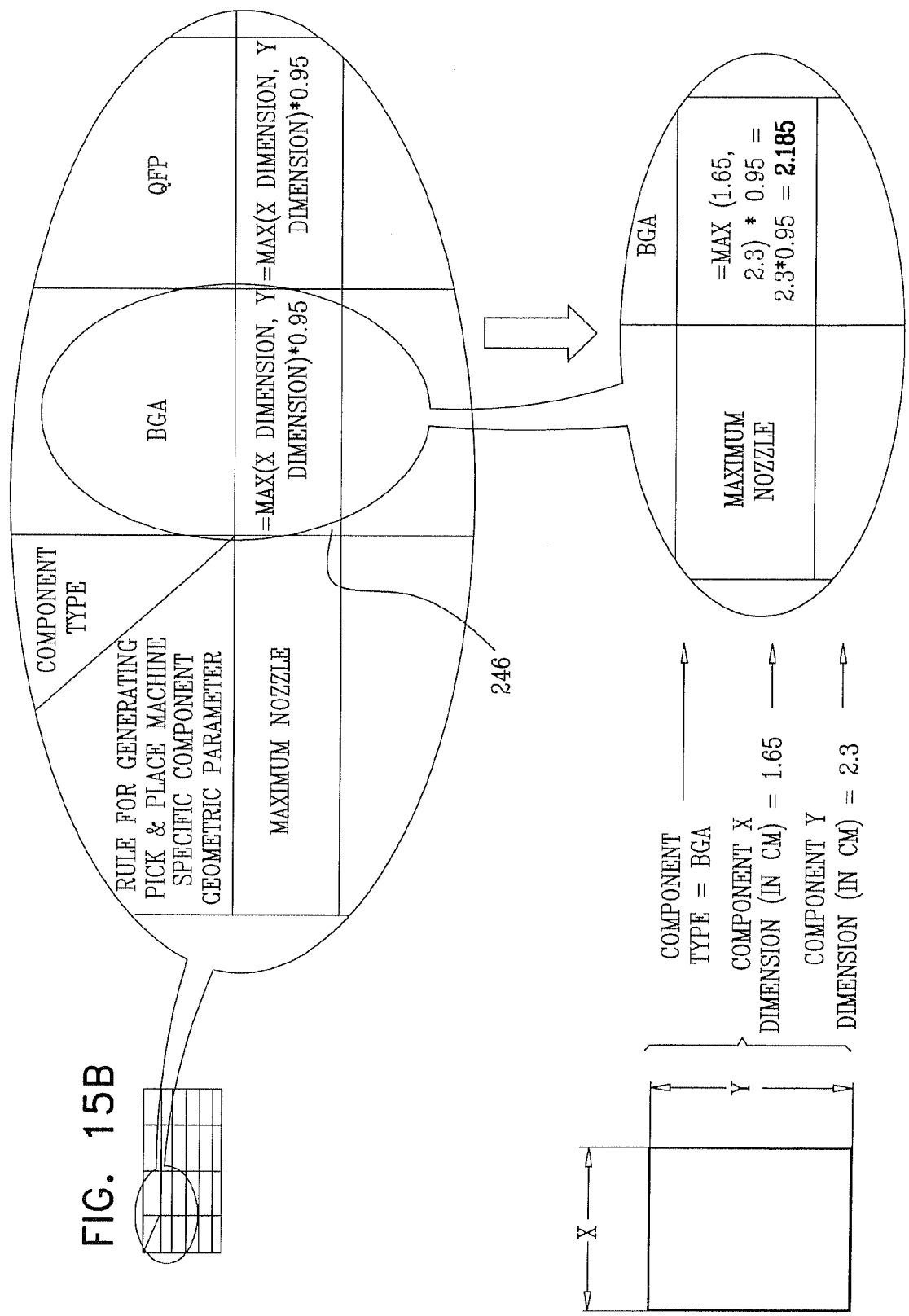

Turning now to FIG. 15B, it is seen that the component is a BGA component and has an X dimension of 1.65 cm and a Y dimension of 2.3 cm. These parameters are employed in the rule of cell 246 to calculate the maximum nozzle parameter for the component. The rule is operated by finding the maximum of the component's X dimension and the component's Y dimension, here 2.3 cm, and multiplying it by 0.95. Thus, the value assigned to the MSSHP related to the maximum nozzle is 2.185.

Figure 15C:
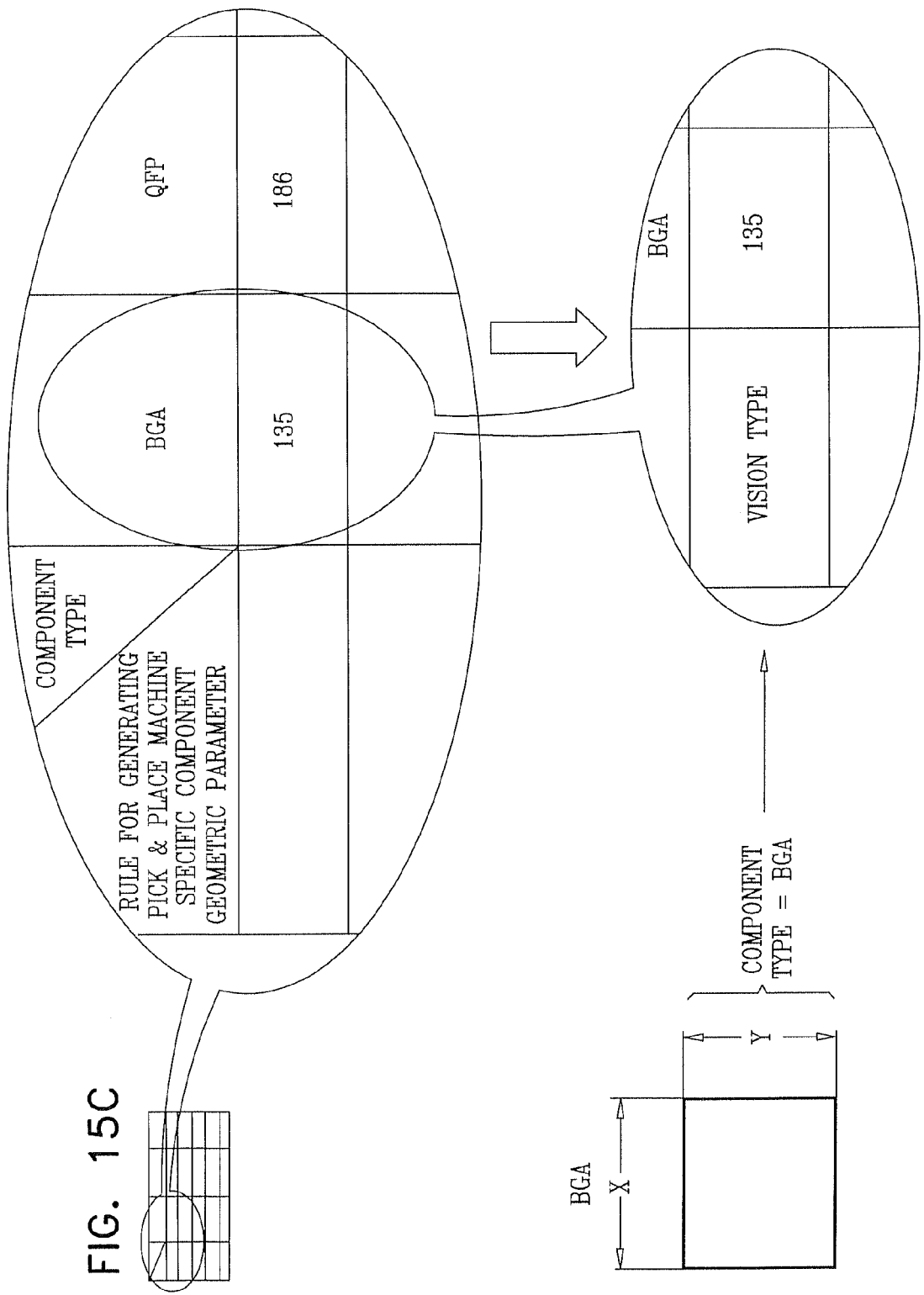

Reference is now made to FIG. 15C, which illustrates an example in which the component is a BGA component. This parameter is employed by a rule to determine the vision type to be used when placing the component. The relevant rule, related to BGA, assigns vision type 135 to the MSSHP related to vision type for all BGA type components.

Figure 15D:
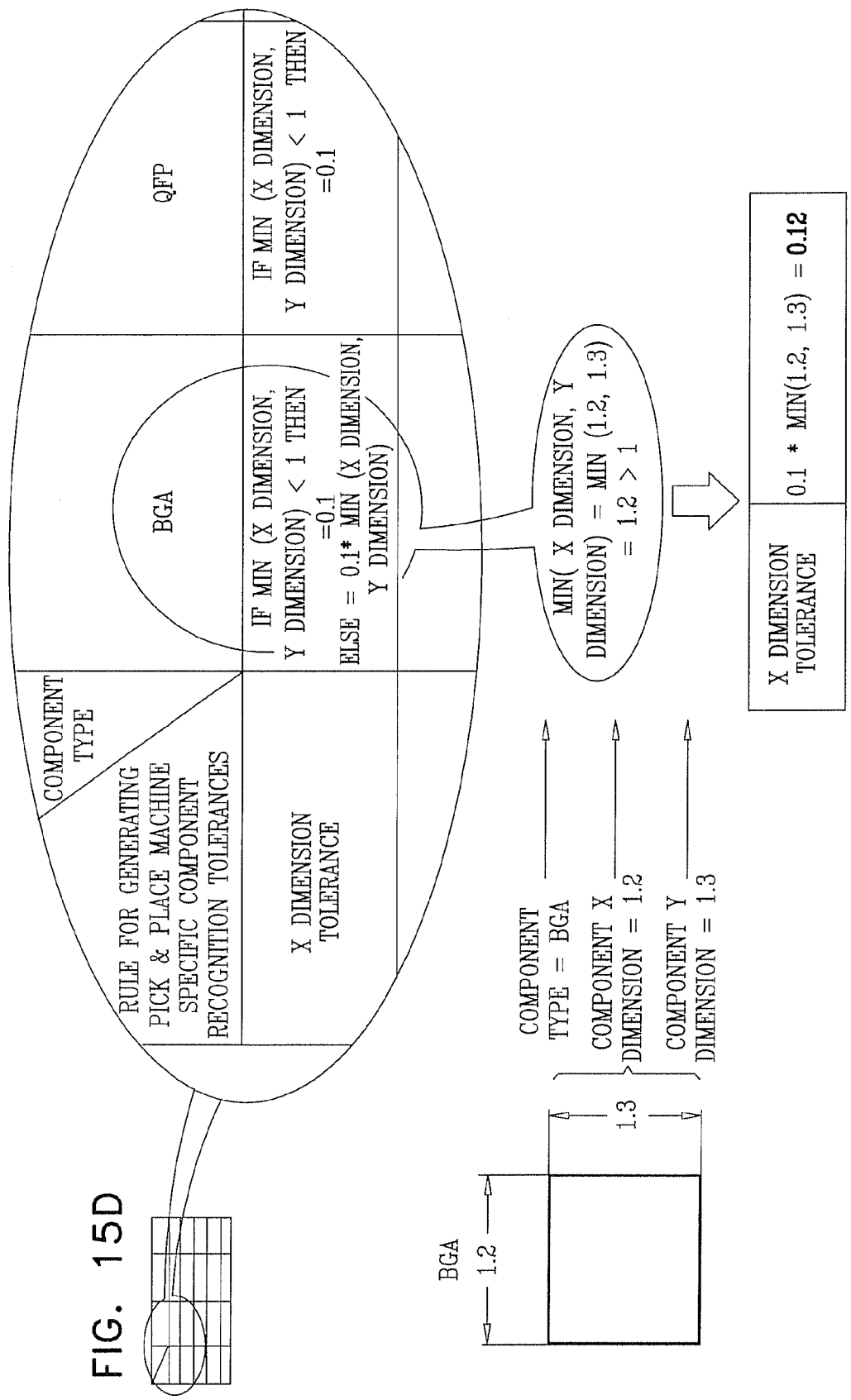

Turning now to FIG. 15D, it is seen that the component is a BGA component and has an X dimension of 1.2 cm and a Y dimension of 1.3 cm. These parameters are employed by a rule to determine the X dimension tolerance of the machine. The rule is operated by finding the minimum of the component's X dimension and the component's Y dimension, and then checking if this value is less than 1. If the value is less than 1, the X dimension tolerance is assigned to be 0.1. Otherwise, the X dimension tolerance is assigned to be 0.1 multiplied by the minimum of the X and Y dimensions of the component. In the present example, the minimum of the X and Y dimensions of the component is 1.2, which is greater than 1, and therefore the rule assigns to the MSSHP related to X dimension tolerance the value 0.1*1.2=0.12.

Figure 15E:
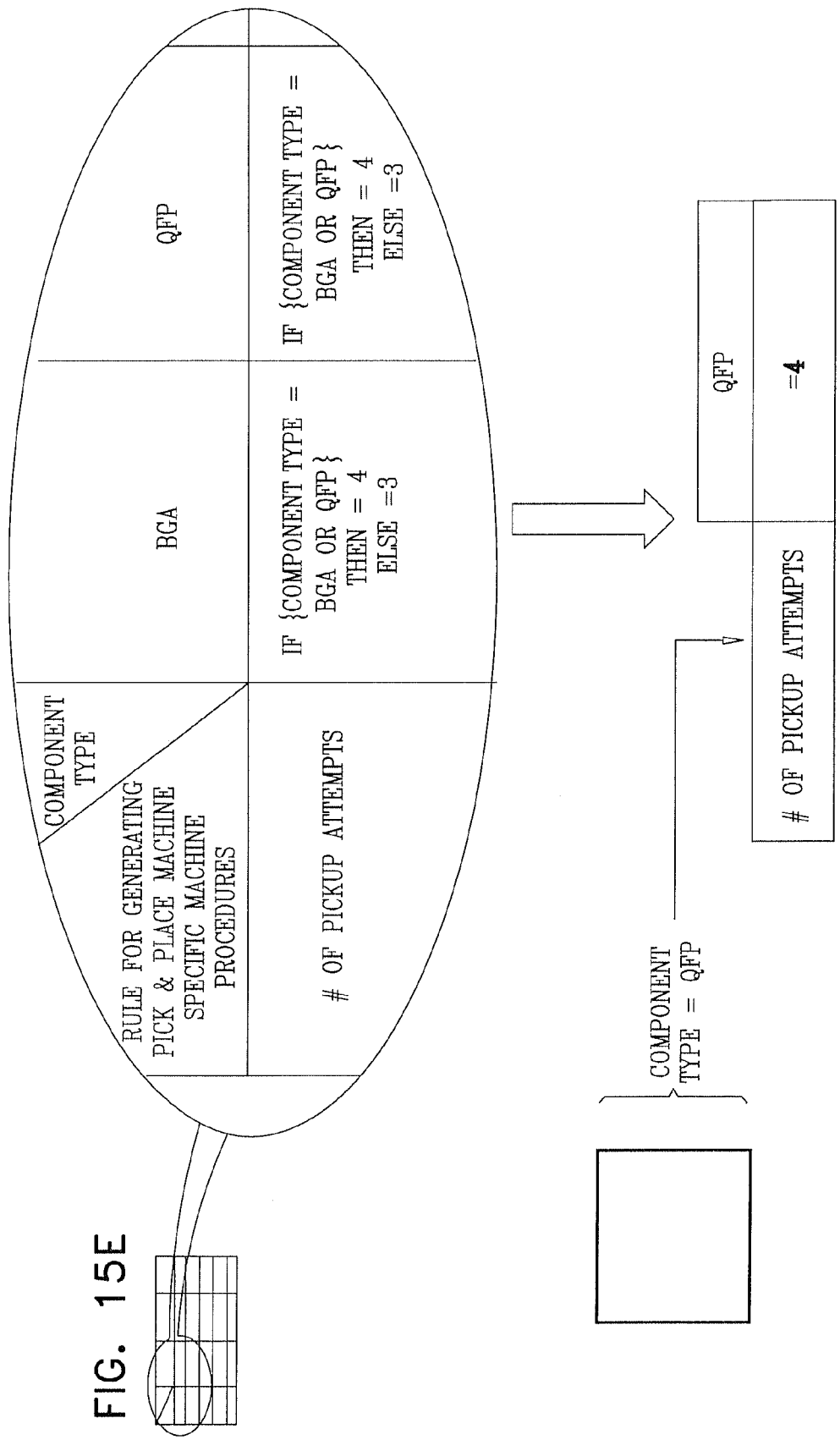

Turning now to FIG. 15E, it is seen that the component is a QFP component. This parameter is employed by a rule to determine the number of pick-up attempts the machine should make before rejecting the component. The relevant rule assigns the value 4 to this parameter if the component is a BGA or QFP type component, and otherwise assigns the value 3 to this parameter. Accordingly, the value assigned to the MSSHP related to the number of pick-up attempts is assigned to be 4.

Returning once again to FIGS. 8A and 8B, it is seen that line selection is carried out using the software of the present invention by employing the CPCA data and preferably also employing the MSSUPs and the MSSHPs.

In a case where the New PCN/CSF search and/or the New PCN/GCG search were not already carried out, similar searches must be carried out at this stage.

Figure 16:
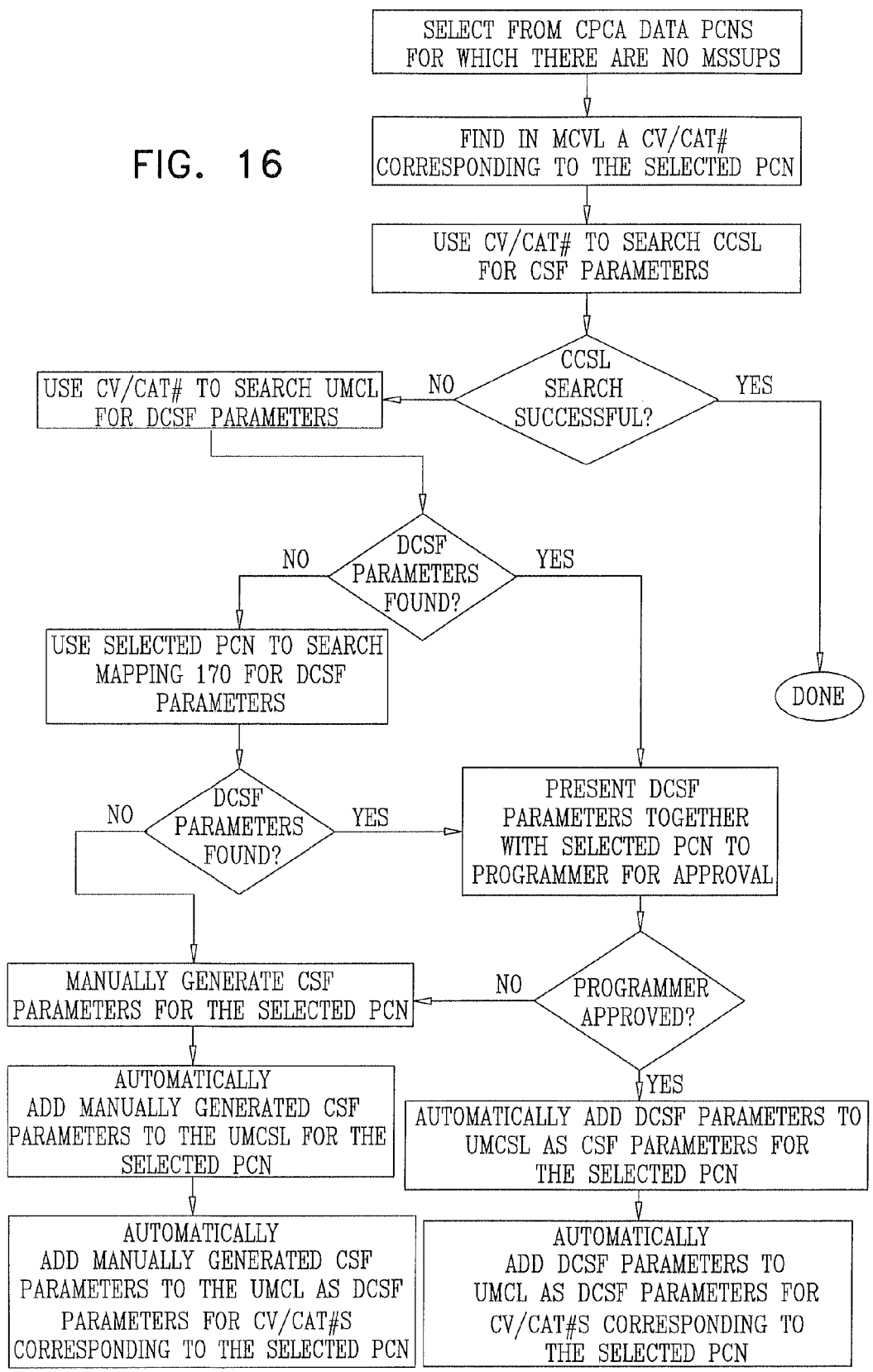
FIG. 16 is a simplified flowchart illustrating details of alternative New PCN/CSF Search functionality, forming part of the functionality shown in the flowchart of FIGS. 8A and 8B.
Figure 17A:
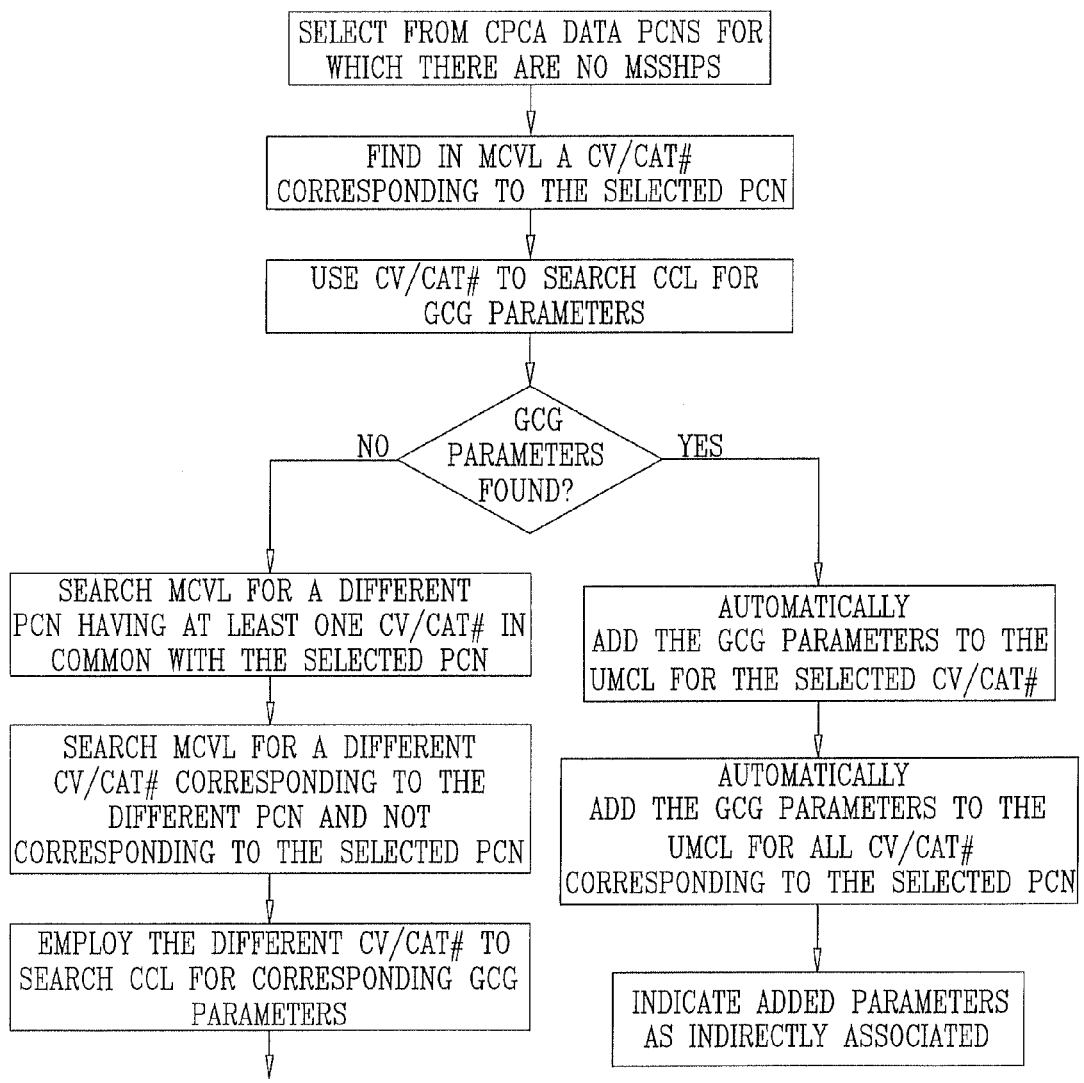
FIGS. 17A and 17B together form a simplified flowchart illustrating details of alternative New PCN/GCG Search functionality, forming part of the functionality shown in the flowchart of FIGS. 8A and 8B.
Figure 17B:
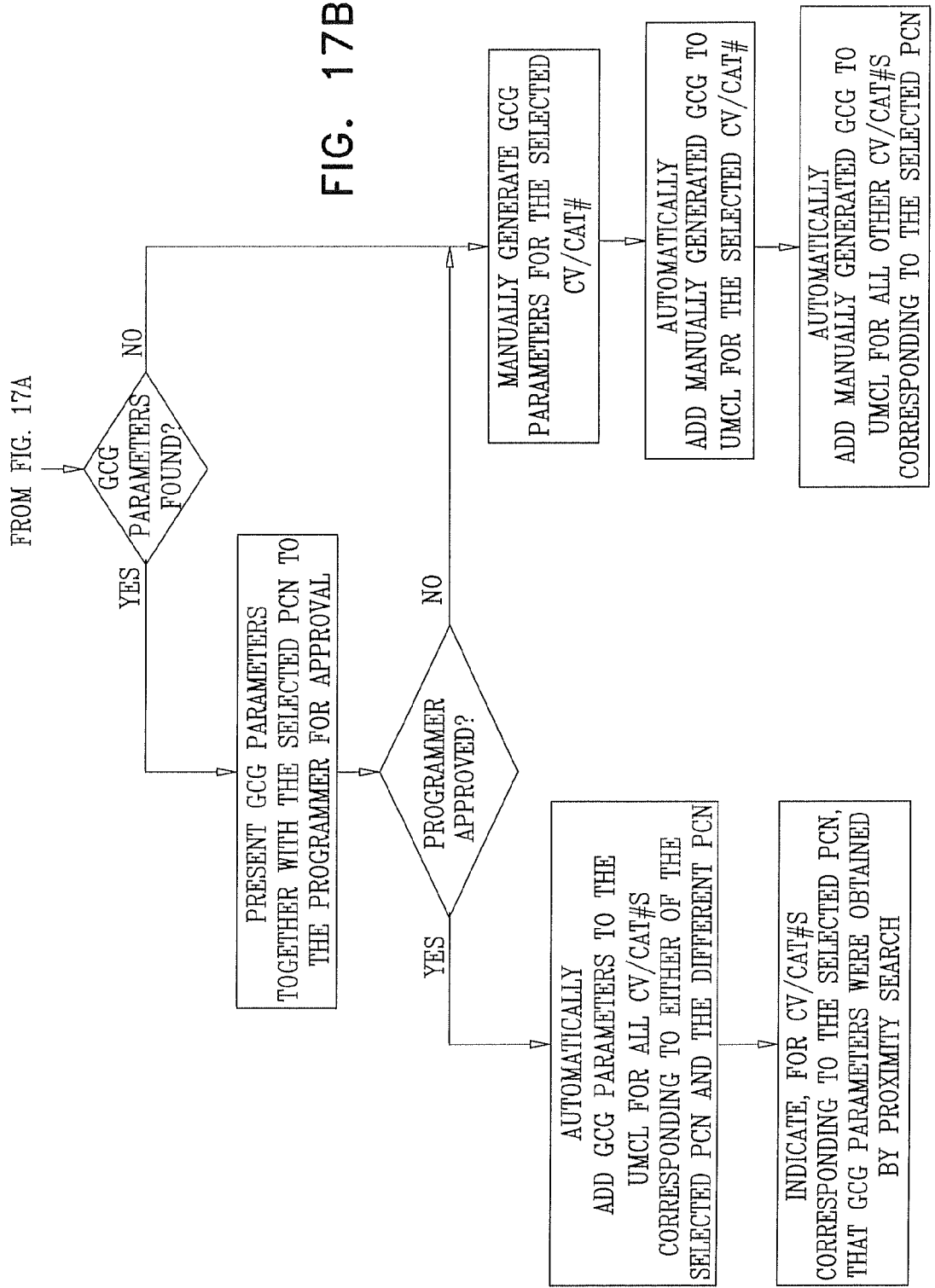

Reference is now made to FIG. 16, which is a simplified flowchart illustrating details of alternative New PCN/CSF Search functionality, forming part of the functionality shown in the flowchart of FIGS. 8A and 8B, and to FIGS. 17A and 17B, which together form a simplified flowchart illustrating details of alternative New PCN/GCG Search functionality, forming part of the functionality shown in the flowchart of FIGS. 8A and 8B.

FIGS. 16 and 17A & 17B correspond generally to FIGS. 9 and 13A & 13B described hereinabove, except for the specific differences noted hereinbelow:

As distinguished from FIGS. 9 and 13A and 13B, in which the PCNs in the CPCA data which do not have CSF parameters (FIG. 9) or GCG parameters (FIG. 13A) are selected, in FIGS. 16 and 17A and 17B, selection is made of PCNs in the CPCA data for which there are no pick & place machine-specific supply parameters (MSSUPs), in FIG. 16, or there are no pick & place machine-specific shape parameters (MSSHPs), in FIG. 17A, for the specific pick & place machine to which the PCNs could be assigned during line balancing.

Following the searches of FIGS. 16 and 17A and 17B, auto-generation is performed as described hereinabove with reference to FIGS. 10, 11A-11D, 14 and 15A-15E.

At this stage, the machine line programmer, using conventional line balancing software which is commercially available, inter alia, from Valor Computerized Systems Ltd. of Yavne, Israel under catalog designator T-5000-5215 and machine optimization software which is commercially available, inter alia, from Valor Computerized Systems Ltd. of Yavne, Israel, inter alia under catalog designators T-5000-5570 and T-5000-5549, carries out line balancing and pick & place machine optimization. This functionality employs the CPCA data as well as the MSSHPs and MSSUPs generated in accordance with the present invention.

The line balancing and machine optimization software provides operating instructions in computer-readable language to the pick & place machines of the selected line, such as pick & place machines 102, 104 and 106 (FIG. 1), and operating instructions in human-readable form to one or more pick & place machine operators who configure the pick & place machines in the selected line and load components onto the machines.

Figure 18:
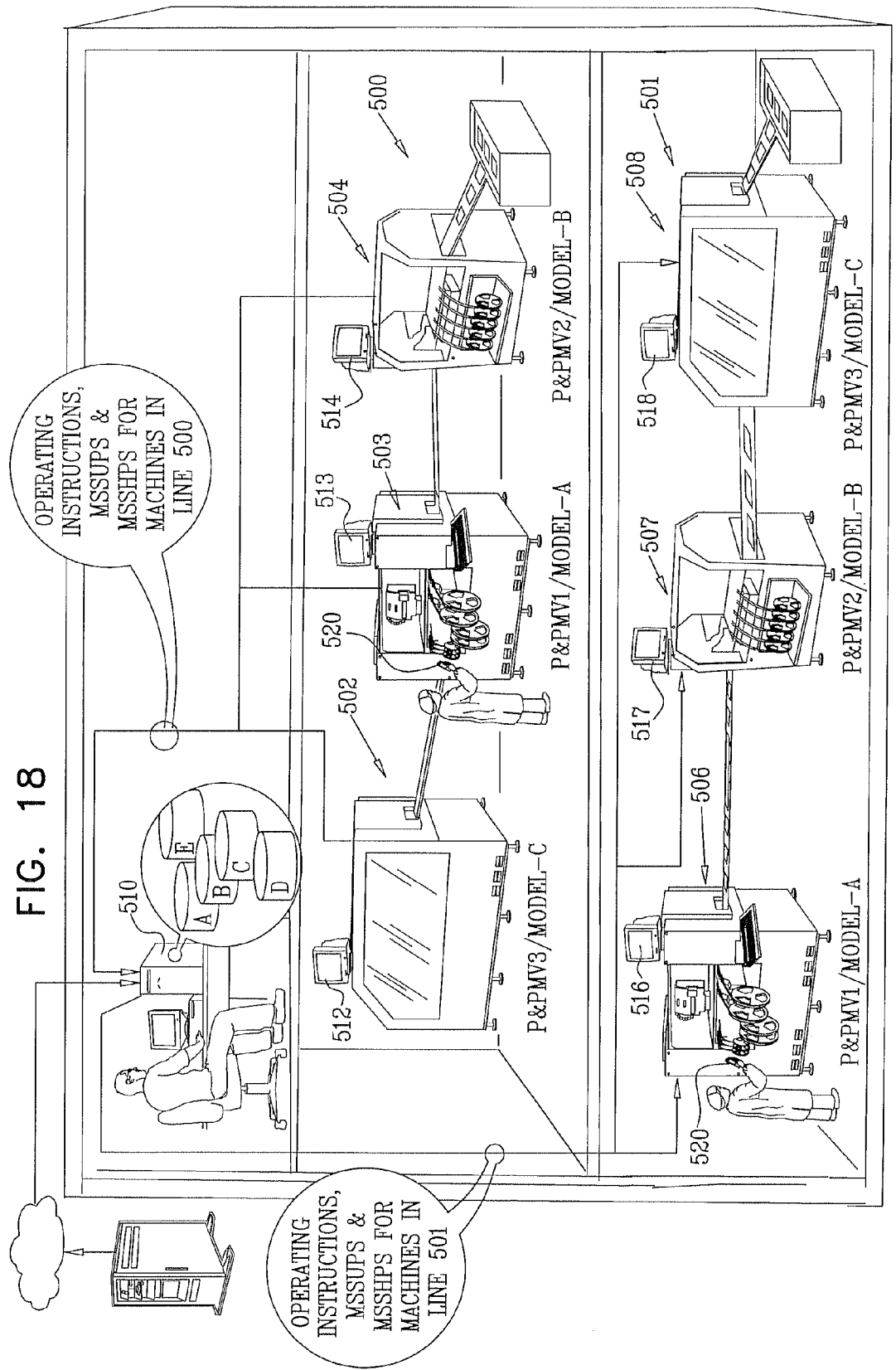
FIG. 18 is a simplified illustration of a system and functionality for automated manufacture of electronic circuits in accordance with another preferred embodiment of the present invention including functionality for transferring production of an electronic circuit from one manufacturing line to another manufacturing line.

Reference is now made to FIG. 18, which is a simplified illustration of a system and functionality for automated manufacture of electronic circuits in accordance with another preferred embodiment of the present invention, including functionality for transferring production of an electronic circuit from one manufacturing line to another manufacturing line.

A typical context in which the present invention is used is an automated electronic circuit manufacture facility which includes plural automated electronic circuit manufacturing lines, two of which are shown in FIG. 18 and identified generally by reference numerals 500 and 501. Each electronic circuit manufacturing line typically comprises a plurality of pick & place machines which may or may not originate from the same equipment vendor. Typically, each line comprises between one and ten pick & place machines. In FIG. 18, three such machines are illustrated in line 500 and are respectively designated by reference numerals 502, 503 and 504 and three such machines are illustrated in line 501 and are respectively designated by reference numerals 506, 507 and 508. In the illustrated example of FIG. 18, pick & place machines 502, 503, 504, 506, 507 and 508 are supplied by various different equipment vendors.

One or more machine line programmers, operating a machine line programming station 510, are responsible, inter alia, for providing operating instructions in computer-readable language to the pick & place machines of one or more lines such as lines 500 and 501, such as pick & place machines 502, 503, 504, 506, 507 and 508. The machine line programmer is also responsible for providing operating instructions in human-readable form to one or more pick & place machine operators who configure the pick & place machines and load components onto the machines. These human-readable instructions may be provided to the operators via respective displays 512, 513, 514, 516, 517 and 518 on pick & place machines 502, 503, 504, 506, 507 and 508, or preferably via hand-held terminals 520 or alternatively in hard copy.

In accordance with a preferred embodiment of the present invention, the machine line programmer employs an embodiment of the present invention which is preferably embodied in software loaded onto one or more computers forming part of machine line programming station 510.

In the embodiment of FIG. 18, it is assumed that the machine line programmer has already provided MSSUPs and MSSHPs for the production of a given electronic circuit on one machine line, such as machine line 500. The machine line programmer may now wish to transfer production of the electronic circuit to another line, such as machine line 501.

Figure 19:
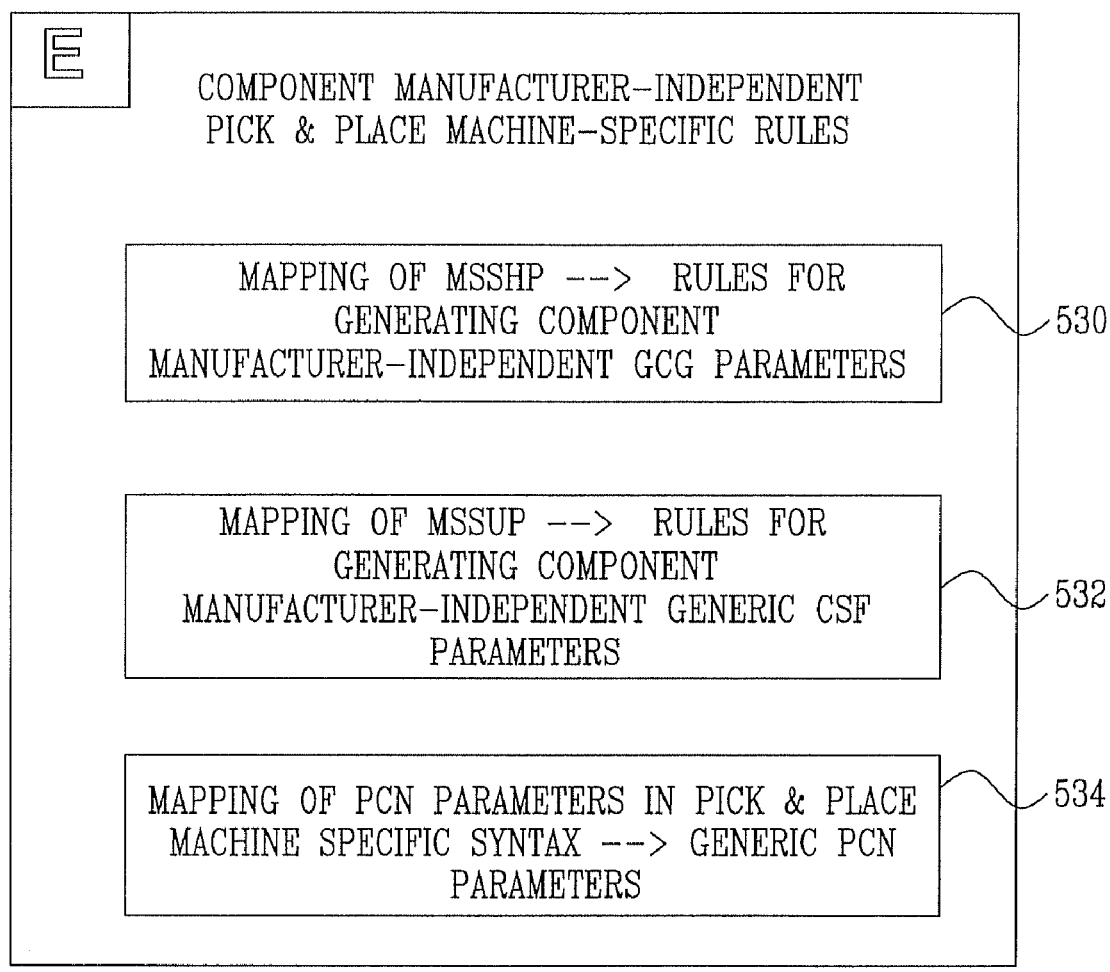
FIG. 19 is a simplified illustration of a component manufacturer-independent, pick & place machine-specific rules database employed in the system and functionality of FIG. 18.

The machine line programmer preferably employs a database E containing component manufacturer-independent, pick & place machine-specific rules, a preferred embodiment of which is illustrated in FIG. 19, as well as the operating instructions for machine line 500, along with the MSSUPs and MSSHPs of line 500, in order to generate operating instructions for machine line 501.

Reference is now made to FIG. 19, which illustrates the structure and content of database E. As seen in FIG. 19, database E includes a plurality of mappings, each shown enclosed in a rectangle, which are preferably employed to enhance the accessibility of the information stored in the database.

A first mapping, here designated by reference numeral 530, maps pick & place machine-specific component shape parameters (MSSHP) to rules for generating component manufacturer-independent generic component geometric (GCG) parameters.

A second mapping, here designated by reference numeral 532, maps pick & place machine-specific component supply parameters (MSSUP) to rules for generating component manufacturer-independent generic component supply form (CSF) parameters.

A third mapping, here designated by reference numeral 534, maps PCNs to PCN parameters.

Figure 20A:
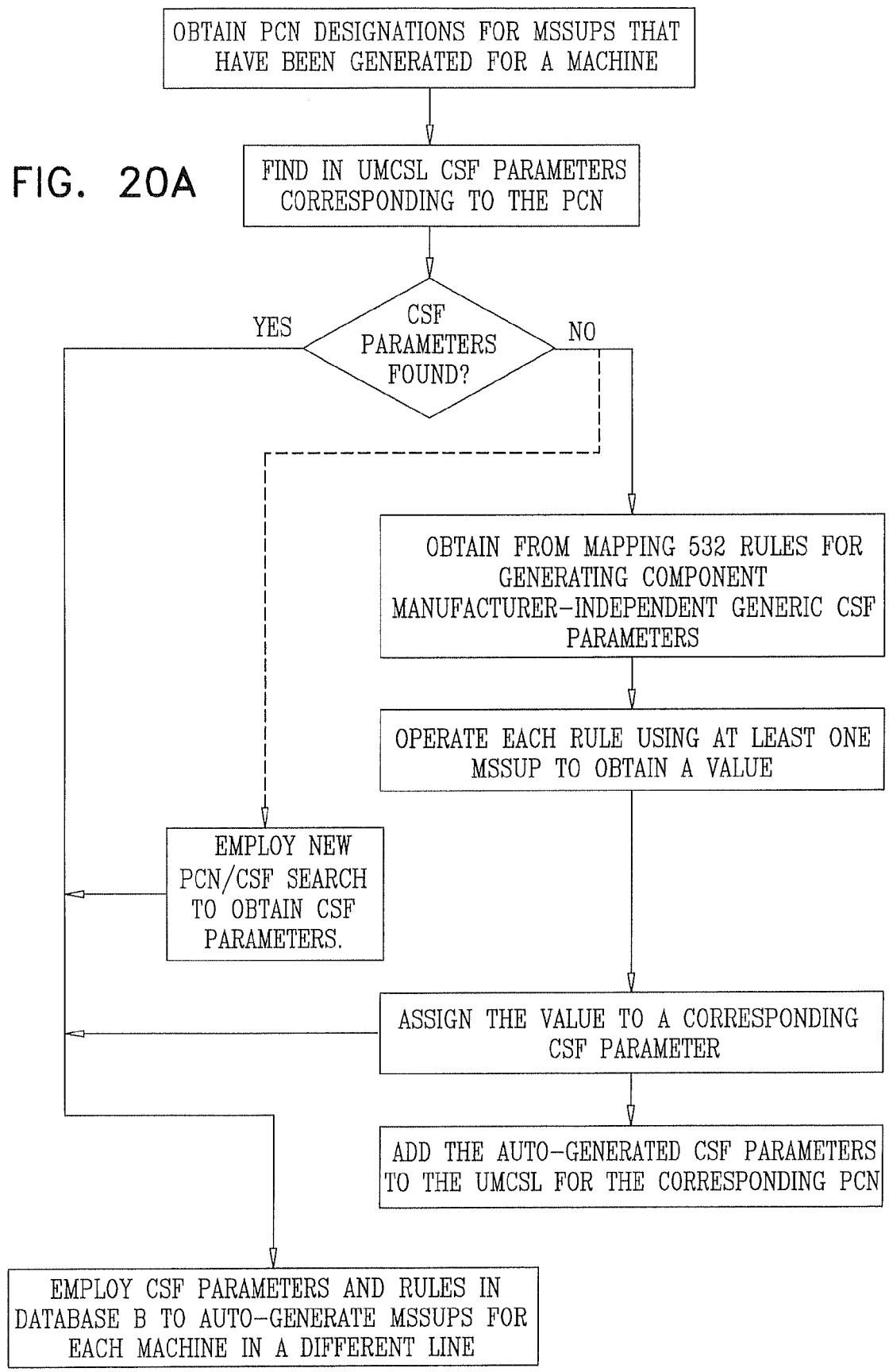
FIGS. 20A and 20B are simplified flowcharts illustrating the functionality of the system of FIG. 18.
Figure 20B:
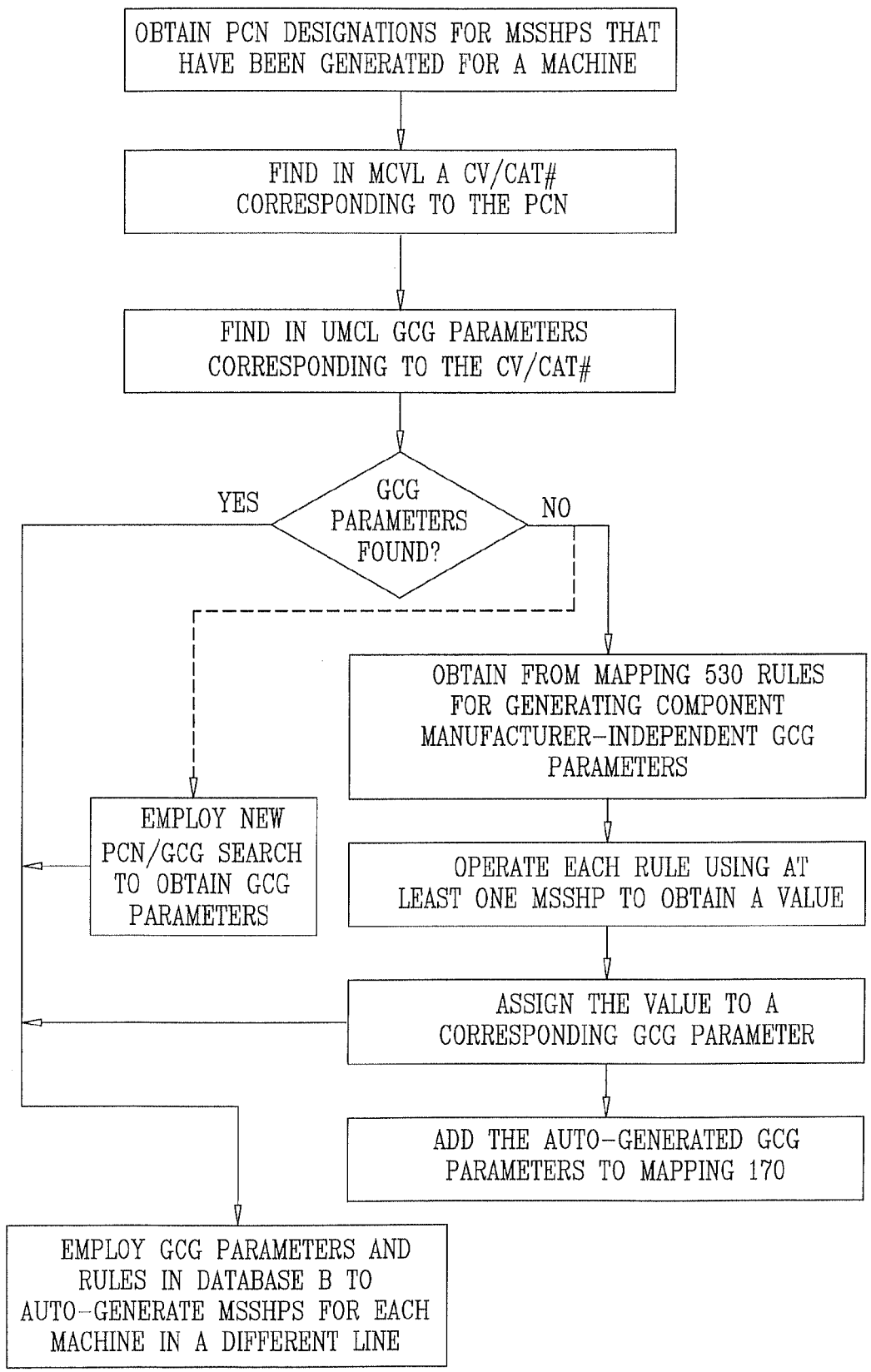

Reference is now made to FIGS. 20A and 20B, which are simplified flowcharts illustrating the functionality of the system of FIGS. 18 and 19, illustrating functionality for transferring component data relating to production of an electronic circuit from one manufacturing machine to another manufacturing machine.

As seen in FIG. 20A, PCN designations for the MSSUPs that have been generated for a given machine in line 500 are obtained typically from the computer-readable operating instructions. The UMCSL is employed to find CSF parameters for each such PCN. Should CSF parameters not be available for some PCNs, the existing MSSUPs are employed to auto-generate CSF parameters.

This auto-generation preferably takes place by employing mapping 532 (FIG. 19) to obtain rules for generating component manufacturer-independent generic component supply form (CSF) parameters and operating each rule using at least one MSSUP to obtain a value which is assigned to at least one corresponding CSF parameter. Preferably the thus auto-generated CSF parameters are added to the UMCSL, and are indicated therein as being auto-generated.

Alternatively, the new PCN/CSF search described hereinabove with reference to FIG. 9 may be employed to obtain the CSF parameters.

The machine line programmer now has CSF parameters corresponding to each PCN used in production of the electronic circuit in the given machine in line 500.

Employing the auto-generation functionality described hereinabove with reference to FIGS. 10 and 11A-11D, the software embodying an embodiment of the present invention automatically generates MSSUPs for each machine in a different line, such as line 501.

As seen in FIG. 20B, PCN designations for the MSSHPs that have been generated for a given machine in line 500 are obtained typically from the computer-readable operating instructions. At least one CV/CAT# corresponding to each PCN is obtained by the machine line programmer, using the MCVL. The UMCL is employed to find GCG parameters for each such CV/CAT#. Should GCG parameters not be available for some PCNs, the existing MSSHPs are employed to auto-generate GCG parameters.

This auto-generation preferably takes place by employing mapping 530 (FIG. 19) to obtain rules for generating component manufacturer-independent generic component geometric (GCG) parameters and operating each rule using at least one MSSHP to obtain a value which is assigned to at least one corresponding GCG parameter. Preferably, the thus auto-generated GCG parameters are added to mapping 170.

Alternatively, the new PCN/GCG search described hereinabove with reference to FIG. 13 may be employed to obtain the GCG parameters.

The machine line programmer now has GCG parameters corresponding to each PCN used in production of the electronic circuit in the given machine in line 500.

Employing the auto-generation functionality described hereinabove with reference to FIGS. 14 and 15A-15E, the software embodying an embodiment of the present invention automatically generates MSSHPs for each machine in a different line, such as line 501.

Machine balancing, as described hereinabove with reference to FIGS. 8A and 8B, may now be carried out for line 501.

Figure 21:
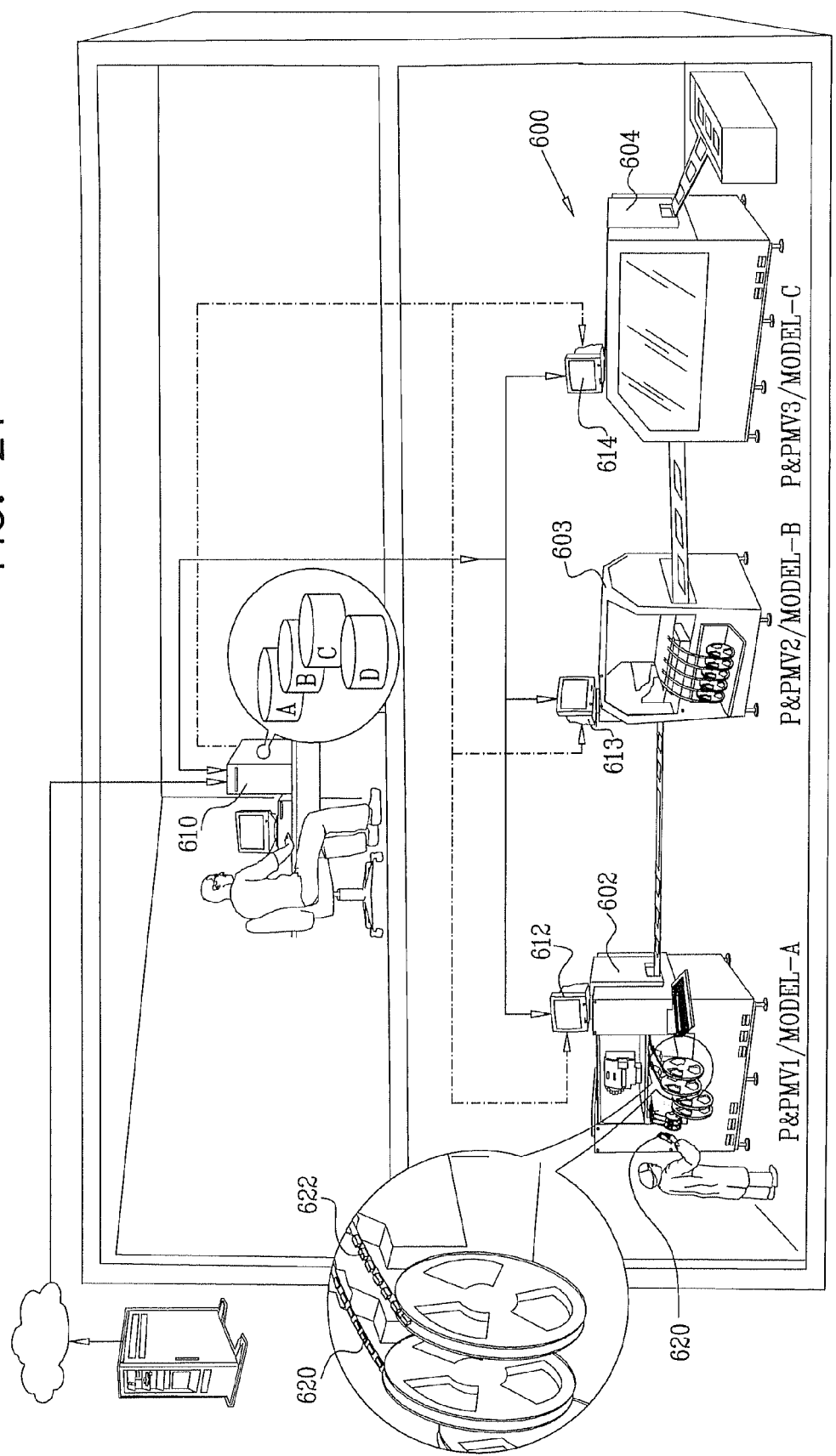
FIG. 21 is a simplified illustration of a system and functionality for automated manufacture of electronic circuits in accordance with yet another preferred embodiment of the present invention, including functionality for modifying operating instructions when a substitute component having at least one different characteristic is sought to be employed on a manufacturing line.

Reference is now made to FIG. 21, which is a simplified illustration of a system and functionality for automated manufacture of electronic circuits in accordance with another preferred embodiment of the present invention, including functionality for modifying operating instructions when a substitute component, having at least one different characteristic, is sought to be employed on a manufacturing line.

A typical context in which the present invention is used is an automated electronic circuit manufacture facility which includes one or more automated electronic circuit manufacturing lines, one of which is shown in FIG. 21 and identified generally by reference numeral 600. Each electronic circuit manufacturing line typically comprises a plurality of pick & place machines which may or may not originate from the same equipment vendor. Typically, each line comprises between one and ten pick & place machines. In FIG. 21, three such machines are illustrated in line 600 and are respectively designated by reference numerals 602, 603 and 604.

One or more machine line programmers, operating a machine line programming station 610, are responsible, inter alia, for providing operating instructions in computer-readable language to the pick & place machines of one or more lines such as line 600, such as pick & place machines 602, 603 and 604. The machine line programmer is also responsible for providing operating instructions in human-readable form to one or more pick & place machine operators who configure the pick & place machines and load components onto the machines. These human-readable instructions may be provided to the operators via respective displays 612, 613 and 614, on pick & place machines 602, 603 and 604, or, preferably, via hand-held terminals 620 or alternatively in hard copy.

In accordance with a preferred embodiment of the present invention, the machine line programmer employs an embodiment of the present invention which is preferably embodied in software loaded onto one or more computers forming part of station 610.

In the embodiment of FIG. 21, it is assumed that the machine line programmer has already provided MSSUPs and MSSHPs for the production of a given electronic circuit on a machine line, such as machine line 600. It is necessary, sometimes at very short notice, to substitute one of the components used in production of the electronic circuit, such as component 620, by another component having at least one different characteristic, such as component 622. The machine line programmer wishes to adapt the operating instructions without, insofar as possible, interrupting production by the machine line.

The software in station 610, which embodies an embodiment of the present invention, preferably, automatically compares the GCG parameters of the substitute component with those associated with the original component and auto-generates appropriate new MSSHPs which are employed in updated operating instructions. Preferably, this can be done within a matter of seconds, i.e. effectively in real time.

Figure 22:
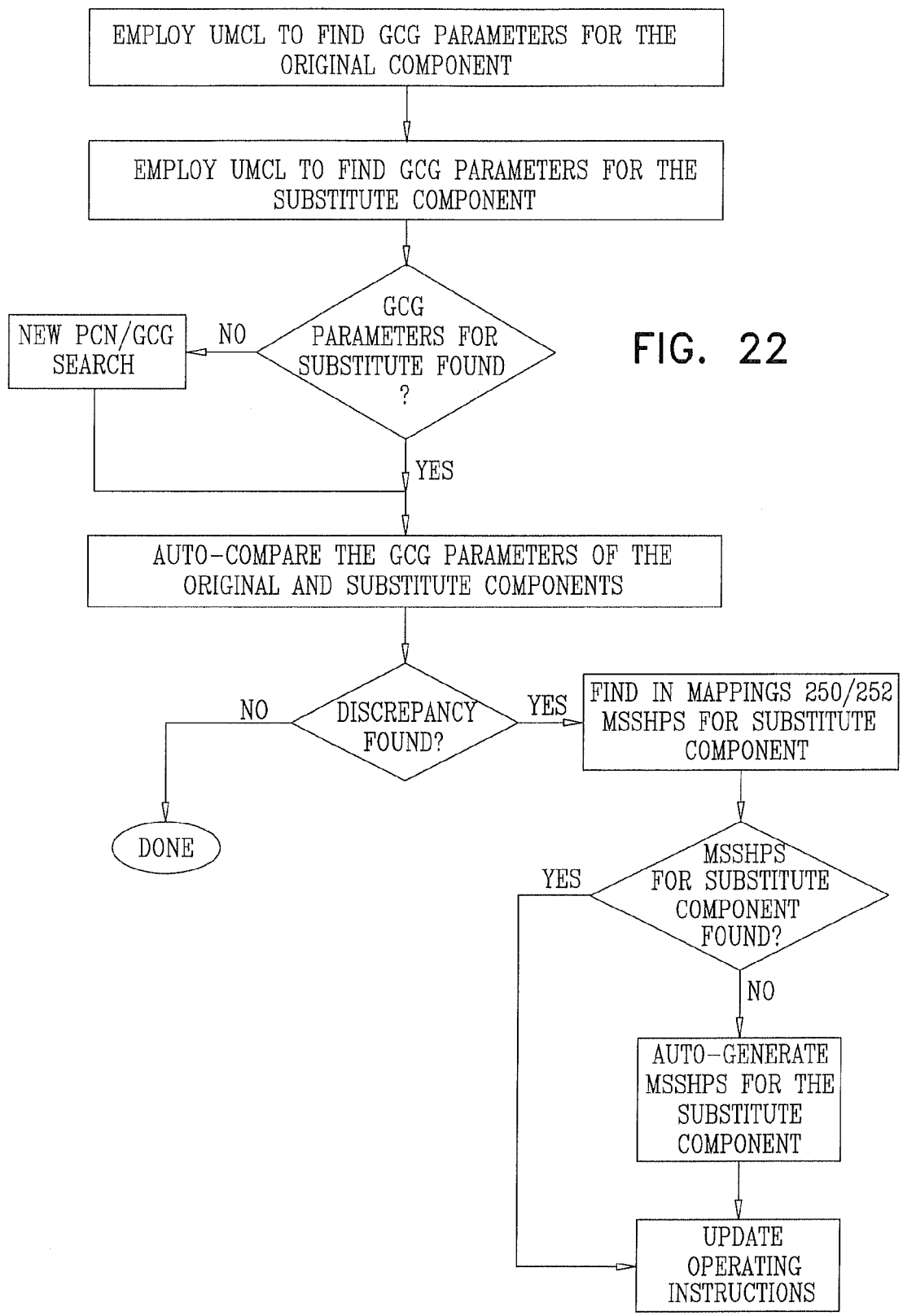
FIG. 22 is a simplified flowchart illustrating the functionality of the system of FIG. 21.

Reference is now made to FIG. 22, which is a simplified flowchart illustrating the functionality of the system of FIG. 21, illustrating functionality for modifying operating instructions when a substitute component, having at least one different characteristic, is sought to be employed on a manufacturing line.

As seen in FIG. 22, the UMCL is employed to find GCG parameters for the original component and the substitute component by using the respective CV/CAT#s thereof. If GCG parameters for the substitute component are not found, the new PCN/GCG search functionality described hereinabove with reference to FIGS. 17A and 17B is employed to obtain GCG parameters for the substitute component.

The GCG parameters of the original component and of the substitute component are automatically compared. If a discrepancy is found, the mappings 250 and 252 (FIG. 6) are employed to find MSSHPs corresponding to the substitute component. If such MSSHPs are found, the operating instructions are updated accordingly. Otherwise, the MSSHP auto-generation functionality described hereinabove with reference to FIGS. 14 and 15A-15E is employed to automatically generate MSSHPs for the substitute component. The operating instructions are updated accordingly.

Figure 23:
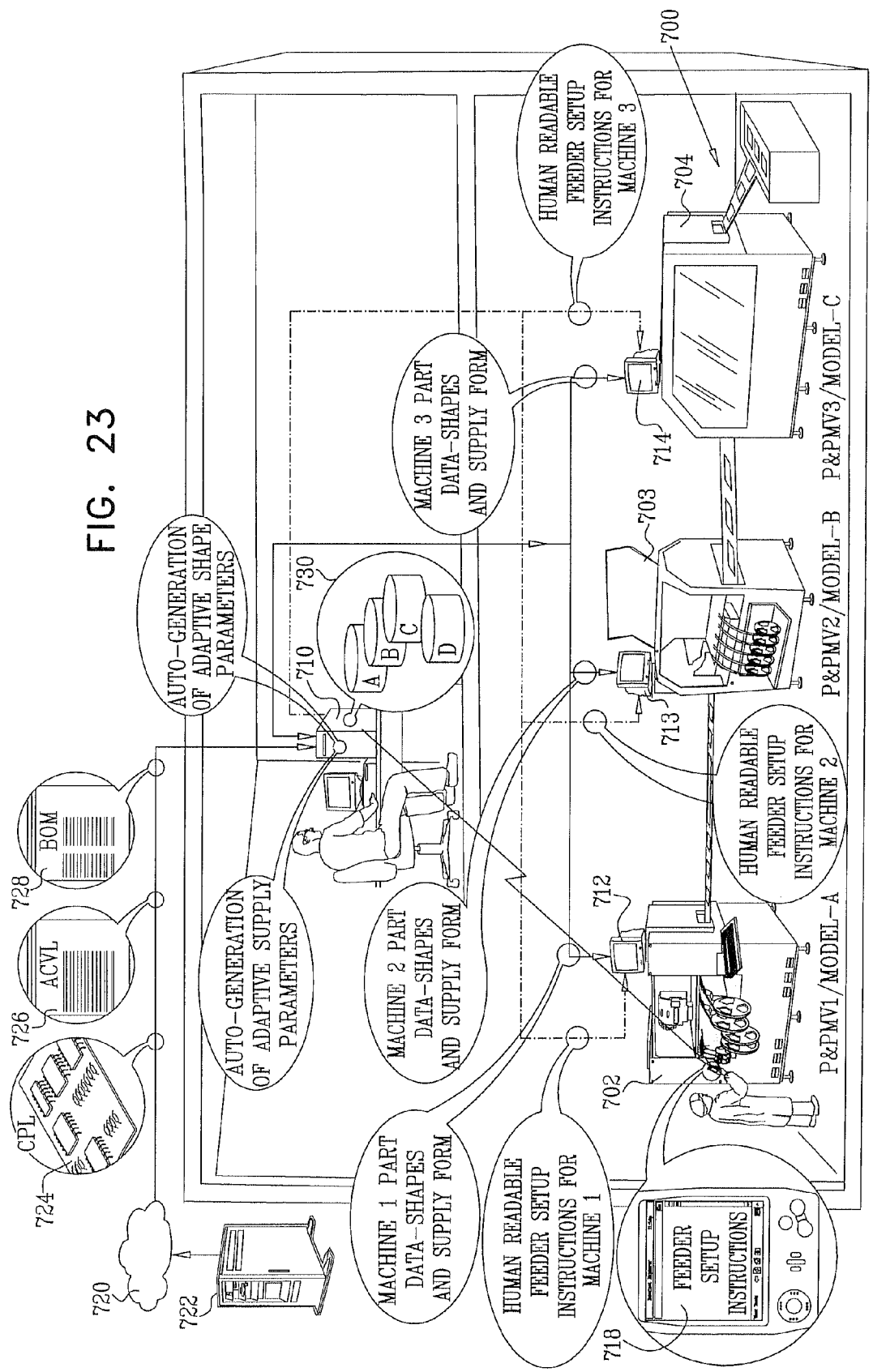
FIG. 23 is a simplified illustration of a system and functionality for automated manufacture of electronic circuits in accordance with still another preferred embodiment of the present invention including functionality for auto-generation of MSSHPs and MSSUPs having enhanced generality.

Reference is now made to FIG. 23, which is a simplified illustration of a system and functionality for automated manufacture of electronic circuits in accordance with still another preferred embodiment of the present invention, including functionality for auto-generation of AMSSHPs and AMSSUPs having enhanced generality. It is appreciated that the AMSSHPs and the AMSSUPs may be applicable for multiple configurations of a pick & place machine and for multiple models of a pick & place machine.

The embodiment of FIG. 23 and of FIGS. 24-34, which are described hereinbelow, relate to the auto-generation of adaptive parameters, which are parameters which are independent of pick & place machine configuration and may be variable as a function of specific pick & place machine configuration, which is determined only upon line balancing. By employing adaptive parameters, as in the embodiment of FIGS. 23-34, the rules set which is used to generate these parameters can be reduced and the number of such parameters can be reduced correspondingly. Accordingly the numbers of AMSSHPs and AMSSUPs for a given product production can be substantially less than the corresponding number of MSSHPs and MSSUPs required in accordance with the embodiment of FIGS. 1-17.

A typical context in which the present invention is used is an automated electronic circuit manufacture facility which includes one or more automated electronic circuit manufacturing lines, one of which is shown in FIG. 23 and identified generally by reference numeral 700. Each electronic circuit manufacturing line typically comprises a plurality of pick & place machines which may or may not originate from the same equipment vendor. Typically, each line comprises between one and ten pick & place machines. In FIG. 23, three such machines are illustrated in line 700 and are respectively designated by reference numerals 702, 703 and 704.

One or more machine line programmers, operating a machine line programming station 710, are responsible, inter alia, for providing operating instructions in computer-readable language to the pick & place machines of one or more lines such as line 700, such as pick & place machines 702, 703 and 704. The machine line programmer is also responsible for providing operating instructions in human-readable form to one or more pick & place machine operators who configure the pick & place machines and load components onto the machines. These human-readable instructions may be provided to the operators via respective displays 712, 713 and 714, on pick & place machines 702, 703 and 704, or, preferably, via hand-held terminals 718 or, alternatively, in hard copy.

In the embodiment of FIG. 23, as distinguished from that of FIG. 1, adaptive MSSUPs and MSSHPs are provided for the production of a given electronic circuit on a machine line, such as machine line 700, and may be suitable for more than a single configuration of a pick & place machine.

In accordance with a preferred embodiment of the present invention, the machine line programmer employs an embodiment of the present invention which is preferably embodied in software loaded onto one or more computers forming part of machine line programming station 710. The machine line programmer also employs electronic circuit design and specification data specific to each electronic circuit to be manufactured. This data is preferably supplied via a computer network 720 from one or more remote servers 722, directly to one or more computers forming part of machine line programming station 710 and preferably includes CPL, ACVL and BOM data, respectively designated by reference numerals 724, 726 and 728.

Figure 24:
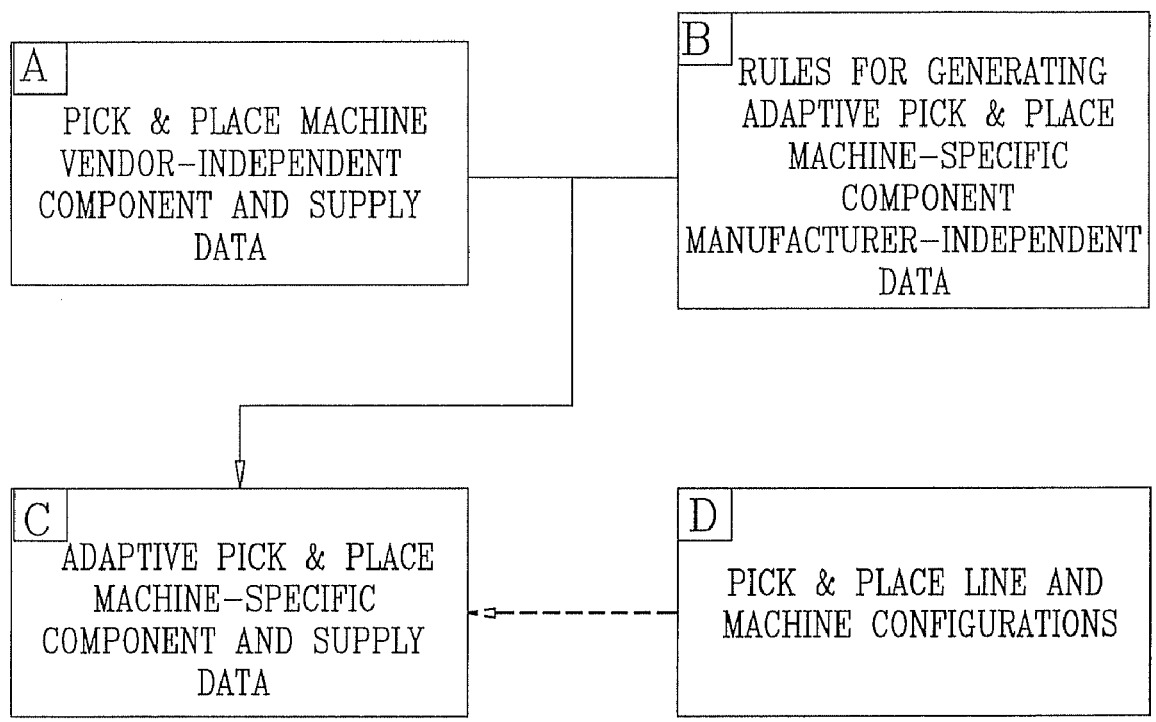
FIG. 24 is a simplified, diagrammatic illustration of four databases employed in the system and functionality of FIG. 23 in accordance with a preferred embodiment of the present invention.

In processing the received CPL 724, ACVL 726 and BOM 728 data to provide operating instructions, the machine line programmer preferably employs databases 730 preferably including at least four databases, identified in FIG. 23 as databases A, B, C and D. As indicated in FIG. 24, to which reference is now additionally made, databases A, B, C and D may be characterized as follows:

Database A—containing pick & place machine vendor-independent component and supply data;

Database B—containing rules for generating adaptive pick & place machine-specific, component manufacturer-independent data;

Database C—containing adaptive pick & place machine-specific component and supply data; and Database D—containing pick & place line and machine configurations.

FIG. 24 diagrammatically illustrates that in accordance with a preferred embodiment of the present invention databases A, B and D are employed in combination in accordance with the present invention to auto-generate at least part of the content of database C. It is appreciated that databases A and D shown in FIGS. 23 and 24 are typically similar to databases A and D described hereinabove with reference to FIGS. 1 and 2, and that databases B and C are similar to databases B and C described hereinabove with reference to FIGS. 1 and 2, but include modifications as described hereinbelow with reference to FIGS. 25-27.

As seen in FIG. 23, preferably the machine line programming station 710, using software of the present invention, employs the received CPL 724, ACVL 726 and BOM 728 data and databases A, B and possibly D to perform auto-generation of adaptive pick & place machine-specific component shape parameters and adaptive pick & place machine-specific component supply parameters which are preferably incorporated into database C, as described hereinbelow.

As also seen in FIG. 23, the machine line programming station 710, using software of the present invention, preferably employs the received CPL 724, ACVL 726 and BOM 728 data and databases A-D to perform line balancing and programming functions, the outputs of which are pick & place machine-specific component shape and supply parameters which are supplied to pick & place machines 702, 703 and 704 in a machine-readable language which is readable by each specific machine and human-readable machine feeder set-up instructions specifically adapted for each of the pick & place machines 702, 703 and 704.

Figure 25:
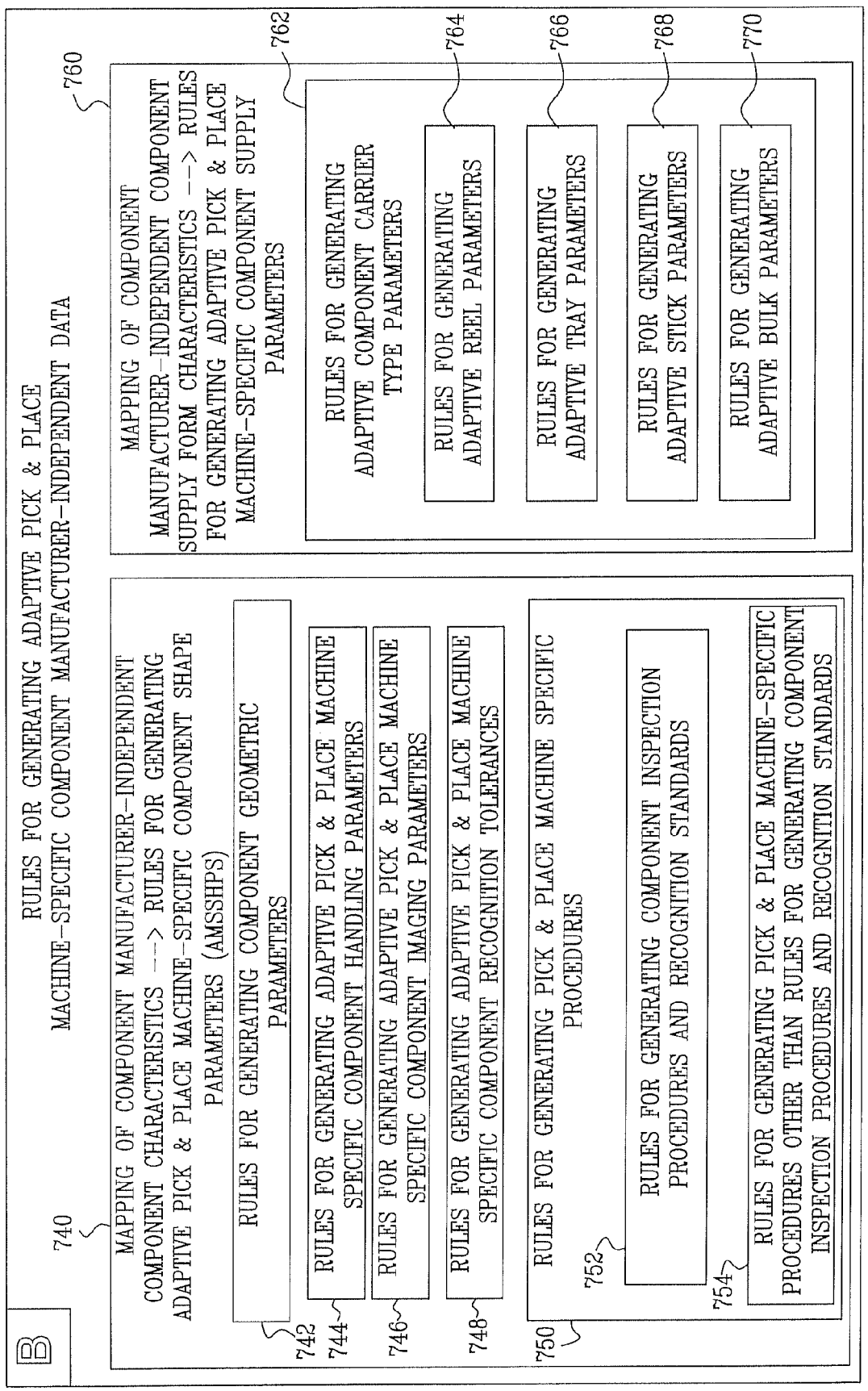
FIG. 25 is a simplified illustration of a pick & place machine-specific component manufacturer-independent rules database employed in the system and functionality of FIGS. 23 and 24.

Reference is now made to FIG. 25, which illustrates the structure and content of database B. As seen in FIG. 25, database B includes a plurality of mappings, each shown enclosed in a rectangle, which are preferably employed to enhance the accessibility of the information stored in the database.

A first mapping, here designated by reference numeral 740, maps component manufacturer-independent component characteristics to rules for generating adaptive pick & place machine-specific component shape parameters (AMSSHP). The rules for generating adaptive pick & place machine-specific component shape parameters are preferably divided into several groups in database B including:

Rules 742 for generating component geometric parameters. These rules are not necessarily pick & place machine-specific but provide component geometric parameters which appear in a pick & place machine-specific syntax.

Rules 744 for generating adaptive pick & place machine-specific component handling parameters. These rules are pick & place machine-specific.

Rules 746 for generating adaptive pick & place machine-specific component imaging parameters. These rules are pick & place machine-specific.

Rules 748 for generating adaptive pick & place machine-specific component recognition tolerances. These rules are pick & place machine-specific.

Rules 750 for generating pick & place machine-specific procedures. These rules include two sub-groups of rules:

Rules 752 for generating component inspection procedures and recognition standards. For example, these rules determine the number of attempts to pick up a component before a pick-up failure is noted.

Rules 754 for generating pick & place machine-specific procedures other than rules 752 for generating component inspection procedures and recognition standards. For example, these rules determine what is to be done with rejected components.

A second mapping, here designated by reference numeral 760, maps component manufacturer-independent component supply form characteristics to rules for generating adaptive pick & place machine-specific component supply parameters (AMSSUP). The rules for generating adaptive pick & place machine-specific component supply parameters include rules 762 for generating adaptive component carrier type parameters. These rules are not necessarily pick & place machine-specific but provide adaptive component carrier type parameters which appear in a pick & place machine-specific syntax. Rules 762 include four sub-groups:

- Rules 764 for generating adaptive reel parameters, such as for example, rules relating to reel diameter, width and pitch.
- Rules 766 for generating adaptive tray parameters, such as, for example, rules relating to the number of components contained on a tray along its X and Y axes.
- Rules 768 for generating adaptive stick parameters, such as, for example, rules relating to the width of the stick and the number of components contained in the stick.
- Rules 770 for generating adaptive bulk parameters, such as, for example, rules relating to the width of the opening of a bulk container.

Reference is now made to FIGS. 26A and 26B, which are exemplary charts illustrating logical organization of rules, contained in the database of FIG. 25, for generating adaptive pick & place machine-specific component shape parameters and adaptive component supply parameters, respectively.

Turning to FIG. 26A, which illustrates the organization of rules for generating adaptive pick & place machine-specific component supply parameters, it is seen that the chart of rules is organized along a vertical axis according to adaptive pick & place machine-specific component supply parameters (AMSSUPs), such as feeder name, to which a value is to be assigned in accordance with the rules.

It is appreciated that typically a separate chart of the type shown in FIG. 26A is applicable to each carrier type, such as reels, trays, sticks and bulk, and to each specific model of pick & place machine.

Each cell in the chart contains an exemplary rule. For example, cell 772, which relates to feeder name, contains a rule that, when operated, determines that if a front tray lifter is used then the feeder name is A, and otherwise the feeder name is B.

It is appreciated that any suitable rule logic may be employed in the rules of FIG. 26A.

Turning to FIG. 26B, which illustrates the organization of rules for generating adaptive pick & place machine-specific component shape parameters, it is seen that the chart of rules is organized along a horizontal axis according to component manufacturer-independent component types, such as BGA, QFP and CONNECTORS and is organized along a vertical axis according to adaptive pick & place machine-specific component shape parameters (AMSSHPs), such as pickup depth, pickup speed and illumination level, to which a value is to be assigned in accordance with the rules.

Each cell in the chart contains an exemplary rule. For example, cell 782, which relates to a suitable vision algorithm for a BGA component, contains a rule which, when operated, checks the number of leads of the component, and defines the vision algorithm to be used accordingly. In the example shown in cell 782, if the number of leads is greater than 100, it is not relevant to use a machine configured to have back-lighting, otherwise, in a machine configured to have back-lighting, algorithm 105 should be used, and in a machine configured to have front-lighting algorithm 103 should be used.

As another example, cell 784, which relates to a suitable vision algorithm for a QFP component, contains a rule which, when operated, defines that a vision algorithm is not relevant when the machine is configured to have back-lighting, and that vision algorithm 107 should be used when the machine is configured to have front-lighting.

As a further example, cell 786, which relates to a suitable vision algorithm for a connector type component, contains a rule which, when operated, checks the component pitch, and defines the vision algorithm to be used accordingly. In the example shown in cell 786, if the pitch is less than 0.01, it is not relevant to use a machine configured to have back-lighting and in a machine configured to have front-lighting vision algorithm 120 should be used. Otherwise, in a machine configured to have back-lighting, algorithm 150 should be used, and in a machine configured to have front-lighting algorithm 130 should be used.

It is appreciated that any suitable rule logic may be employed in the rules of FIG. 26B.

Figure 27:
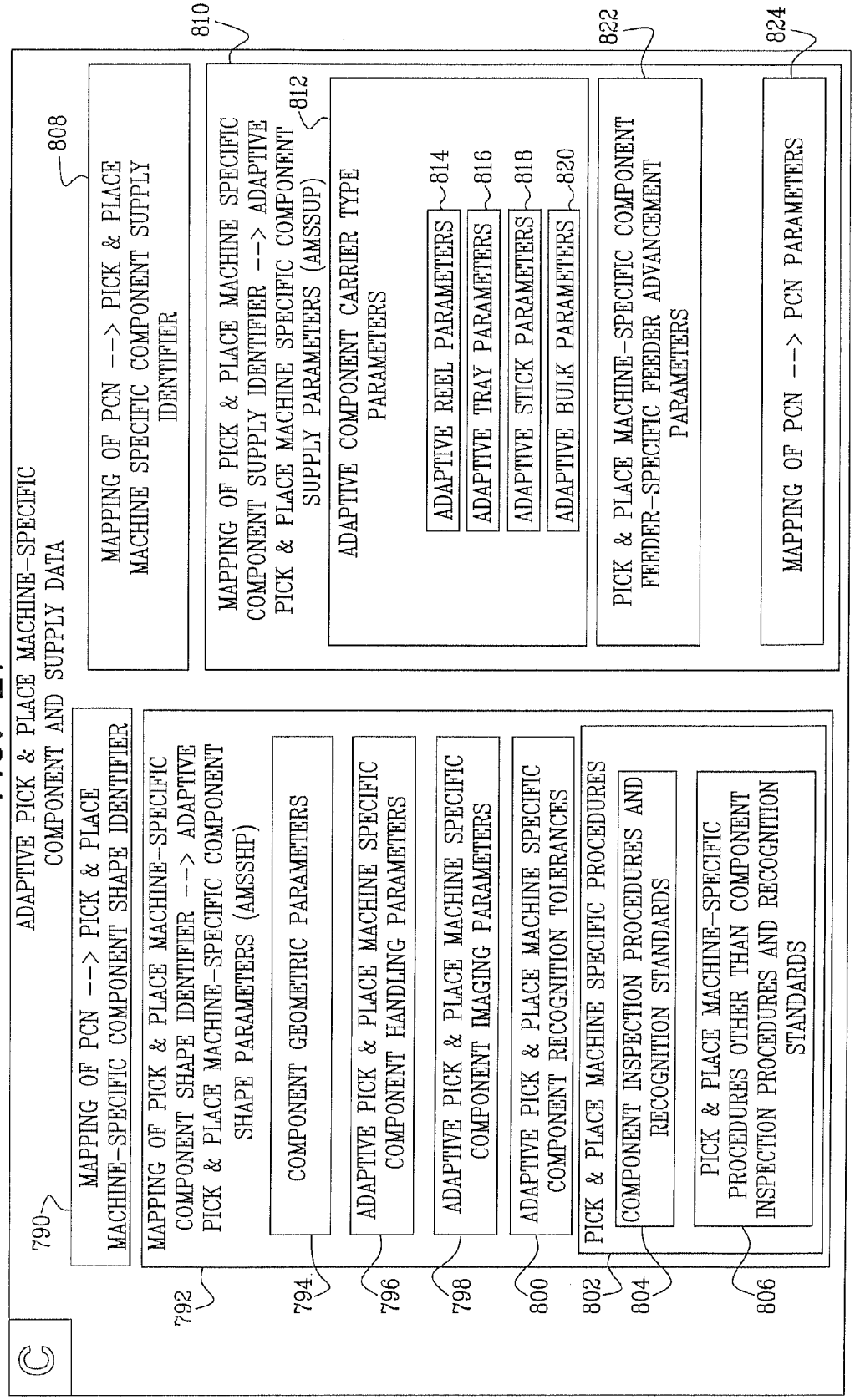
FIG. 27 is a simplified illustration of a pick & place machine-specific component and supply data database employed in the system and functionality of FIGS. 23 and 24.

Reference is now made to FIG. 27, which illustrates the structure and content of database C. As seen in FIG. 27, database C includes a plurality of mappings, each shown enclosed in a rectangle, which are preferably employed to enhance the accessibility of the information stored in the database.

A first mapping, here designated by reference numeral 790, maps programmer component numbers (PCNs) to pick & place machine-specific component shape identifiers. This is a many-to-one mapping.

A second mapping, here designated by reference numeral 792, maps pick & place machine-specific component shape identifiers to adaptive pick & place machine-specific component shape parameters (AMSSHP). The adaptive pick & place machine-specific component shape parameters are divided into several groups in database C including:

- Component geometric parameters 794. The parameters are not necessarily pick & place machine-specific but appear in a pick & place machine-specific syntax.
- Adaptive pick & place machine-specific component handling parameters 796. These parameters are pick & place machine-specific.
- Adaptive pick & place machine-specific component imaging parameters 798. These parameters are pick & place machine-specific.
- Adaptive pick & place machine-specific component recognition tolerances 800. These tolerances are pick & place machine-specific.
- Pick & place machine-specific procedures 802. These procedures include two sub-groups:
  - Component inspection procedures and recognition standards 804.
  - Pick & place machine-specific procedures 806 other than component inspection procedures and recognition standards 804.

A third mapping, here designated by reference numeral 808, maps programmer component numbers (PCNs) to pick & place machine-specific component supply identifiers. This is a many-to-one mapping.

A fourth mapping, here designated by reference numeral 810, maps pick & place machine-specific component supply identifiers to adaptive pick & place machine-specific component supply parameters (AMSSUP). The adaptive pick & place machine-specific component supply parameters include two sub-groups:

- Adaptive component carrier type parameters 812. These parameters are not necessarily pick & place machine-specific but appear in a pick & place machine-specific syntax. These parameters include four further sub-groups:

Adaptive reel parameters 814, such as, for example, reel diameter, width and pitch.

Adaptive tray parameters 816, such as, for example, the number of components contained on a tray along its X and Y axes.

Adaptive stick parameters 818, such as, for example, the width of a stick and the number of components contained in the stick.

Adaptive bulk parameters 820, such as, for example, the width of the opening of a bulk container.

Pick & place machine-specific, component feeder-specific, feeder advancement parameters 822. These parameters are pick & place machine-specific.

A fifth mapping, here designated by reference numeral 824, maps programmer component numbers (PCNs) to PCN parameters. These parameters are not necessarily pick & place machine-specific but appear in a pick & place machine-specific syntax. An example of a PCN parameter is component polarity status.

It is noted that database C contains all of the above mappings appropriate for each specific pick & place machine.

Figure 28A:
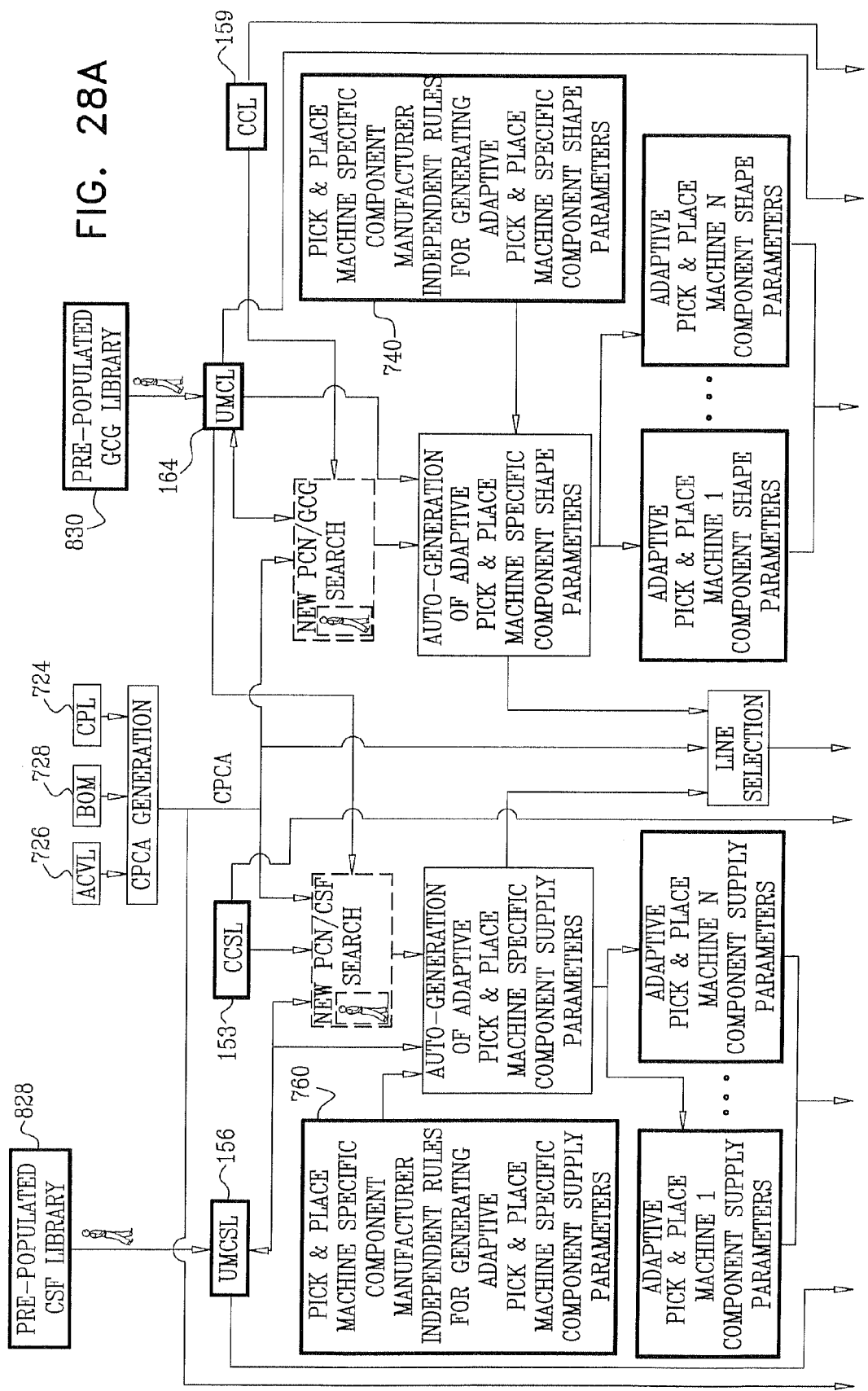
FIGS. 28A and 28B together form a simplified flowchart illustrating the functionality of the system of FIGS. 23-27.
Figure 28B:
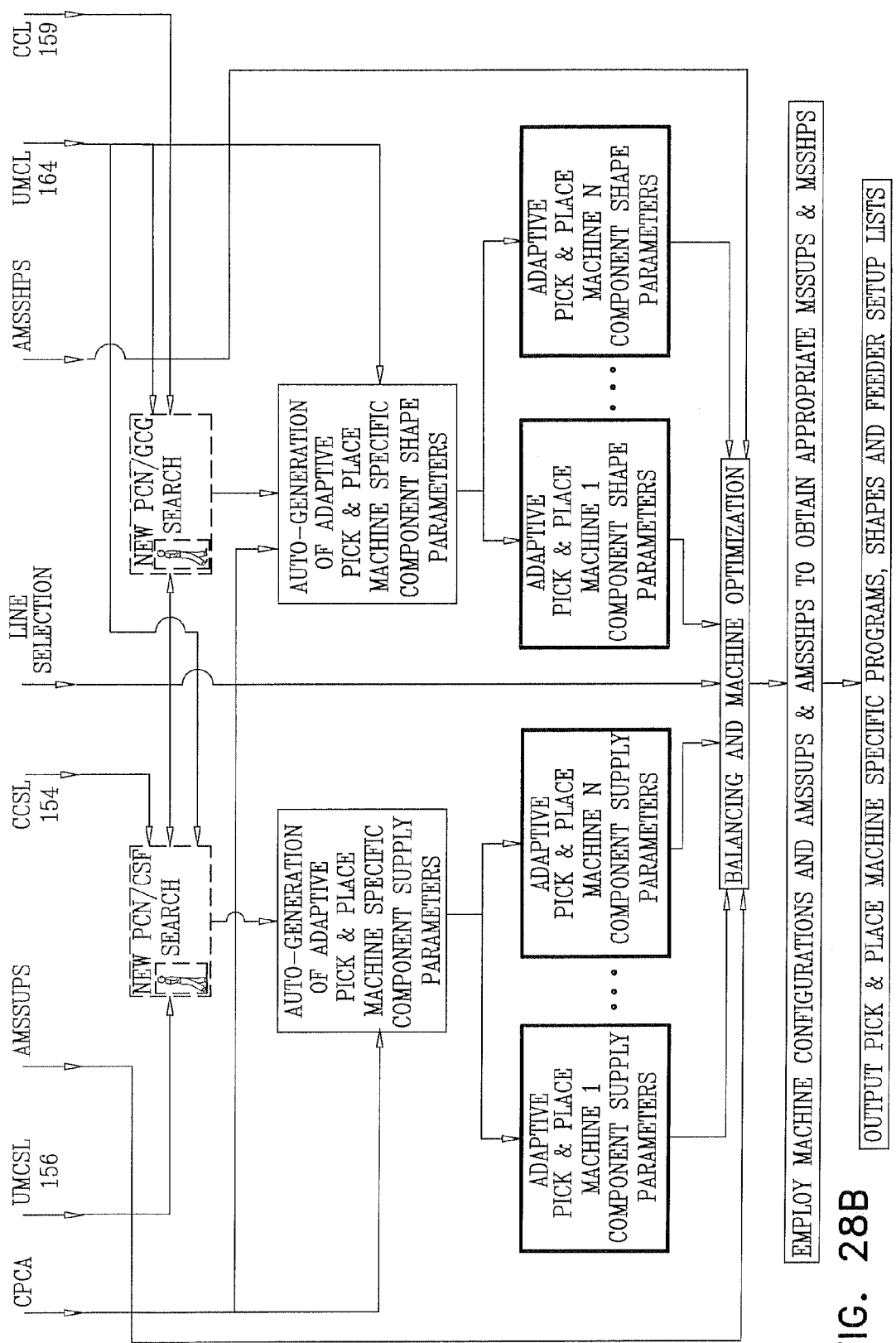

Reference is now made to FIGS. 28A and 28B, which together form a simplified flowchart illustrating the operation of the system and functionality for automated manufacture of electronic circuits of FIGS. 23-27 in accordance with a preferred embodiment of the present invention.

As indicated in FIGS. 28A and 28B, and as described generally hereinabove with reference to FIG. 23, one or more machine line programmers receive at machine line programming station 710 (FIG. 23), preferably via computer network 720 (FIG. 23) from one or more remote servers 722 (FIG. 23), PCA design data including CPL 724, ACVL 726 and BOM 728 data.

The machine line programmers process the received CPL 724, ACVL 726 and BOM 728 data in a conventional manner to generate CPCA data which employs PCN designations.

Thereafter, the machine line programmers, employing features of the present invention, may carry out a New PCN/CSF Search employing CCSL 153, UMCSL 156 and UMCL 164. The UMCSL 156 may be manually populated using information from a Pre-Populated CSF Library 828 and/or may be populated on the fly by results of New PCN/CSF Search.

Details of the New PCN/CSF Search may be identical to those described hereinabove with reference to FIG. 9.

At this stage, the machine line programmer has CSF parameters for each PCN in the CPCA data. It is seen that the software of the present invention may be employed for auto-generation of adaptive pick & place machine-specific component supply parameters (AMSSUPs). The auto-generation employs UMCSL 156 and mapping 760 to identify pick & place machine-specific, component manufacturer-independent rules for generating appropriate adaptive pick & place machine-specific supply parameters (AMSSUPs).

Details of the auto-generation are now described with reference to FIG. 29, which is a simplified flowchart illustrating details of auto-generation of adaptive pick & place machine specific component supply parameters, and to FIG. 30, which is a simplified diagrammatic illustration of the application of pick & place machine-specific component manufacturer-independent rules for generating adaptive pick & place machine-specific component supply parameters for a specific carrier type employed in accordance with a preferred embodiment of the present invention.

Figure 29:
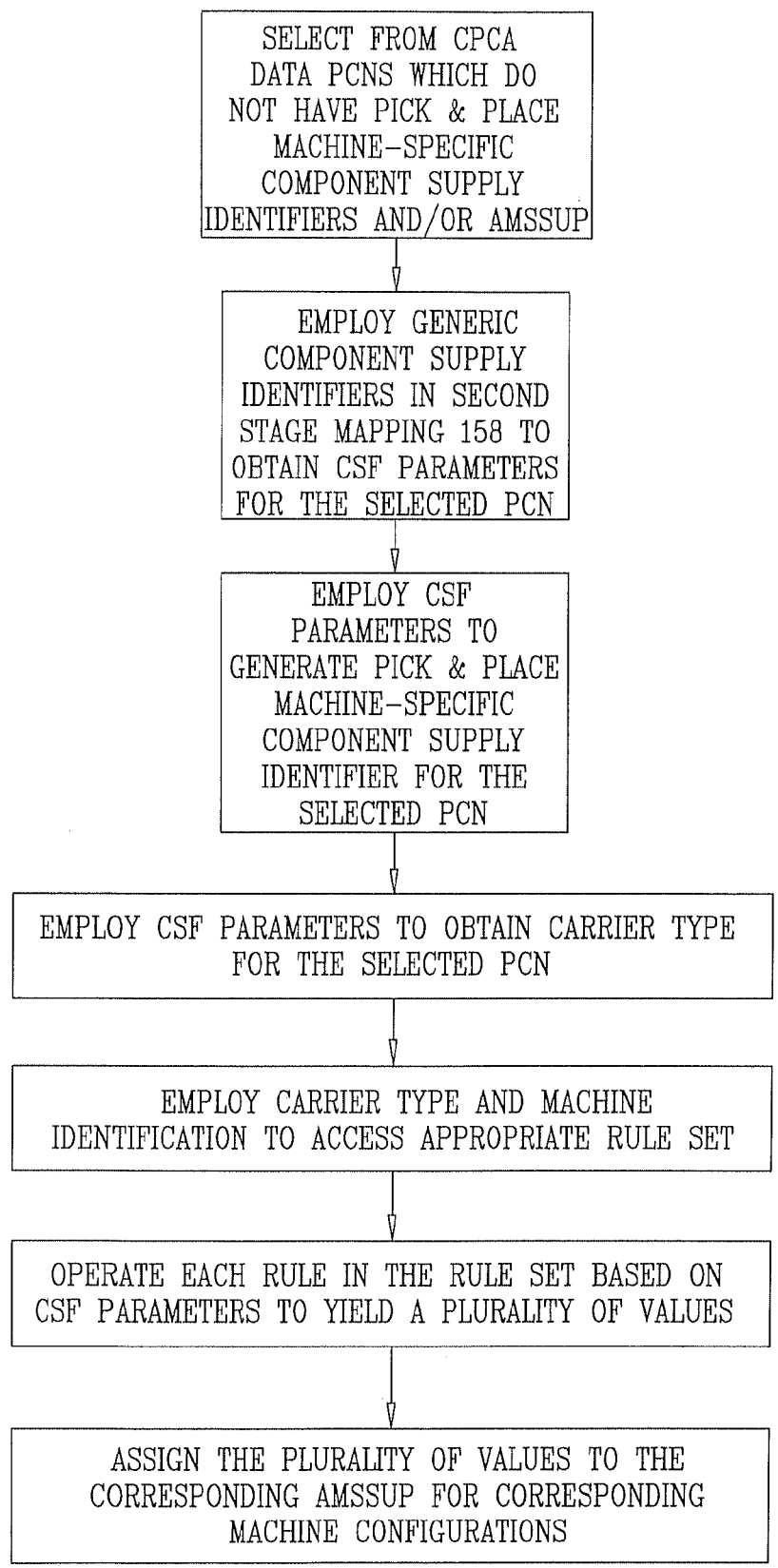
FIG. 29 is a simplified flowchart illustrating details of auto-generation of adaptive pick & place machine specific component supply parameters forming part of the functionality shown in the flowchart of FIGS. 28A and 28B.

As seen in FIG. 29, for each pick & place machine in the manufacturing facility 700 (FIG. 23), the PCNs in the CPCA data which do not have AMSSUPs and/or pick & place machine-specific component supply identifiers are selected.

For each such selected PCN, CSF parameters are obtained by employing generic component supply identifiers in the second stage mapping 158 (FIG. 3). For each such selected PCN, the CSF parameters are employed to generate a corresponding pick & place machine-specific component supply identifier.

The CSF parameters are employed to obtain the corresponding carrier type for each selected PCN. The carrier type and the identification of the specific pick & place machine for which AMSSUPs are being generated are used by the software of the present invention to access an appropriate rule set, such as that appearing in FIG. 26A. Each rule in the rule set is operated based on at least one appropriate input variable forming part of the CSF parameters to yield a plurality of values which are assigned to the corresponding AMSSUP for various corresponding machine configurations.

Figure 30:
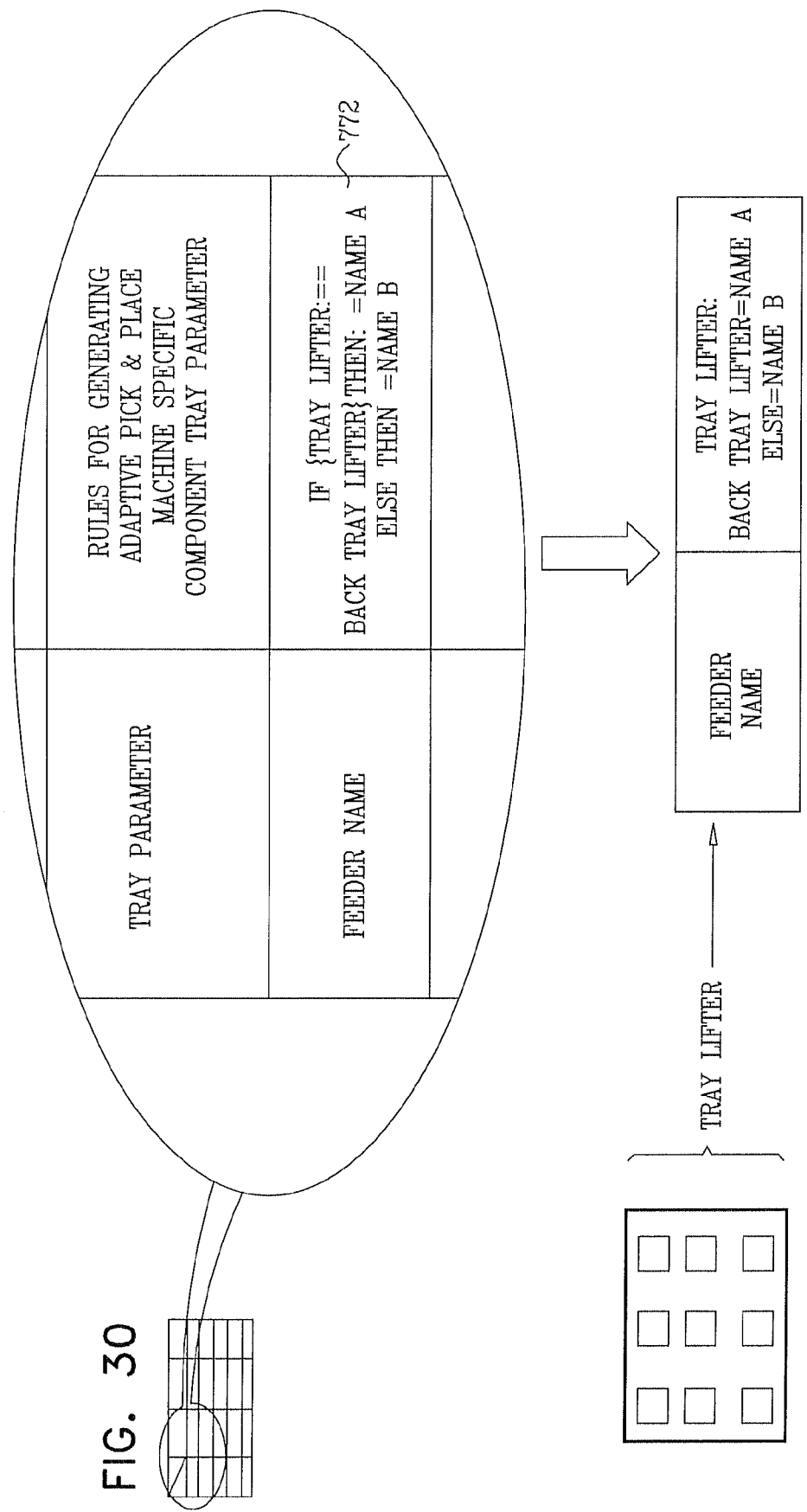
FIG. 30 is a simplified diagrammatic illustration of the application of pick & place machine-specific component manufacturer-independent rules for generating adaptive pick & place machine-specific component supply parameters for a specific carrier type.

FIG. 30 illustrates the operation of an exemplary rule for a tray carrier type. In the example in FIG. 30, the generic component supply form parameter for the specific component is a tray lifter. This parameter is employed in the rule of cell 772 to determined that the parameter is a tray lifter, and provides an adaptive pick & place machine specific component supply parameter related to the tray lifter.

Returning now to FIGS. 28A and 28B, it is indicated that the machine line programmers, employing features of the present invention, may carry out a New PCN/GCG Search employing CCL 159 and UMCL 164. The UMCL 164 may be manually populated using information from a Pre-Populated GCG Library 830 and/or may be populated on the fly by results of New PCN/GCG Search.

Details of the New PCN/GCG Search may be identical to those described hereinabove with reference to FIGS. 13A and 13B.

It is noted that at this stage, the programmer has GCG parameters for each PCN in the CPCA data. The software of the present invention may be employed for auto-generation of adaptive pick & place machine-specific component shape parameters (AMSSHPs). The auto-generation employs UMCL 164 and mapping 740 to identify pick & place machine-specific, component manufacturer-independent rules for generating appropriate adaptive pick & place machine-specific shape parameters (AMSSHPs).

Details of the auto-generation are now described with reference to FIG. 31, which is a simplified flowchart illustrating details of auto-generation of adaptive pick & place machine specific component shape parameters, and to FIG. 32 which is a simplified diagrammatic illustration of the application of pick & place machine-specific component manufacturer-independent rules for generating pick & place machine-specific component handling parameters employed in accordance with a preferred embodiment of the present invention.

Figure 31:
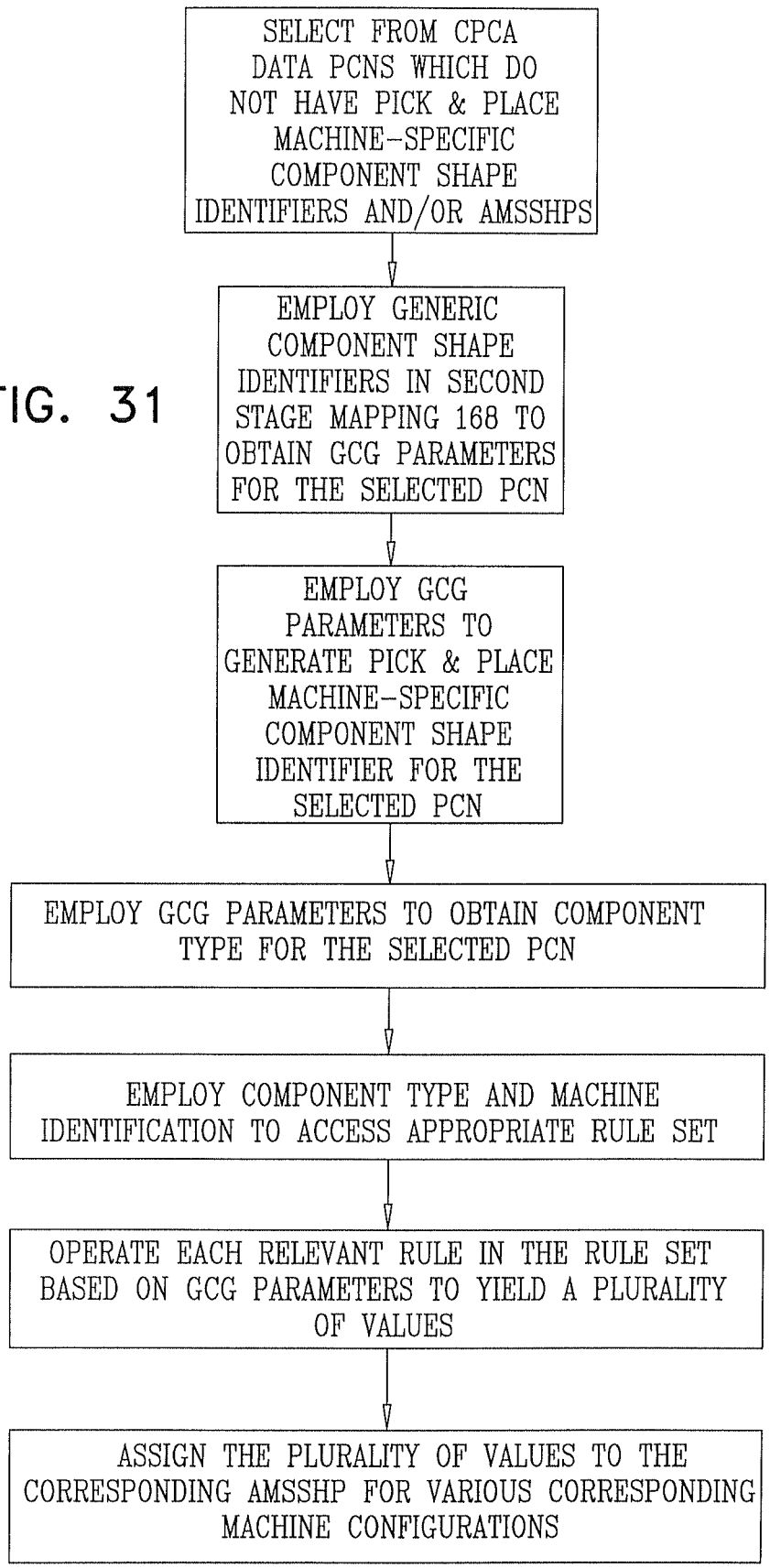
FIG. 31 is a simplified flowchart illustrating details of auto-generation of adaptive pick & place machine specific component shape parameters forming part of the functionality shown in the flowchart of FIGS. 28A and 28B.

As seen in FIG. 31, for each pick & place machine in the manufacturing facility 700 (FIG. 23), the PCNs in the CPCA data which do not have AMSSHPs and/or pick & place machine-specific component shape identifiers are selected.

For each such selected PCN, GCG parameters are obtained by employing the generic component shape identifiers in the second stage mapping 168. For each such selected PCN, the GCG parameters are employed to generate a corresponding pick & place machine-specific component shape identifier.

The GCG parameters are employed to obtain the corresponding component type for each selected PCN. The component type and the identification of the specific pick & place machine for which AMSSHPs are being generated are used by the software of the present invention to access an appropriate rule set, such as that appearing in FIG. 26A. Each relevant rule in the rule set is operated based on at least one appropriate input variable forming part of the GCG parameters to yield a plurality of values which are assigned to the corresponding AMSSHP for various corresponding machine configurations.

Figure 32:
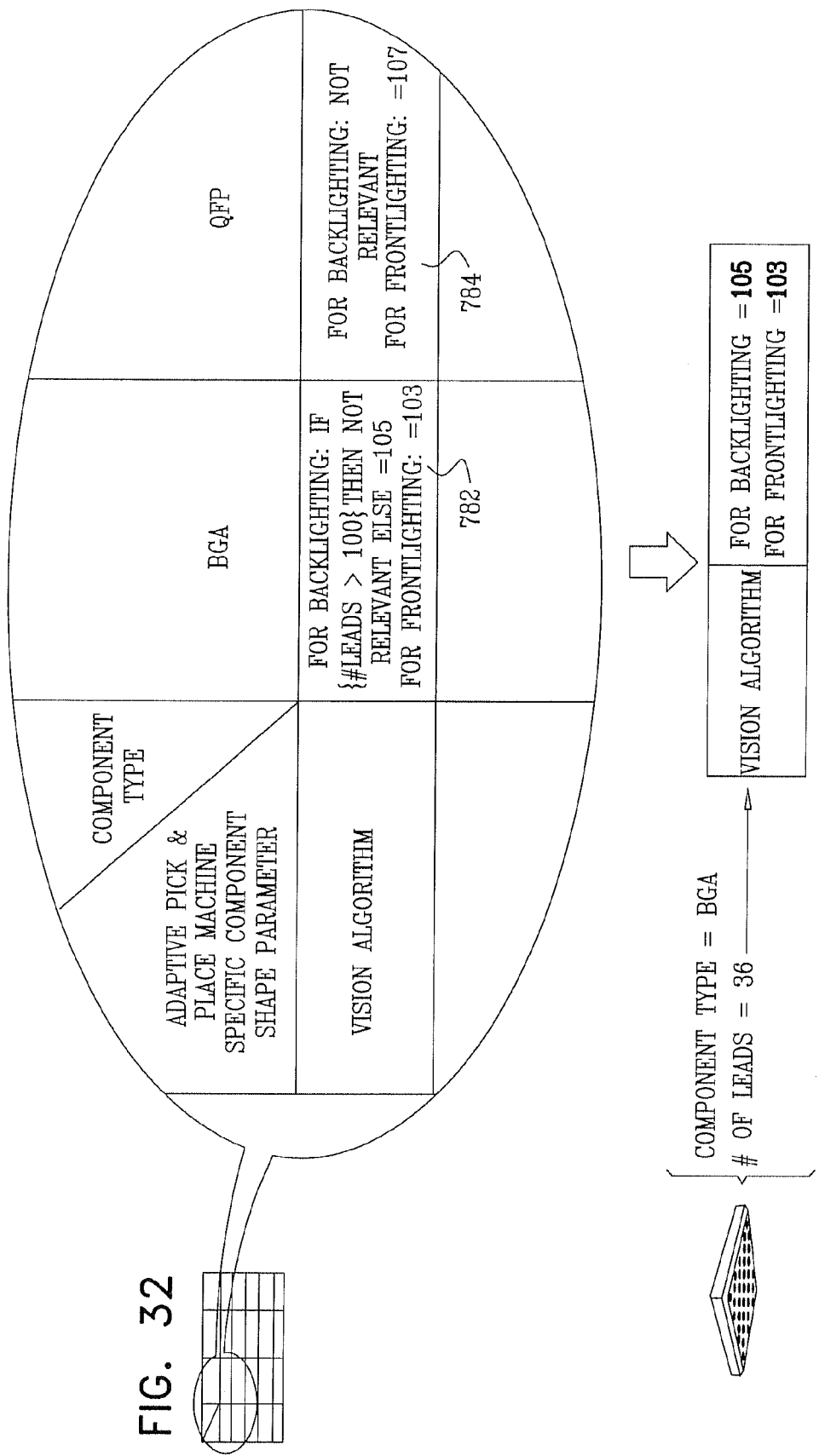
FIG. 32 is a simplified diagrammatic illustration of the application of pick & place machine-specific component manufacturer-independent rules for generating adaptive pick & place machine-specific component handling parameters.

FIG. 32 illustrates the operation of an exemplary rule for a component handling parameter. In the example in FIG. 32, the component is of type BGA, where the component has 38 leads. These parameters are employed to obtain an appropriate rule and to operate the rule. In this case, the rule in cell 782 is operated, by comparing the number of leads to 100. Since the number of leads is less than 100, the vision algorithm is assigned to be algorithm 105 when the machine is configured to have back-lighting and algorithm 103 when the machine is configured to have front lighting.

Returning once again to FIGS. 28A and 28B, it is seen that line selection is carried out using the software of the present invention by employing the CPCA data and preferably also employing the AMSSUPs and the AMSSHPs.

In a case where the New PCN/CSF search and/or the New PCN/GCG search were not already carried out, similar searches must be carried out at this stage. It is appreciated that the New PCN/CSF search and the New PCN/GCG search may be identical to respective searches described hereinabove with reference to FIGS. 16, 17A and 17B.

Following these searches, auto-generation is performed as described hereinabove with reference to FIGS. 29-32.

At this stage, the machine line programmer, using conventional line balancing software which is commercially available, inter alia, from Valor Computerized Systems Ltd. of Yavne, Israel under catalog designator T-5000-5215 and machine optimization software which is commercially available, inter alia, from Valor Computerized Systems Ltd. of Yavne, Israel, inter alia under catalog designators T-5000-5570 and T-5000-5549, carries out line balancing and pick & place machine optimization. This functionality employs the CPCA data as well as the AMSSHPs and AMSSUPs generated in accordance with the present invention.

In accordance with a preferred embodiment of the present invention, following line balancing and thus once the precise pick & place machine configurations are known, suitable variables in each AMSSHP and AMSSUP are selected accordingly, thus providing suitable corresponding MSSHPs and MSSUPs for these specific configurations.

The line balancing and machine optimization software provides operating instructions in computer-readable language to the pick & place machines of the selected line, such as pick & place machines 702, 704 and 706 (FIG. 23), and operating instructions in human-readable form to one or more pick & place machine operators who configure the pick & place machines in the selected line and load components onto the machines.

Figure 33:
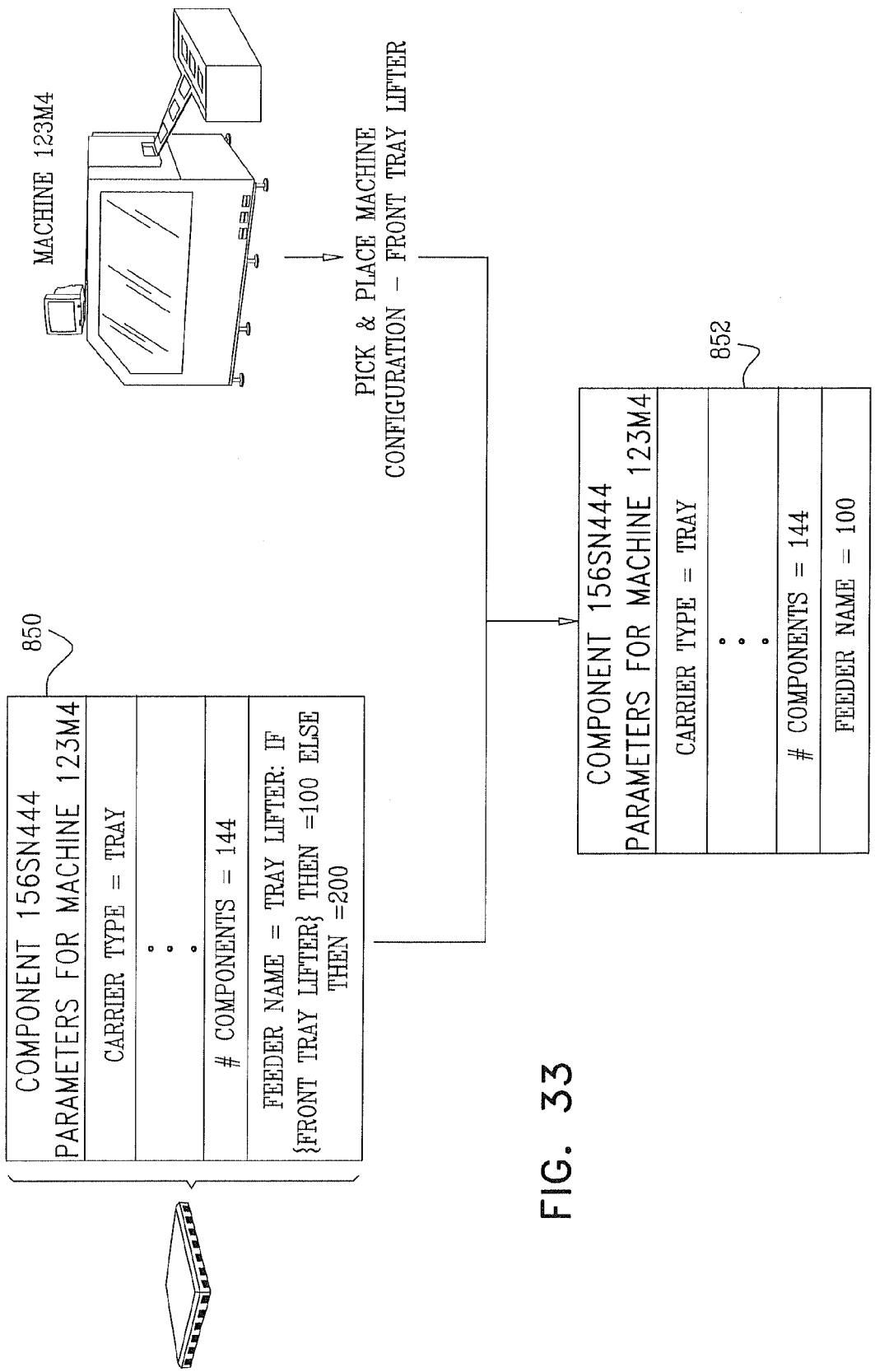
FIGS. 33 and 34 are simplified diagrammatic illustrations of specification of the adaptive pick & place machine-specific component supply parameters for a reel carrier type and the adaptive pick & place machine-specific component handling parameters shown in respective FIGS. 30 and 32.
Figure 34:
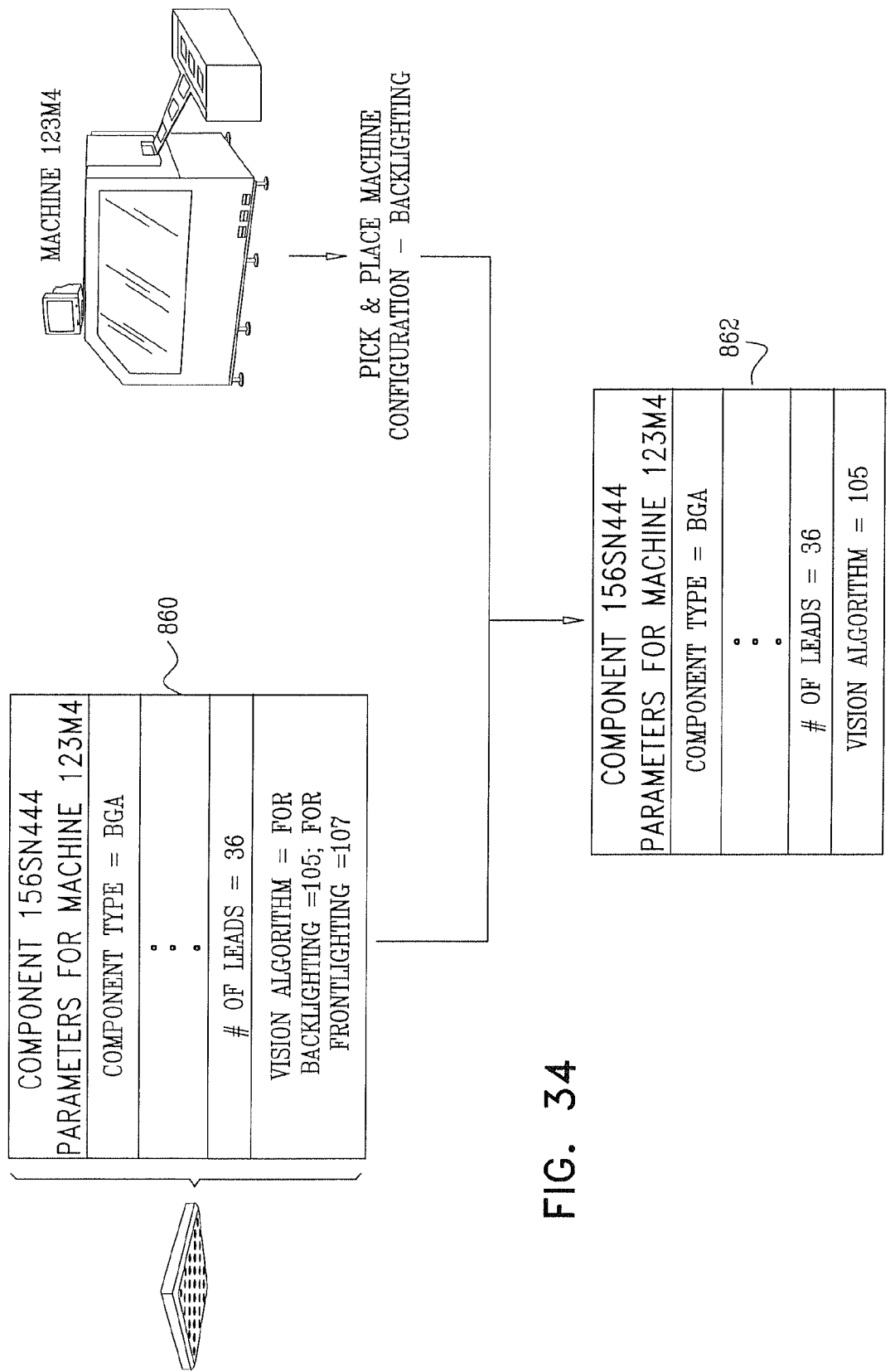

FIGS. 33 and 34 are simplified diagrammatic illustrations of the specification of the adaptive pick & place machine-specific component supply parameters for a reel carrier type and the adaptive pick & place machine-specific component handling parameters shown in respective FIGS. 30 and 32.

As seen in FIG. 33, AMSSUPs 850 for a specific component, shown as component 156SN444, and for a specific pick & place machine, shown as machine 123M4, in combination with the machine configuration, are employed in providing suitable MSSUPs 852 for the same component and machine. The machine configuration, here including a front tray lifter, is employed in the adaptive parameter related to feeder name as provided in the AMSSUP 850, and the feeder name is selected to be 100.

Turning now to FIG. 34, it is seen that AMSSHPs 860 for a specific component, shown as component 156SN444, and for a specific pick & place machine, shown as machine 123M4, in combination with the machine configuration, are employed in providing suitable MSSHPs 862 for the same component and machine. The machine configuration, here including back-lighting, is employed in the adaptive parameter related to vision algorithm provided in the AMSSHP 860, and the vision algorithm is selected to be 105.

Figure 35:
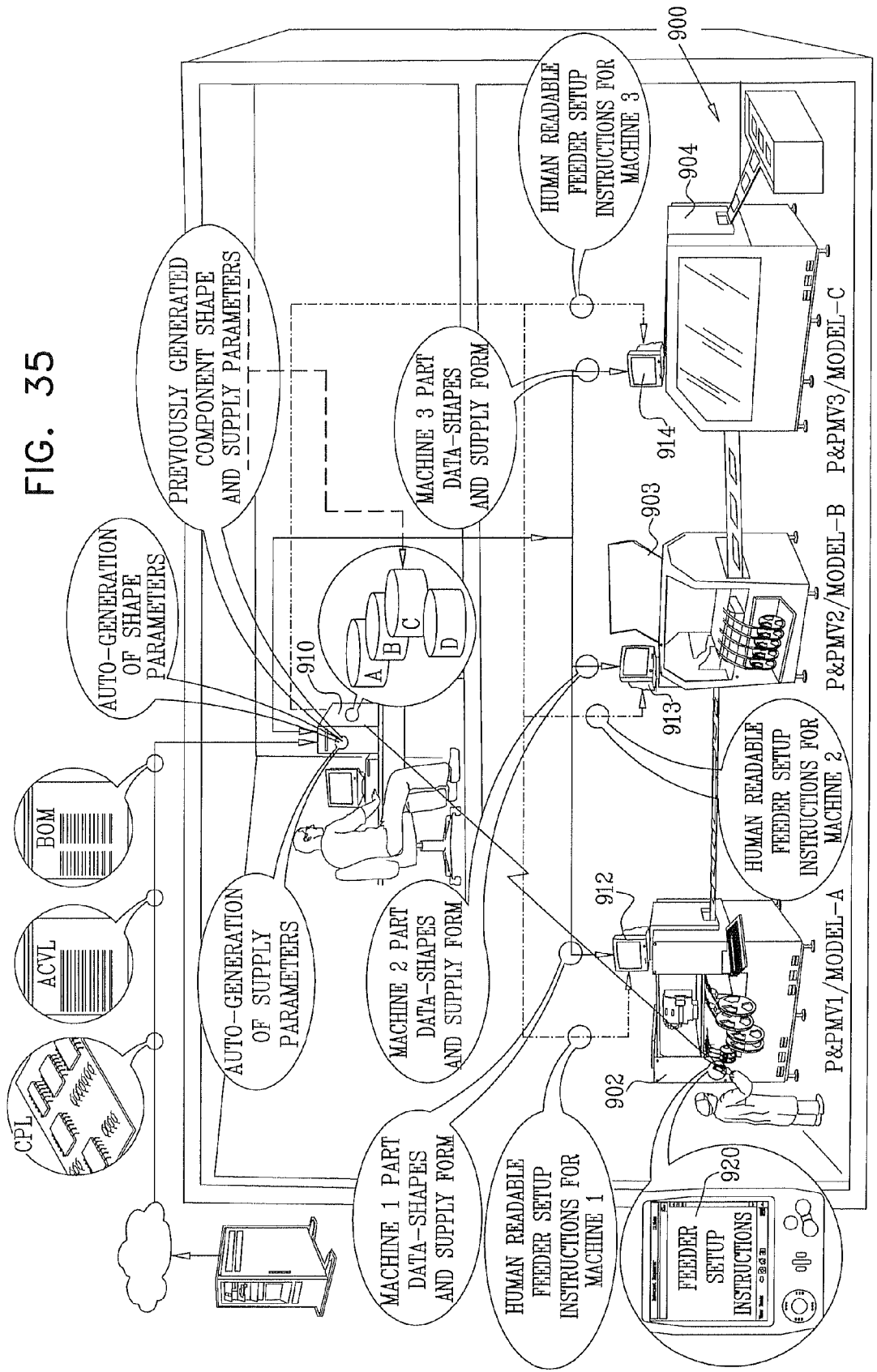
FIG. 35 is a simplified illustration of a system and functionality for automated manufacture of electronic circuits in accordance with a further preferred embodiment of the present invention, including functionality for employing newly auto-generated pick & place machine-specific component supply parameters and pick & place machine-specific component shape parameters instead of earlier generated pick & place machine-specific component supply parameters and pick & place machine-specific component shape parameters.

Reference is now made to FIG. 35, which is a simplified illustration of a system and functionality for automated manufacture of electronic circuits in accordance with a further preferred embodiment of the present invention, including functionality for employing newly auto-generated pick & place machine-specific component supply parameters and pick & place machine-specific component shape parameters instead of earlier generated pick & place machine-specific component supply parameters and pick & place machine-specific component shape parameters.

A typical context in which an embodiment of the present invention is used is an automated electronic circuit manufacture facility which includes one or more automated electronic circuit manufacturing lines, one of which is shown in FIG. 35 and identified generally by reference numeral 900. Each electronic circuit manufacturing line typically comprises a plurality of pick & place machines which may or may not originate from the same equipment vendor. Typically, each line comprises between one and ten pick & place machines. In FIG. 35, three such machines are illustrated in line 900 and are respectively designated by reference numerals 902, 903 and 904.

One or more machine line programmers, operating a machine line programming station 910, are responsible, inter alia, for providing operating instructions in computer-readable language to the pick & place machines of one or more lines such as line 900, such as pick & place machines 902, 903 and 904. The machine line programmer is also responsible for providing operating instructions in human-readable form to one or more pick & place machine operators who configure the pick & place machines and load components onto the machines. These human-readable instructions may be provided to the operators via respective displays 912, 913 and 914 on pick & place machines 902, 903 and 904 or preferably via hand-held terminals 920 or alternatively in hard copy.

In accordance with a preferred embodiment of the present invention, the machine line programmer employs an embodiment of the present invention which is preferably embodied in software loaded onto one or more computers forming part of machine line programming station 910.

In the embodiment of FIG. 35, it is assumed that MSSUPs and MSSHPs for the production of an electronic circuit on a machine line, such as machine line 900, have already been generated. In the course of employing an embodiment of the present invention, new MSSUPs and MSSHPs are auto-generated. The new MSSUPs and MSSHPs are often more up-to-date than the earlier generated MSSUPs and MSSHPs and may be more closely compatible with the embodiment of the present invention which is used in the auto-generation thereof and overall may be considered to be optimized to the pick & place machine line. Accordingly, it is a particular feature of the present invention that the new MSSUPs and MSSHPs are employed to override the earlier generated MSSUPs and MSSHPs in database C. Preferably this override functionality takes place in the background and does not interfere with production.

In accordance with this embodiment of the present invention, the software in machine line programming station 910 is operative to perform auto-generation of MSSUPs and MSSHPs not only in cases where suitable MSSUPs and MSSHPs do not exist, but also in cases where existing MSSUPs and MSSHPs were not auto-generated by software including an embodiment of the present invention. The functionality employed in the embodiment of FIG. 35 may be similar to that described hereinabove with reference to FIGS. 8A and 8B and is distinguished therefrom as described hereinbelow with reference to FIGS. 36 and 37, which correspond to and are distinguished from respective FIGS. 10 and 14.

Figure 36:
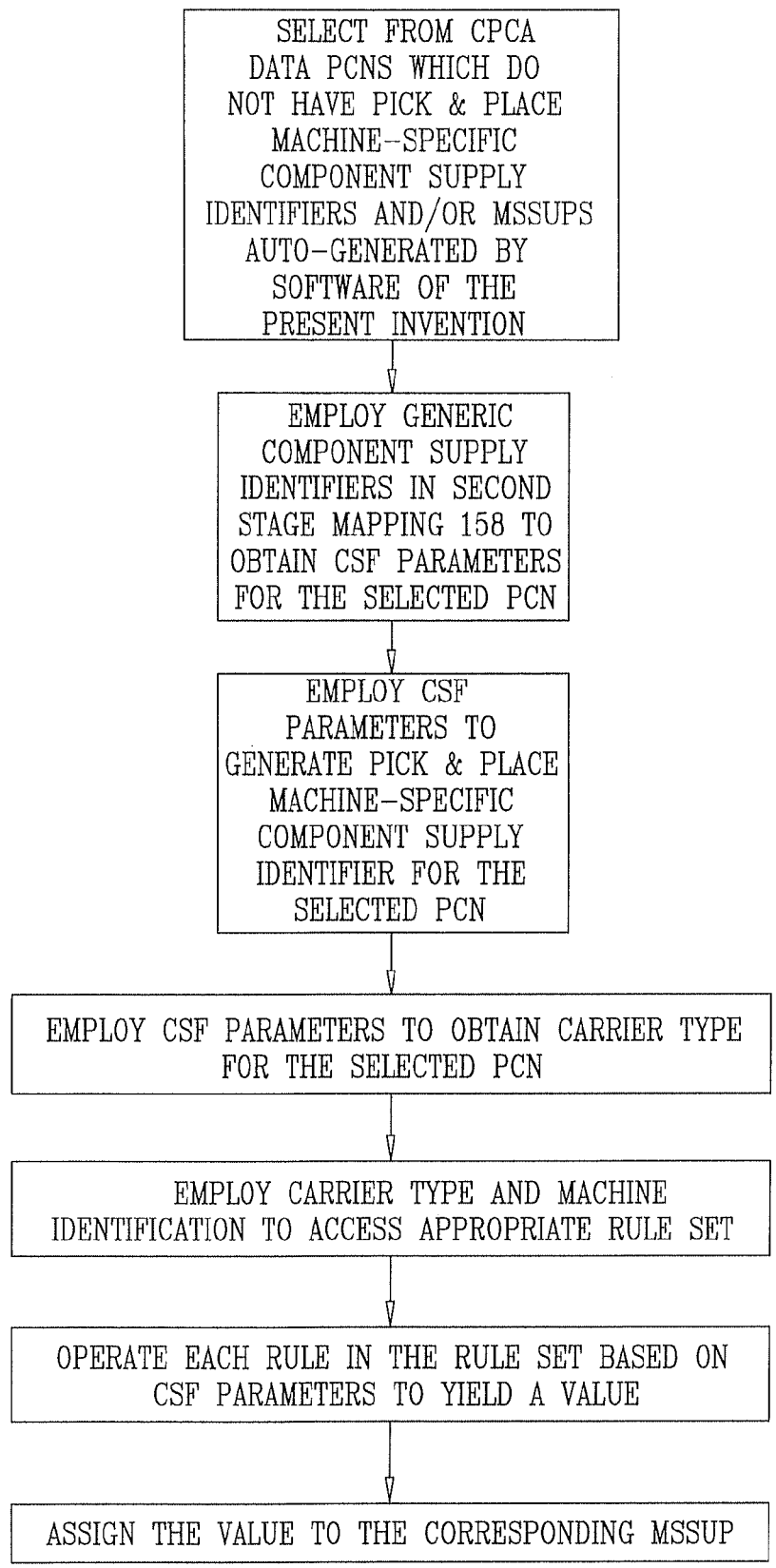
FIG. 36 is a simplified flowchart illustrating details of auto-generation of pick & place machine specific component supply parameters forming part of the functionality of FIG. 35.

Reference is now made to FIG. 36, which is a simplified flowchart illustrating details of auto-generation of pick & place machine specific component supply parameters forming part of the functionality of FIG. 35.

As seen in FIG. 10, for each pick & place machine in the manufacturing facility 100 (FIG. 1), the PCNs in the CPCA data which do not have MSSUPs and/or Pick & place machine-specific component supply identifiers are selected. In the embodiment of FIG. 36, as distinct from FIG. 10, for each pick & place machine in the manufacturing facility 900 (FIG. 35), the PCNs in the CPCA data which do not have MSSUPs auto-generated by software incorporating an embodiment of the present invention and/or pick & place machine-specific component supply identifiers are selected.

For each such selected PCN, CSF parameters are obtained by employing generic component supply identifiers in the second stage mapping 158 (FIG. 3). For each such selected PCN, the CSF parameters are employed to generate a corresponding pick & place machine-specific component supply identifier.

The CSF parameters are employed to obtain the corresponding carrier type for each selected PCN. The carrier type and the identification of the specific pick & place machine for which MSSUPs are being generated are used by the software of the present invention to access an appropriate rule set, such as that appearing in FIG. 5A. Each rule in the rule set is operated based on at least one appropriate input variable forming part of the CSF parameters to yield a value which is assigned to the corresponding MSSUP.

Figure 37:
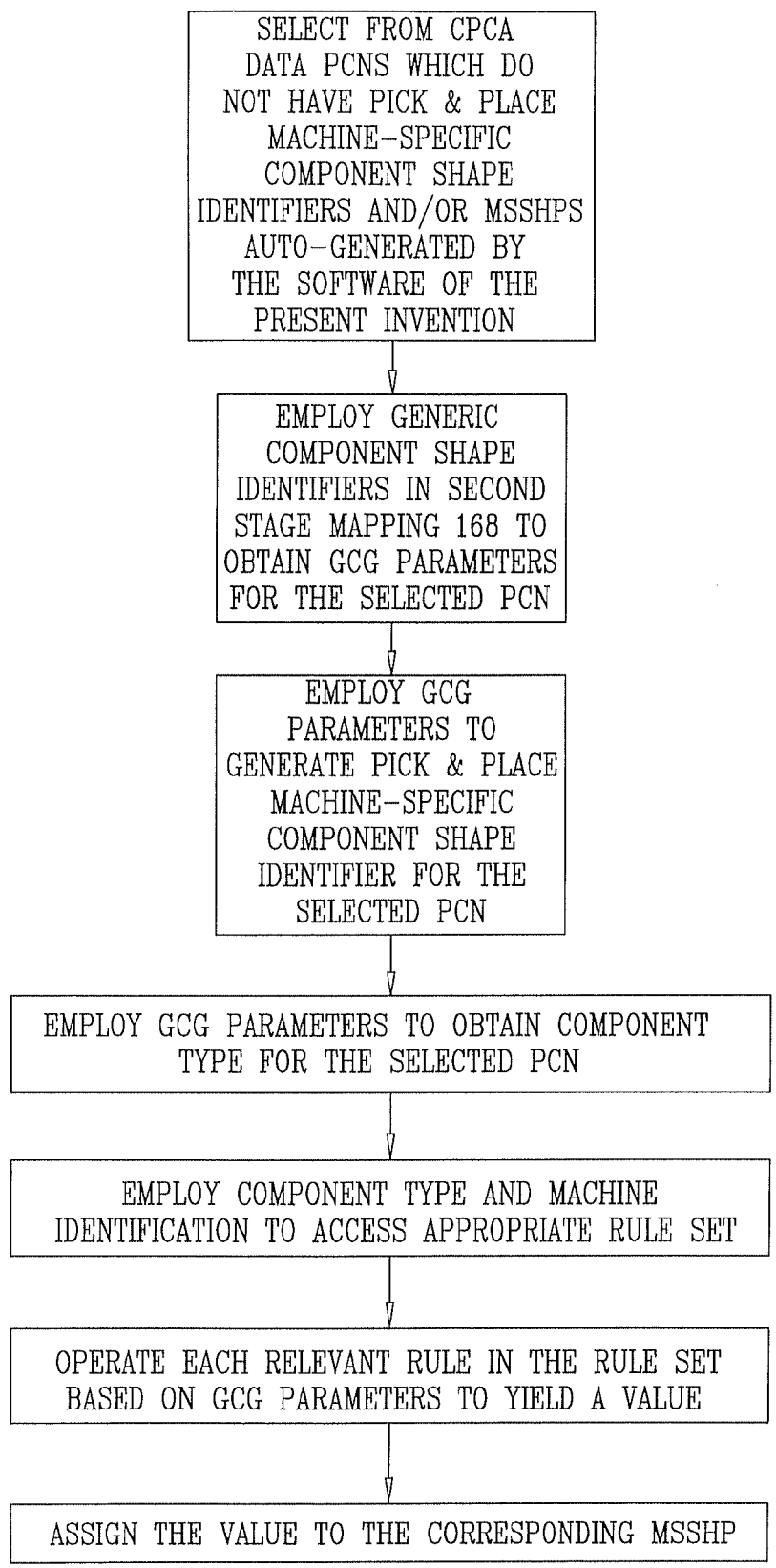
FIG. 37 is a simplified flowchart illustrating details of auto-generation of pick & place machine specific component shape parameters forming part of the functionality of FIG. 35.

Reference is now made to FIG. 37, which is a simplified flowchart illustrating details of auto-generation of pick & place machine specific component shape parameters forming part of the functionality of FIG. 35.

As seen in FIG. 14, for each pick & place machine in the manufacturing facility 100 (FIG. 1), the PCNs in the CPCA data which do not have MSSHPs and/or Pick & place machine-specific component shape identifiers are selected. In the embodiment of FIG. 37, as distinct from FIG. 14, for each pick & place machine in the manufacturing facility 900 (FIG. 35), the PCNs in the CPCA data which do not have MSSHPs auto-generated by software incorporating an embodiment of the present invention and/or pick & place machine-specific component shape identifiers are selected.

For each such selected PCN, GCG parameters are obtained by employing the generic component shape identifiers in the second stage mapping 168 (FIG. 3). For each such selected PCN, the GCG parameters are employed to generate a corresponding pick & place machine-specific component shape identifier.

The GCG parameters are employed to obtain the corresponding component type for each selected PCN. The component type and the identification of the specific pick & place machine for which MSSHPs are being generated are used by the software of the present invention to access an appropriate rule set, such as that appearing in FIG. 5A. Each relevant rule in the rule set is operated based on at least one appropriate input variable forming part of the GCG parameters to yield a value which is assigned to the corresponding MSSHP.

It is appreciated by persons skilled in the art that the present invention is not limited by what has been particularly shown and described hereinabove. Rather the scope of the present invention includes both combinations and subcombinations of various features described hereinabove as well as variations and modifications thereto which would occur to a person of skill in the art upon reading the above description and which are not in the prior art.

The invention claimed is:

1. A method of manufacturing an electronic circuit comprising:
   employing a pick & place machine-specific component placement sequence, pick & place machine-specific component data for governing the operation of at least one specific pick & place machine in a manufacturing line and operating instructions in computer-readable language for said at least one specific pick & place machine to auto-generate generic component parameters for components used in manufacturing said electronic circuit on said at least one specific pick & place machine; and
   employing said generic component parameters to auto-generate a pick & place machine-specific component placement sequence and pick & place machine-specific component data for governing the operation of at least one other specific pick & place machine in a manufacturing line and operating instructions in computer-readable language for said at least one other specific pick & place machine.

2. The method of manufacturing an electronic circuit according to claim 1 and wherein said at least one other specific pick & place machine is a different type of pick & place machine from said at least one specific pick & place machine.

3. The method of manufacturing an electronic circuit according to claim 1 and wherein said employing a pick & place machine-specific component placement sequence, comprises employing at least a first database containing at least one of pick & place machine independent geometric component data and pick & place machine-independent, component supply data and a second database containing component manufacturer-independent, pick & place machine-specific rules.

4. The method of manufacturing an electronic circuit according to claim 3 and wherein said second database includes at least one of the following mappings:
   a mapping of pick & place machine-specific component shape parameters to rules for generating component manufacturer-independent generic component geometric parameters;
   a mapping of pick & place machine-specific component supply parameters to rules for generating component manufacturer-independent generic component supply form parameters; and
   a mapping of Programmer Component Number (PCN) parameters in pick & place machine specific syntax to generic PCN parameters.

5. The method of manufacturing an electronic circuit according to claim 3 and wherein said first database comprises at least one of:
   a mapping of Component Vendor/Catalog Numbers (CV/Cat#s) to component vendor-specific component geometric parameters (CCL);
   a mapping of CV/CatHs to component supply form parameters (CCSL);
   a mapping of PCNs to component supply form parameters (UMCSL);

a mapping of PCNs to CV/Cat#s (MCVL);

a mapping of Designer Component Number (DCN) to PCN;

a user maintained mapping of CV/Cat# to component vendor-specific component geometric parameters (UMCL); and a mapping of PCN to generic component geometric parameters.

6. The method of manufacturing an electronic circuit according to claim 3 and wherein said employing a pick & place machine-specific component placement sequence, pick & place machine-specific component data for governing the operation of at least one specific pick & place machine in a manufacturing line and operating instructions in computer-readable language for said at least one specific pick & place machine to auto-generate generic component parameters for components used in manufacturing said electronic circuit on said at least one specific pick & place machine also comprises:

obtaining at least one PCN for ones of said components used in manufacturing said electronic circuit;

employing said at least one PCN and a type of said at least one specific pick & place machine to access relevant ones of said component manufacturer-independent, pick & place machine-specific rules;

operating said ones of said component manufacturer-independent, pick & place machine-specific rules using at least one pick & place machine specific component parameter to obtain corresponding values; and assigning said values to corresponding generic component parameters.

7. The method of manufacturing an electronic circuit according to claim 6 and wherein said obtaining comprises obtaining said at least one PCN from said operating instructions in computer-readable language.

8. The method of manufacturing an electronic circuit according to claim 6 and wherein:

said operating comprises operating ones of said component manufacturer-independent, pick & place machine-specific rules which are suitable for auto-generation of generic component supply form parameters using at least one pick & place machine specific component supply parameter to obtain a corresponding supply form value; and said assigning comprises assigning said corresponding supply form value to a corresponding generic component supply form parameter.

9. The method of manufacturing an electronic circuit according to claim 6 and wherein:

said operating comprises operating ones of said component manufacturer-independent, pick & place machine-specific rules which are suitable for auto-generation of generic component geometric parameters using at least one pick & place machine specific component shape parameter to obtain a corresponding geometric value; and said assigning comprises assigning said corresponding geometric value to a corresponding generic component geometric parameter.

10. The method of manufacturing an electronic circuit according to claim 6 and also comprising, following said assigning:

adding said values and said corresponding generic component parameters to said first database for said at least one PCN; and subsequently, indicating said values and said corresponding generic component parameters that were obtained by indirect association.

11. The method of manufacturing an electronic circuit according to claim 3 and also comprising, prior to said employing a pick & place machine-specific component placement sequence:

obtaining at least one PCN for each of said components;

searching said first database for pick & place machine independent component supply data corresponding to said at least one PCN for each of said components; and searching said first database for pick & place machine independent geometric component data corresponding to said at least one PCN for each of said components.

12. The method of manufacturing an electronic circuit according to claim 3 and wherein said employing said generic component parameters comprises:

employing generic component supply form parameters and said second database for auto-generating pick & place machine specific component supply parameters; and employing generic component geometric parameters and said second database for auto-generating pick & place machine specific component shape parameters.

13. The method of manufacturing an electronic circuit according to claim 12 and wherein said employing generic component supply form parameters comprises:

selecting at least one PCN corresponding to each of said components;

employing at least part of said generic component supply form parameters to access appropriate ones of said machine-specific, component manufacturer-independent rules for generating said pick & place machine-specific component data;

operating said appropriate ones of said machine-specific, component manufacturer-independent rules based on said second database and at least one of said generic component parameters to yield corresponding values; and assigning said corresponding values to corresponding ones of said pick & place machine-specific component supply parameters.

14. The method of manufacturing electronic circuits according to claim 13 and also comprising, prior to said employing at least part of said generic component supply form parameters, employing at least part of said generic component supply form parameters to auto-generate a corresponding pick & place machine specific component supply identifier.

15. The method of manufacturing electronic circuits according to claim 12 and wherein said employing said generic component geometric parameters comprises:

selecting at least one PCN corresponding to each of said components;

employing at least part of said generic component geometric parameters to access appropriate ones of said machine-specific, component manufacturer-independent rules for generating said pick & place machine-specific component data;

operating said appropriate ones of said machine-specific, component manufacturer-independent rules for generating said pick & place machine-specific component data based on at least one of said generic component geometric parameters to yield corresponding values; and assigning said corresponding values to corresponding ones of said pick & place machine-specific component shape parameters.

16. The method of manufacturing electronic circuits according to claim 15 and also comprising, prior to said employing at least part of said generic component geometric parameters, employing at least part of said generic component geometric parameters to auto-generate a corresponding pick & place machine specific component shape identifier.

17. An apparatus for manufacturing an electronic circuit comprising:
a memory; and
a processor for implementing functionalities, at least part of which are stored in said memory, said functionalities comprising:
computerized generic component parameter auto-generation functionality operative to employ a pick & place machine-specific component placement sequence, pick & place machine-specific component data for governing the operation of at least one specific pick & place machine in a manufacturing line and operating instructions in computer-readable language for said at least one specific pick & place machine to auto-generate generic component parameters for components used in manufacturing said electronic circuit on said at least one specific pick & place machine; and
computerized machine parameter auto-generation functionality operative to employ said generic component parameters to auto-generate a pick & place machine-specific component placement sequence and pick & place machine-specific component data for governing the operation of at least one other specific pick & place machine in a manufacturing line and operating instructions in computer-readable language for said at least one other specific pick & place machine.

18. The apparatus for manufacturing an electronic circuit according to claim 17 and wherein said at least one other specific pick & place machine is a different type of pick & place machine from said at least one specific pick & place machine.

19. The apparatus for manufacturing an electronic circuit according to claim 17 and wherein said computerized generic component parameter auto-generation functionality comprises:
a first database containing at least one of pick & place machine independent geometric component data and pick & place machine-independent, component supply data; and
a second database containing component manufacturer-independent, pick & place machine-specific rules.

20. The apparatus for manufacturing an electronic circuit according to claim 19 and wherein said second database includes at least one of the following mappings:
a mapping of pick & place machine-specific component shape parameters to rules for generating component manufacturer-independent generic component geometric parameters;
a mapping of pick & place machine-specific component supply parameters to rules for generating component manufacturer-independent generic component supply form parameters; and
a mapping of Programmer Component Number (PCN) parameters in pick & place machine specific syntax to generic PCN parameters.

21. The apparatus for manufacturing an electronic circuit according to claim 19 and wherein said first database comprises at least one of:

a mapping of Component Vendor/Catalog Numbers (CV/Cat#s) to component vendor-specific component geometric parameters (CCL);
a mapping of CV/Cat#s to component supply form parameters (CCSL);
a mapping of PCNs to component supply form parameters (UMCSL);
a mapping of PCNs to CV/Cat#s (MCVL);
a mapping of Designer Component Number (DCN) to PCN;
a user maintained mapping of CV/Cat# to component vendor-specific component geometric parameters (UMCL); and
a mapping of PCN to generic component geometric parameters.

22. The apparatus for manufacturing an electronic circuit according to claim 19 and wherein said computerized generic component parameter auto-generation functionality comprises:
PCN obtaining functionality operative to obtain at least one PCN for ones of said components used in manufacturing said electronic circuit;
rules operating functionality operative to employ said at least one PCN and a type of said at least one specific pick & place machine to access relevant ones of said component manufacturer-independent, pick & place machine-specific rules and to operate said ones of said component manufacturer-independent, pick & place machine-specific rules using at least one pick & place machine specific component parameter to obtain corresponding values; and
value assigning functionality operative to assign said values to corresponding generic component parameters.

23. The apparatus for manufacturing an electronic circuit according to claim 22 and wherein said computerized generic component parameter auto-generation functionality also comprises:
computerized value addition functionality operative to add said values and said corresponding generic component parameters to said first database for said at least one PCN; and
value indicating functionality operative to indicate said values and said corresponding generic component parameters that were obtained by indirect association.

24. The apparatus for manufacturing an electronic circuit according to claim 19 and wherein said computerized machine parameter auto-generation functionality comprises:
computerized supply parameter auto-generation functionality operative to employ generic component supply form parameters and said second database for auto-generating pick & place machine specific component supply parameters; and
computerized shape parameter auto-generation functionality operative to employ generic component geometric parameters and said second database for auto-generating pick & place machine specific component shape parameters.

25. The apparatus for manufacturing an electronic circuit according to claim 24 and wherein said computerized supply parameter auto-generation functionality comprises:
PCN selection functionality operative to select at least one PCN corresponding to each of said components;
rules operating functionality operative to employ at least part of said generic component supply form parameters to access appropriate ones of said machine-specific, component manufacturer-independent rules for generating said pick & place machine-specific component data and to operate said appropriate ones of said machine-specific, component manufacturer-independent rules based on said second database and at least one of said generic component parameters to yield corresponding values; and value assigning functionality operative to assign said corresponding values to corresponding ones of said pick & place machine-specific component supply parameters.

26. The apparatus for manufacturing an electronic circuit according to claim 25 and wherein said computerized supply parameter auto-generation functionality also comprises computerized supply identifier auto-generation functionality operative to employ at least part of said generic component supply form parameters to auto-generate a corresponding pick & place machine specific component supply identifier.

27. The apparatus for manufacturing an electronic circuit according to claim 24 and wherein said computerized shape parameter auto-generation functionality comprises:

PCN selection functionality operative to select at least one PCN corresponding to each of said components;

rules operating functionality operative to employ at least part of said generic component geometric parameters to access appropriate ones of said machine-specific, component manufacturer-independent rules for generating said pick & place machine-specific component data and to operate said appropriate ones of said machine-specific, component manufacturer-independent rules based on said second database and at least one of said generic component parameters to yield corresponding values; and value assigning functionality operative to assign said corresponding values to corresponding ones of said pick & place machine-specific component shape parameters.

28. The apparatus for manufacturing an electronic circuit according to claim 26 and wherein said computerized shape parameter auto-generation functionality also comprises computerized shape identifier auto-generation functionality operative to employ at least part of said generic component geometric parameters to auto-generate a corresponding pick & place machine specific component shape identifier.

* * * * *